United States Patent
Hwang

(10) Patent No.: US 9,853,541 B2
(45) Date of Patent: Dec. 26, 2017

(54) SWITCHED-CAPACITOR DC-TO-DC CONVERTERS AND METHODS OF FABRICATING THE SAME

(71) Applicant: SK hynix Inc., Gyeonggi-do (KR)

(72) Inventor: Jae Ho Hwang, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/584,923

(22) Filed: May 2, 2017

(65) Prior Publication Data

US 2017/0237342 A1 Aug. 17, 2017

Related U.S. Application Data

(62) Division of application No. 14/950,932, filed on Nov. 24, 2015, now Pat. No. 9,673,708.

(30) Foreign Application Priority Data

Jul. 13, 2015 (KR) .......................... 10-2015-0098955

(51) Int. Cl.
| | | |
|---|---|---|
| *H02M 3/07* | (2006.01) | |
| *H01L 23/528* | (2006.01) | |
| *H01L 25/16* | (2006.01) | |
| *H01L 27/092* | (2006.01) | |
| *H02M 3/158* | (2006.01) | |
| *H01L 49/02* | (2006.01) | |
| *H01L 23/48* | (2006.01) | |

(52) U.S. Cl.
CPC ............ *H02M 3/07* (2013.01); *H01L 23/481* (2013.01); *H01L 23/528* (2013.01); *H01L 25/16* (2013.01); *H01L 27/092* (2013.01); *H01L 28/90* (2013.01); *H02M 3/158* (2013.01)

(58) Field of Classification Search
CPC ........... H01L 21/1082; H01L 21/31604; H01L 27/105; H01G 4/232; H01G 4/33
See application file for complete search history.

(56) References Cited

U.S. PATENT DOCUMENTS 6,297,090 B1 * 10/2001 Kim .................... H01L 27/1082
257/E21.65
2002/0132428 A1 * 9/2002 Chien ................... H01L 27/105
438/258

(Continued)

*Primary Examiner* — Mohsen Ahmadi
*Assistant Examiner* — Fang-Xing Jiang
(74) *Attorney, Agent, or Firm* — IP & T Group LLP

(57) ABSTRACT

A switched-capacitor DC-to-DC converter includes a logic cell and a capacitor cell vertically overlapping with the logic cell. The logic cell has a plurality of active elements disposed over a first substrate. The capacitor cell has a capacitor over a second substrate. A first interlayer insulation layer disposed over the first substrate is bonded to a second interlayer insulation layer disposed over the second substrate. A first through via connected to any one of interconnection patterns of the logic cell and a second through via connected to a lower electrode pattern of the capacitor cell are connected to each other through a first external circuit pattern. A third through via connected to an upper electrode pattern of the capacitor cell and a fourth through via connected to another one of the interconnection patterns of the logic cell are connected to each other through a second external circuit pattern.

9 Claims, 34 Drawing Sheets

(56) References Cited

U.S. PATENT DOCUMENTS

| | | | | |
|---|---|---|---|---|
| 2003/0001232 A1* | 1/2003 | Koinuma | ............... | H01G 4/33 257/532 |
| 2006/0121685 A1* | 6/2006 | Izumi | ............... | H01L 21/31604 438/396 |
| 2010/0300740 A1* | 12/2010 | Ichiyanagi | ............ | H01G 4/232 174/260 |

* cited by examiner

SWITCHED-CAPACITOR DC-TO-DC CONVERTERS AND METHODS OF FABRICATING THE SAME

CROSS-REFERENCE TO RELATED APPLICATIONS

This application is a division of U.S. patent application Ser. No. 14/950,932, filed on Nov. 24, 2015, which claims priority under 35 U.S.C 119(a) to Korean Patent Application No. 10-2015-0098955, filed on Jul. 13, 2015. The disclosure of each of the foregoing application is herein incorporated by reference in its entirety.

BACKGROUND

1. Technical Field

Various embodiments of the present disclosure relate to converters and methods of fabricating the same and, more particularly, to switched-capacitor Direct Current-to-Direct Current (DC-to-DC) converters and methods of fabricating the same.

2. Related Art

Switched power converters used in power supplies may be typically categorized as either switched-inductor converters (SICs) or switched-capacitor converters (SCCs). The SICs may store energy in their inductors while the SICs convert a source of direct current (DC) from one voltage level into another voltage level, and the SCCs may store energy in their capacitors while the SCCs convert a source of direct current (DC) from one voltage level into another voltage level. The SICs may exhibit a wide operating range and a high efficiency. Thus, the SICs have been widely used in application fields of high power. However, there may be some limitations in employing the SICs in compact systems because inductors of the SICs occupy a relatively large area. In contrast, the SCCs may be suitable for low power systems having a compact size because capacitors of the SICs occupy a relatively small area as compared with the inductors of the SICs. Recently, the SCCs have been widely used in mobile systems because of their compact size and low electromagnetic interference.

In general, in the event that switching elements and capacitors are integrated in a single chip, there may be a limitation in increasing a capacitance value of the capacitors because of a planar area that the capacitors occupy. Moreover, since a high temperature process is used in fabrication of the capacitors, characteristics of transistors constituting the switching elements may be degraded due to the high temperature process. Thus, the capacitors have been separately fabricated from the chip including the switching elements such as the transistors and have been disposed outside the chip.

SUMMARY

Various embodiments are directed to switched-capacitor DC-to-DC converters and methods of fabricating the same.

According to one embodiment, a switched-capacitor DC-to-DC converter includes a logic cell having (i) a first substrate, (ii) a plurality of active elements disposed over the first substrate, (iii) a first interlayer insulation layer disposed over a top surface of the first substrate to cover the active elements, and (iv) a plurality of interconnection patterns disposed in the first interlayer insulation layer and electrically connected to the active elements, wherein the plurality of interconnection patterns include first and second interconnection patterns, a capacitor cell having (i) a second substrate, (ii) a capacitor disposed over a top surface of the second substrate, (iii) a second interlayer insulation layer disposed over the second substrate to cover the capacitor, (iv) a lower interconnection pattern disposed in the second interlayer insulation layer and electrically connected to a lower electrode pattern of the capacitor, and (v) an upper interconnection pattern disposed in the second interlayer insulation layer and electrically connected to an upper electrode pattern of the capacitor, wherein the second interlayer insulation layer is bonded to the first interlayer insulation layer so that the logic cell vertically overlaps with the capacitor cell, a first through via penetrating the second substrate and the second interlayer insulation layer and extending into the first interlayer insulation layer to contact the first interconnection pattern, a second through via penetrating the second substrate to contact the lower interconnection pattern, a third through via penetrating the second substrate and extending into the second interlayer insulation layer to contact the upper interconnection pattern, a fourth through via penetrating the second substrate and the second interlayer insulation layer and extending into the first interlayer insulation layer to contact the second interconnection pattern, a first external circuit pattern disposed over a bottom surface of the second substrate and electrically connected to the first and second through vias, and a second external circuit pattern disposed over the bottom surface of the second substrate and electrically connected to the third and fourth through vias.

According to another embodiment, a switched-capacitor DC-to-DC converter includes a logic cell having (i) a first substrate, (ii) a plurality of active elements disposed over the first substrate, (iii) a first interlayer insulation layer disposed over a top surface of the first substrate to cover the active elements, and (iv) a plurality of interconnection patterns disposed in the first interlayer insulation layer and electrically connected to the active elements, wherein the plurality of interconnection patterns include first and second interconnection patterns, a capacitor cell having (i) a second substrate, (ii) a capacitor disposed over a top surface of the second substrate, (iii) a second interlayer insulation layer disposed over the second substrate to cover the capacitor, (iv) a lower interconnection pattern disposed in the second interlayer insulation layer and electrically connected to a lower electrode pattern of the capacitor, and (v) an upper interconnection pattern disposed in the second interlayer insulation layer and electrically connected to an upper electrode pattern of the capacitor, wherein the second substrate is bonded to the first interlayer insulation layer so that the logic cell vertically overlaps with the capacitor cell, a first through via penetrating the second interlayer insulation layer and the second substrate and extending into the first interlayer insulation layer to contact the first interconnection pattern, a second through via disposed in the second interlayer insulation layer to contact the lower interconnection pattern, a third through via disposed in the second interlayer insulation layer to contact the upper interconnection pattern, a fourth through via penetrating the second interlayer insulation layer and the second substrate and extending into the first interlayer insulation layer to contact the second interconnection pattern, a first external circuit pattern disposed over a top surface of the second interlayer insulation layer opposite to the second substrate and electrically connected to the first and second through vias, and a second external circuit pattern disposed over the top surface of the second interlayer insulation layer and electrically connected to the third and fourth through vias.

According to another embodiment, a switched-capacitor DC-to-DC converter includes a logic cell having (i) a first substrate, (ii) a plurality of active elements disposed over the first substrate, (iii) a first interlayer insulation layer disposed over a top surface of the first substrate and covering the active elements, and (iv) a plurality of interconnection patterns disposed in the first interlayer insulation layer and electrically connected to the active elements, wherein the plurality of interconnection patterns includes first and second interconnection patterns, a capacitor cell having (i) a second substrate, (ii) a capacitor disposed over the second substrate, (iii) a second interlayer insulation layer disposed over a top surface of the second substrate and covering the capacitor, (iv) a lower interconnection pattern disposed in the second interlayer insulation layer and electrically connected to a lower electrode pattern of the capacitor, and (v) an upper interconnection pattern disposed in the second interlayer insulation layer and electrically connected to an upper electrode pattern of the capacitor, wherein the second interlayer insulation layer is bonded to a bottom surface of the first substrate so that the logic cell vertically overlaps with the capacitor cell, a first through via penetrating the second substrate, the second interlayer insulation layer, and the first substrate and extending into the first interlayer insulation layer to contact the first interconnection pattern, a second through via penetrating the second substrate to contact the lower interconnection pattern, a third through via penetrating the second substrate and extending into the second interlayer insulation layer to contact the upper interconnection pattern, a fourth through via penetrating the second substrate, the second interlayer insulation layer, and the first substrate and extending into the first interlayer insulation layer to contact the second interconnection pattern, a first external circuit pattern disposed over a bottom surface of the second substrate opposite to the second interlayer insulation layer and electrically connected to the first and second through vias, and a second external circuit pattern disposed over the bottom surface of the second substrate and electrically connected to the third and fourth through vias.

According to another embodiment, a switched-capacitor DC-to-DC converter includes a logic cell having (i) a first substrate, (ii) a plurality of active elements disposed over the first substrate, (iii) a first interlayer insulation layer disposed over a top surface of the first substrate to cover the active elements, and (iv) a plurality of interconnection patterns disposed in the first interlayer insulation layer to be electrically connected to the active elements, wherein the plurality of interconnection patterns includes first and second interconnection patterns, a capacitor cell having (i) a second substrate, (ii) a capacitor disposed over the second substrate, (iii) a second interlayer insulation layer disposed over a top surface of the second substrate to cover the capacitor, (iv) a lower interconnection pattern disposed in the second interlayer insulation layer to be electrically connected to a lower electrode pattern of the capacitor, and (v) an upper interconnection pattern disposed in the second interlayer insulation layer to be electrically connected to an upper electrode pattern of the capacitor, wherein the second substrate is bonded to the first substrate so that the logic cell vertically overlaps with the capacitor cell, a first through via penetrating the second interlayer insulation layer, the second substrate, and the first substrate and extending into the first interlayer insulation layer to contact the first interconnection pattern, a second through via disposed in the second interlayer insulation layer to contact the lower interconnection pattern, a third through via disposed in the second interlayer insulation layer to contact the upper interconnection pattern, a fourth through via penetrating the second interlayer insulation layer, the second substrate, and the first substrate and extending into the first interlayer insulation layer to contact the second interconnection pattern, a first external circuit pattern disposed on a top surface of the second interlayer insulation layer opposite to the second substrate and electrically connected to the first and second through vias, and a second external circuit pattern disposed over the top surface of the second interlayer insulation layer and electrically connected to the third and fourth through vias.

According to another embodiment, there is provided a method of fabricating a switched-capacitor DC-to-DC converter. The method includes providing a logic cell having (i) a first substrate, (ii) a plurality of active elements disposed over the first substrate, (iii) a first interlayer insulation layer disposed over a top surface of the first substrate to cover the active elements, and (iv) a plurality of interconnection patterns disposed in the first interlayer insulation layer to be electrically connected to the active elements, wherein the plurality of interconnection patterns includes first and second interconnection patterns, providing a capacitor cell having (i) a second substrate, 9ii) a capacitor disposed over the second substrate, (iii) a second interlayer insulation layer disposed over a top surface of the second substrate to cover the capacitor, (iv) a lower interconnection pattern disposed in the second interlayer insulation layer to be electrically connected to a lower electrode pattern of the capacitor, and (v) an upper interconnection pattern disposed in the second interlayer insulation layer to be electrically connected to an upper electrode pattern of the capacitor, bonding the second substrate to the first substrate so that the logic cell vertically overlaps with the capacitor cell, forming a first through via hole penetrating the second substrate and the second interlayer insulation layer and extending into the first interlayer insulation layer to expose the first interconnection pattern, forming a second through via hole penetrating the second substrate to expose the lower interconnection pattern, forming a third through via hole penetrating the second substrate and extending into the second interlayer insulation layer to expose the upper interconnection pattern, forming a fourth through via hole penetrating the second substrate and the second interlayer insulation layer and extending into the first interlayer insulation layer to expose the second interconnection pattern, filling the first to fourth through via holes with a metal layer to form first to fourth through vias in the first to fourth through via holes, respectively, forming a first external circuit pattern disposed over a bottom surface of the second substrate opposite to the second interlayer insulation layer and electrically connected to the first and second through vias, and forming a second external circuit pattern disposed over the bottom surface of the second substrate and electrically connected to the third and fourth through vias.

According to another embodiment, there is provided a method of fabricating a switched-capacitor DC-to-DC converter. The method includes providing a logic cell having (i) a first substrate, (ii) a plurality of active elements disposed over the first substrate, (iii) a first interlayer insulation layer disposed over a top surface of the first substrate to cover the active elements, and (iv) a plurality of interconnection patterns disposed in the first interlayer insulation layer to be electrically connected to the active elements, wherein the plurality of interconnection patterns includes first and second interconnection patterns, providing a capacitor cell having (i) a second substrate, (ii) a capacitor disposed over the second substrate, (iii) a second interlayer insulation layer disposed over the second substrate to cover the capacitor, (iv) a lower interconnection pattern disposed in the second interlayer insulation layer to be electrically connected to a lower electrode pattern of the capacitor, and (v) an upper interconnection pattern disposed in the second interlayer insulation layer to be electrically connected to an upper electrode pattern of the capacitor, bonding the first interlayer insulation layer to the second substrate so that the logic cell vertically overlaps with the capacitor cell, forming a first through via hole penetrating the second interlayer insulation layer and the second substrate and extending into the first interlayer insulation layer to expose the first interconnection patterns, forming a second through via hole in the second interlayer insulation layer to expose the lower interconnection pattern, forming a third through via hole in the second interlayer insulation layer to expose the upper interconnection pattern, forming a fourth through via hole penetrating the second interlayer insulation layer and the second substrate and extending into the first interlayer insulation layer to expose the second interconnection patterns, filling the first to fourth through via holes with a metal layer to form first to fourth through vias in the first to fourth through via holes, respectively, forming a first external circuit pattern disposed over a top surface of the second interlayer insulation layer opposite to the second substrate and electrically connected to the first and second through vias, and forming a second external circuit pattern disposed over the top surface of the second interlayer insulation layer and electrically connected to the third and fourth through vias.

According to another embodiment, there is provided a method of fabricating a switched-capacitor DC-to-DC converter. The method includes providing a logic cell having (i) a first substrate, (ii) a plurality of active elements disposed over the first substrate, (iii) a first interlayer insulation layer disposed over a top surface of the first substrate to cover the active elements, and (iv) a plurality of interconnection patterns disposed in the first interlayer insulation layer to be electrically connected to the active elements, wherein the plurality of interconnection patterns includes first and second interconnection patterns, providing a capacitor cell having (i) a second substrate, (ii) a capacitor disposed over the second substrate, (iii) a second interlayer insulation layer disposed over the second substrate to cover the capacitor, (iv) a lower interconnection pattern disposed in the second interlayer insulation layer to be electrically connected to a lower electrode pattern of the capacitor, and (v) an upper interconnection pattern disposed in the second interlayer insulation layer to be electrically connected to an upper electrode pattern of the capacitor, bonding the first substrate to the second interlayer insulation layer so that the logic cell vertically overlaps with the capacitor cell, forming first to fourth via holes in the logic cell and the capacitor cell, wherein the first through via hole penetrates the second substrate, the second interlayer insulation layer and the first substrate and extends into the first interlayer insulation layer to expose the first interconnection pattern, wherein the second through via hole penetrates the second substrate to expose the lower interconnection pattern, wherein the third through via hole penetrates the second substrate and extends into the second interlayer insulation layer to expose the upper interconnection pattern, wherein the fourth through via hole penetrates the second substrate, the second interlayer insulation layer, and the first substrate and extends into the first interlayer insulation layer to expose the second interconnection pattern, filling the first to fourth through via holes with a metal layer to form first to fourth through vias in the first to fourth through via holes, respectively, forming a first external circuit pattern disposed over a bottom surface of the second substrate opposite to the second interlayer insulation layer and electrically connected to the first and second through vias, and forming a second external circuit pattern disposed over the bottom surface of the second substrate and electrically connected to the third and fourth through vias.

According to another embodiment, there is provided a method of fabricating a switched-capacitor DC-to-DC converter. The method includes providing a logic cell having (i) a first substrate, (ii) a plurality of active elements disposed over the first substrate, (iii) a first interlayer insulation layer disposed over a top surface of the first substrate to cover the active elements, and (iv) a plurality of interconnection patterns disposed in the first interlayer insulation layer to be electrically connected to the active elements, providing a capacitor cell having (i) a second substrate, (ii) a capacitor disposed over the second substrate, (iii) a second interlayer insulation layer disposed over the second substrate to cover the capacitor, (iv) a lower interconnection pattern disposed in the second interlayer insulation layer to be electrically connected to a lower electrode pattern of the capacitor, and (v) an upper interconnection pattern disposed in the second interlayer insulation layer to be electrically connected to an upper electrode pattern of the capacitor, bonding the first substrate to the second substrate so that the logic cell vertically overlaps with the capacitor cell, forming first to fourth through via holes in the logic cell and the capacitor cell, wherein the first through via hole penetrates the second interlayer insulation layer, the second substrate, and the first substrate and extends into the first interlayer insulation layer to expose the first interconnection pattern, wherein the second through via hole is disposed in the second interlayer insulation layer to expose the lower interconnection pattern, wherein the third through via hole is disposed in the second interlayer insulation layer to expose the upper interconnection pattern, wherein the fourth through via hole penetrates the second interlayer insulation layer, the second substrate, and the first substrate and extends into the first interlayer insulation layer to expose the second interconnection pattern, filling the first to fourth through via holes with a metal layer to form first to fourth through vias in the first to fourth through via holes, respectively, forming a first external circuit pattern disposed over a top surface of the second interlayer insulation layer opposite to the second substrate and electrically connected to the first and second through vias, and forming a second external circuit pattern disposed over the top surface of the second interlayer insulation layer and electrically connected to the third and fourth through vias.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present disclosure.

It will also be understood that when an element is referred to as being located "under," "beneath," "below," "lower," "on," "over," "above," "upper," "side" or "aside" another element, it can be directly contact the other element, or at least one intervening element may also be present therebetween. Accordingly, the terms such as "under," "beneath," "below," "lower," "on," "over," "above," "upper," "side," "aside" and the like which are used herein are for the purpose of describing particular embodiments only and are not intended to limit the scope of the present disclosure.

It will be further understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
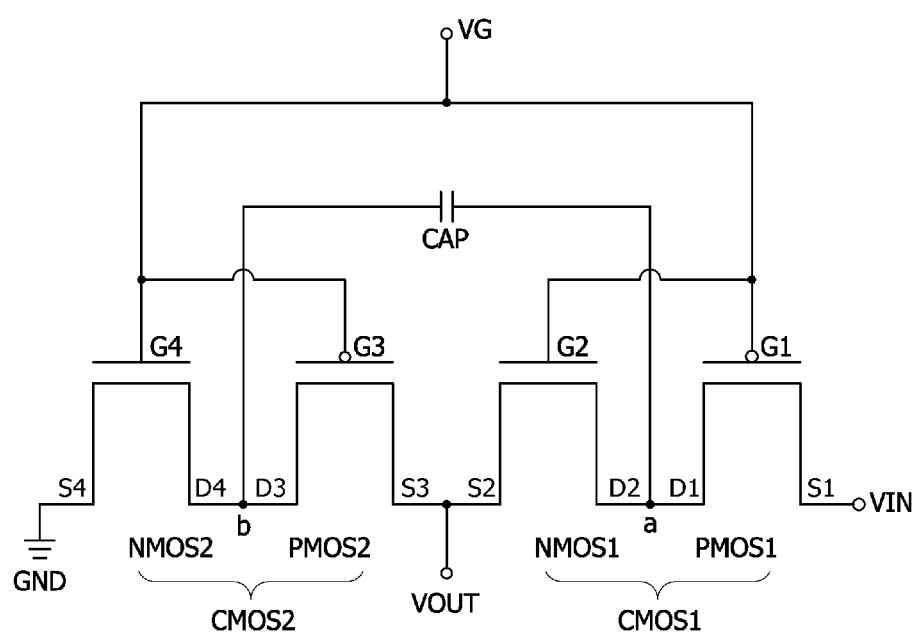
FIG. 1 is a circuit diagram illustrating a switched-capacitor DC-to-DC converter according to an embodiment.

FIG. 1 is a circuit diagram illustrating a switched-capacitor DC-to-DC converter 10 according to an embodiment. Referring to FIG. 1, the switched-capacitor DC-to-DC converter 10 may be configured to include a first CMOS device CMOS1, a second CMOS device CMOS2 and a capacitor CAP. The first CMOS device CMOS1 may include a first P-channel MOS transistor PMOS1 and a first N-channel MOS transistor NMOS1. The second CMOS device CMOS2 may include a second P-channel MOS transistor PMOS2 and a second N-channel MOS transistor NMOS2.

The first P-channel MOS transistor PMOS1 may have a source terminal S1 corresponding to a P-type source region and a drain terminal D1 corresponding to a P-type drain region, and the second P-channel MOS transistor PMOS2 may have a source terminal S3 corresponding to a P-type source region and a drain terminal D3 corresponding to a P-type drain region. The first N-channel MOS transistor NMOS1 may have a source terminal S2 corresponding to an N-type source region and a drain terminal D2 corresponding to an N-type drain region, and the second N-channel MOS transistor NMOS2 may have a source terminal S4 corresponding to an N-type source region and a drain terminal D4 corresponding to an N-type drain region.

The source terminal S1 and the drain terminal D1 of the first P-channel MOS transistor PMOS1 may be connected to an input voltage terminal VIN and the drain terminal D2 of the first N-channel MOS transistor NMOS1, respectively. The source terminal S2 of the first N-channel MOS transistor NMOS1 may be connected to an output voltage terminal VOUT. The source terminal S3 and the drain terminal D3 of the second P-channel MOS transistor PMOS2 may be connected to the output voltage terminal VOUT and the drain terminal D4 of the second N-channel MOS transistor NMOS2, respectively.

The source terminal S4 of the second N-channel MOS transistor NMOS2 may be connected to a ground terminal GND. One terminal of the capacitor CAP may be connected to a first connection node "a" that connects the drain terminal D1 of the first P-channel MOS transistor PMOS1 to the drain terminal D2 of the first N-channel MOS transistor NMOS1. The other terminal of the capacitor CAP may be connected to a second connection node "b" that connects the drain terminal D3 of the second P-channel MOS transistor PMOS2 to the drain terminal D4 of the second N-channel MOS transistor NMOS2.

Gate terminals G1 and G2 of the first P-channel MOS transistor PMOS1 and the first N-channel MOS transistor NMOS1 as well as gate terminals G3 and G4 of the second P-channel MOS transistor PMOS2 and the second N-channel MOS transistor NMOS2 may be connected to a gate voltage input terminal VG in common.

The switched capacitor DC-to-DC converter 10 according to the present embodiment may function as a DC-to-DC converter that converts a source of direct current (DC) from one voltage level to another voltage level with two operation steps, for example, a charging step and a discharging step. During the operation of the switched capacitor DC-to-DC converter 10, a clock signal may be inputted to the switched capacitor DC-to-DC converter 100 through the gate voltage input terminal VG.

Specifically, in the charging step, a gate voltage signal lower than a certain voltage level (e.g., a threshold voltage of the first and second N-channel MOS transistors NMOS1 and NMOS2), for example, a gate voltage signal having a ground voltage level may be applied to the gate voltage input terminal VG. Accordingly, while the first and second P-channel MOS transistors PMOS1 and PMOS2 are turned on, the first and second N-channel MOS transistors NMOS1 and NMOS2 may be turned off. In such a case, a current path may be provided between the input voltage terminal VIN and the output voltage terminal VOUT through the first connection node "a", the capacitor CAP and the second connection node "b". The capacitor CAP may be charged to store a certain amount of electric charges therein if an input voltage signal is applied to the input voltage terminal VIN.

In the discharging step, a gate voltage signal higher than a certain voltage level (e.g., a threshold voltage of the first and second N-channel MOS transistors NMOS1 and NMOS2), for example, a gate voltage signal of 5 volts may be applied to the gate voltage input terminal VG. Accordingly, while the first and second N-channel MOS transistors NMOS1 and NMOS2 are turned on, the first and second P-channel MOS transistors PMOS1 and PMOS2 may be turned off. In such a case, both terminals of the capacitor CAP may be connected to the ground terminal GND and the output voltage terminal VOUT, respectively. Thus, the charged capacitor CAP may act as a voltage source to output a voltage having a level different from the input voltage signal through the output voltage terminal VOUT.

Figure 2:
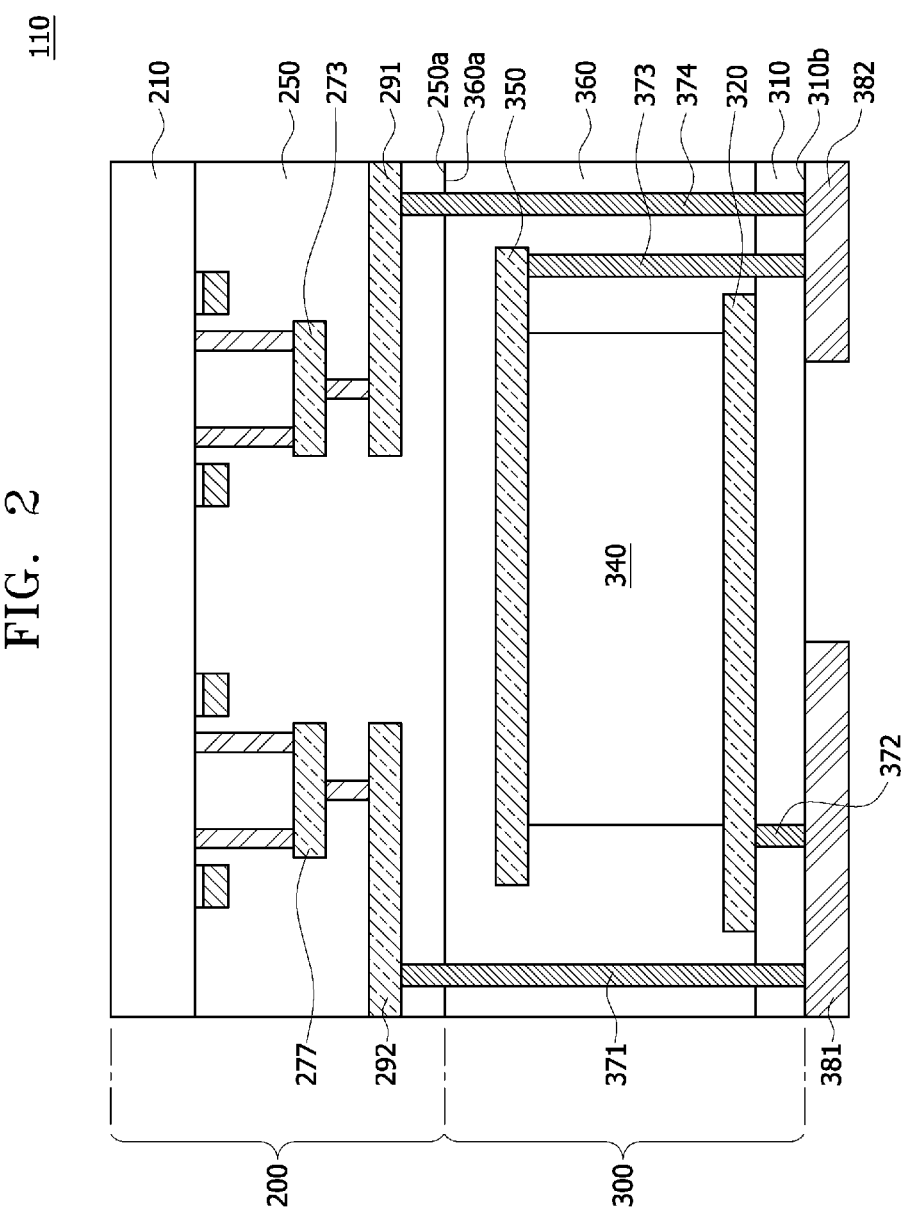
FIG. 2 is a cross-sectional view illustrating a switched-capacitor DC-to-DC converter according to an embodiment.

FIG. 2 is a cross-sectional view illustrating a switched-capacitor DC-to-DC converter 110 according to an embodiment. Referring to FIG. 2, the switched-capacitor DC-to-DC converter 110 may have a stack structure of a logic cell 200 including a logic device and a capacitor cell 300 including a capacitor.

The logic cell 200 may be bonded to the capacitor cell 300 so that a surface of the logic cell 200 is in contact with a surface of the capacitor cell 300. The logic cell 200 may include a logic device disposed in a first substrate 210, a first interlayer insulation layer 250 disposed on the first substrate 210, and interconnection patterns 273, 277, 291 and 292 disposed in the first interlayer insulation layer 250. The interconnection patterns 273, 277, 291 and 292 may include first interconnection patterns 273 and 277 and second interconnection patterns 291 and 292 which are disposed at a different level from the first interconnection patterns 273 and 277.

The capacitor cell 300 may include a capacitor 340 disposed on a second substrate 310, a second interlayer insulation layer 360 disposed on the second substrate 310 to cover the capacitor 340, and interconnection patterns 320 and 350 disposed in the second interlayer insulation layer 360. The interconnection patterns 320 and 350 may include a lower interconnection pattern 320 and an upper interconnection pattern 350. The first interlayer insulation layer 250 may have a first top surface 250a opposite to the first substrate 210, and the second interlayer insulation layer 360 may have a second top surface 360a opposite to the second substrate 310. The first top surface 250a of the first interlayer insulation layer 250 may be directly bonded to the second top surface 360a of the second interlayer insulation layer 360. In some embodiments, each of the first and second interlayer insulation layers 250 and 360 may include an oxide layer. In such a case, the logic cell 200 and the capacitor cell 300 may be attached to each other through oxide-to-oxide bonding.

A plurality of external circuit patterns including a first external circuit pattern 381 and a second external circuit pattern 382 may be disposed on a bottom surface 310b of the second substrate 310 opposite to the second interlayer insulation layer 360. In some embodiments, a thickness of the second substrate 310 on a bottom surface of which the first and second external circuit patterns 381 and 382 are disposed may be less than a thickness of the first substrate 210 of the logic cell 200. In addition to the first and second external circuit patterns 381 and 382, additional external circuit patterns (not illustrated in FIG. 2) may be provided. The other external circuit patterns not illustrated in FIG. 2 may include external circuit patterns which are connected to the input voltage terminal VIN, the output voltage terminal VOUT, the ground terminal GND and the gate voltage input terminal VG respectively.

The first and second external circuit patterns 381 and 382 may be connected to the first and second connection nodes "a" and "b" illustrated in FIG. 1, respectively. The first external circuit pattern 381 may be electrically connected to the second interconnection pattern 292 of the logic cell 200 through a first through via 371 that penetrates the second substrate 310 and the second interlayer insulation layer 360 and extends into the first interlayer insulation layer 250. In addition, the first external circuit pattern 381 may be electrically connected to the lower interconnection pattern 320 of the capacitor cell 300 through a second through via 372 that penetrates the second substrate 310. Accordingly, the second interconnection pattern 292 of the logic cell 200 may be electrically connected to the lower interconnection pattern 320 of the capacitor cell 300.

The second external circuit pattern 382 may be electrically connected to the upper interconnection pattern 350 of the capacitor cell 300 through a third through via 373 that penetrates the second substrate 310 and extends into the second interlayer insulation layer 360. In addition, the second external circuit pattern 382 may be electrically connected to the second interconnection pattern 291 of the logic cell 200 through a fourth through via 374 that penetrates the second substrate 310 and the second interlayer insulation layer 360 and extends into the first interlayer insulation layer 250. Accordingly, the second interconnection pattern 291 of the logic cell 200 may be electrically connected to the upper interconnection pattern 350 of the capacitor cell 300.

Figure 3:
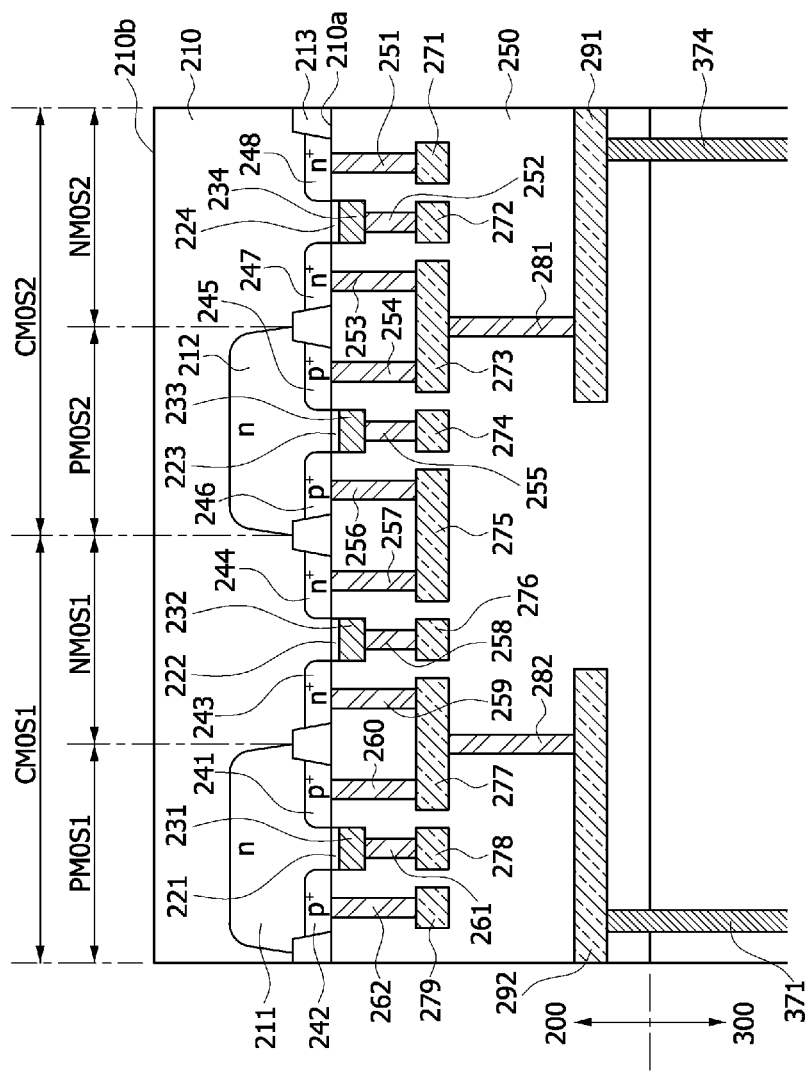
FIG. 3 is a cross-sectional view illustrating a logic cell of the switched-capacitor DC-to-DC converter shown in FIG. 2.

FIG. 3 is a cross-sectional view illustrating the logic cell 200 of FIG. 2 in detail. In FIG. 3, the same reference numerals or designators as used in FIGS. 1 and 2 may denote the same elements. Referring to FIGS. 2 and 3, the logic cell 200 may include a logic device disposed in the first substrate 210. The logic device may be configured to include the first CMOS device CMOS1 and the second CMOS device CMOS2. The first CMOS device CMOS1 may include the first N-channel MOS transistor NMOS1 and the first P-channel MOS transistor PMOS1. The second CMOS device CMOS2 may include the second N-channel MOS transistor NMOS2 and the second P-channel MOS transistor PMOS2. Specifically, the first substrate 210 may have a top surface 210a and a bottom surface 210b. In some embodiments, the first substrate 210 may be a P-type semiconductor substrate. Since the logic cell 200 is flipped while the logic cell 200 is bonded to the capacitor cell 300, the first substrate 210 is illustrated in FIG. 3 so that the top surface 210a of the first substrate 210 faces downwardly and the bottom surface 210b of the first substrate 210 faces upwardly.

A trench isolation layer 213 may be disposed in a certain portion of an upper region of the first substrate 210 to isolate the MOS transistors PMOS1, NMOS1, PMOS2 and NMOS2 from each other. The upper region of the first substrate 210 may correspond to a region adjacent to the top surface 210a. A first N-type well region 211 may be disposed in an upper portion of the first substrate 210 to act as a bulk region (or a body region) of the first P-channel MOS transistor PMOS1. A second N-type well region 212 may be disposed in an upper portion of the first substrate 210 to act as a bulk region (or a body region) of the second P-channel MOS transistor PMOS2. The upper region or the upper portion of the first substrate 210 may correspond to a region or a portion which is adjacent to the top surface 210a.

The first P-channel MOS transistor PMOS1 may include a first gate stack disposed on the top surface 210a of the first substrate 210. The first gate stack may include a first gate insulation layer pattern 221 and a first gate conductive layer pattern 231 which are sequentially stacked on the top surface 210a of the first substrate 210. The first gate stack may correspond to the gate terminal G1 of the first P-channel MOS transistor PMOS1 shown in FIG. 1.

The first N-channel MOS transistor NMOS1 may include a second gate stack disposed on the top surface 210a of the first substrate 210. The second gate stack may include a second gate insulation layer pattern 222 and a second gate conductive layer pattern 232 which are sequentially stacked on the top surface 210a of the first substrate 210. The second gate stack may correspond to the gate terminal G2 of the first N-channel MOS transistor NMOS1 shown in FIG. 1.

The second P-channel MOS transistor PMOS2 may include a third gate stack disposed on the top surface 210a of the first substrate 210. The third gate stack may include a third gate insulation layer pattern 223 and a third gate conductive layer pattern 233 which are sequentially stacked on the top surface 210a of the first substrate 210. The third gate stack may correspond to the gate terminal G3 of the second P-channel MOS transistor PMOS2 shown in FIG. 1.

The second N-channel MOS transistor NMOS2 may include a fourth gate stack disposed on the top surface 210a of the first substrate 210. The fourth gate stack may include a fourth gate insulation layer pattern 224 and a fourth gate conductive layer pattern 234 which are sequentially stacked on the top surface 210a of the first substrate 210. The fourth gate stack may correspond to the gate terminal G4 of the second N-channel MOS transistor NMOS2 shown in FIG. 1.

The first P-channel MOS transistor PMOS1 may include a P-type source region 242 and a P-type drain region 241 which are disposed in an upper portion of the first N-type well region 211 and are spaced apart from each other by a channel region vertically overlapping with the first gate stack. The P-type source region 242 and the P-type drain region 241 may correspond to the source terminal S1 and the drain terminal D1 of the first P-channel MOS transistor PMOS1 shown in FIG. 1, respectively.

The second P-channel MOS transistor PMOS2 may include a P-type source region 246 and a P-type drain region 245 which are disposed in an upper portion of the second N-type well region 212 and are spaced apart from each other by a channel region vertically overlapping with the third gate stack. The P-type source region 246 and the P-type drain region 245 may correspond to the source terminal S3 and the drain terminal D3 of the second P-channel MOS transistor PMOS2 shown in FIG. 1, respectively.

The first N-channel MOS transistor NMOS1 may include an N-type source region 244 and an N-type drain region 243 which are disposed in an upper portion of the first substrate 210 and are spaced apart from each other by a channel region vertically overlapping with the second gate stack. The N-type source region 244 and the N-type drain region 243 may correspond to the source terminal S2 and the drain terminal D2 of the first N-channel MOS transistor NMOS1 shown in FIG. 1, respectively.

The second N-channel MOS transistor NMOS2 may include an N-type source region 248 and an N-type drain region 247 which are disposed in an upper portion of the first substrate 210 and are spaced apart from each other by a channel region vertically overlapping with the fourth gate stack. The N-type source region 248 and the N-type drain region 247 may correspond to the source terminal S4 and the drain terminal D4 of the second N-channel MOS transistor NMOS2 shown in FIG. 1, respectively.

The first interlayer insulation layer 250 may be disposed on the top surface 210a of the first substrate 210 to cover the first to fourth gate stacks. The first interlayer insulation layer 250 may have a multi-layered structure including a plurality of insulation layers which are vertically stacked. In some embodiments, the first interlayer insulation layer 250 may include a plurality of oxide layers. A plurality of interconnection patterns may be disposed in the first interlayer insulation layer 250. The plurality of interconnection patterns may have a multi-layered interconnection structure. The multi-level interconnection structure may include first interconnection patterns 271~279 which are disposed at a lowermost level (i.e., a first level) that is close to the top surface 210a of the first substrate 210. The multi-level interconnection structure may further include second interconnection patterns 291 and 292 which are disposed at an uppermost level (i.e., a second level) that is far from the top surface 210a of the first substrate 210. Although not shown in the drawings, at least one interconnection pattern may be additionally disposed in the first interlayer insulation layer 250 between the first and second levels. Additional interconnection patterns such as illustrated in FIG. 3 may be disposed at the levels in the first interlayer insulation layer 450.

The first interconnection pattern 271 may be electrically connected to the N-type source region 248 of the second N-channel MOS transistor NMOS2 through a via 251. The first interconnection pattern 273 may be electrically connected to the N-type drain region 247 of the second N-channel MOS transistor NMOS2 and the P-type drain region 245 of the second P-channel MOS transistor PMOS2 through vias 253 and 254. The first interconnection pattern 275 may be electrically connected to the P-type source region 246 of the second P-channel MOS transistor PMOS2 and the N-type source region 244 of the first N-channel MOS transistor NMOS1 through vias 256 and 257.

The first interconnection pattern 277 may be electrically connected to the N-type drain region 243 of the first N-channel MOS transistor NMOS1 and the P-type drain region 241 of the first P-channel MOS transistor PMOS1 through vias 259 and 260. The first interconnection pattern 279 may be electrically connected to the P-type source region 242 of the first P-channel MOS transistor PMOS1 through a via 262.

First interconnection patterns 272, 274, 276 and 278 may be electrically connected to the fourth gate conductive layer pattern 234, the third gate conductive layer pattern 233, the second gate conductive layer pattern 232 and the first gate conductive layer pattern 231 through vias 252, 255, 258 and 261, respectively. The second interconnection pattern 291 may be electrically connected to the first interconnection pattern 273 through a via 281. The second interconnection pattern 292 may be electrically connected to the first interconnection pattern 277 through a via 282.

As described with reference to FIG. 2, the second interconnection pattern 292 may be electrically connected to the first external circuit pattern (381 of FIG. 2) through the first through via 371 that penetrates the second substrate (310 of FIG. 2) and the second interlayer insulation layer (360 of FIG. 2) and extends into the first interlayer insulation layer 250. Accordingly, the P-type drain region 241 of the first P-channel MOS transistor PMOS1 and the N-type drain region 243 of the first N-channel MOS transistor NMOS1 (corresponding to the first connection node "a" of FIG. 1) may be electrically connected to the first through via 371 through the first interconnection pattern 277, the second interconnection pattern 292 and the vias 259, 260 and 282.

Moreover, the second interconnection pattern 291 may be electrically connected to the second external circuit pattern (382 of FIG. 2) through the fourth through via 374 that penetrates the second substrate (310 of FIG. 2) and the second interlayer insulation layer (360 of FIG. 2) and extends into the first interlayer insulation layer 250. Accordingly, the P-type drain region 245 of the second P-channel MOS transistor PMOS2 and the N-type drain region 247 of the second N-channel MOS transistor NMOS2 (corresponding to the second connection node "b" of FIG. 1) may be electrically connected to the fourth through via 374 through the first interconnection pattern 273, the second interconnection pattern 291 and the vias 253, 254 and 281.

Figure 4:
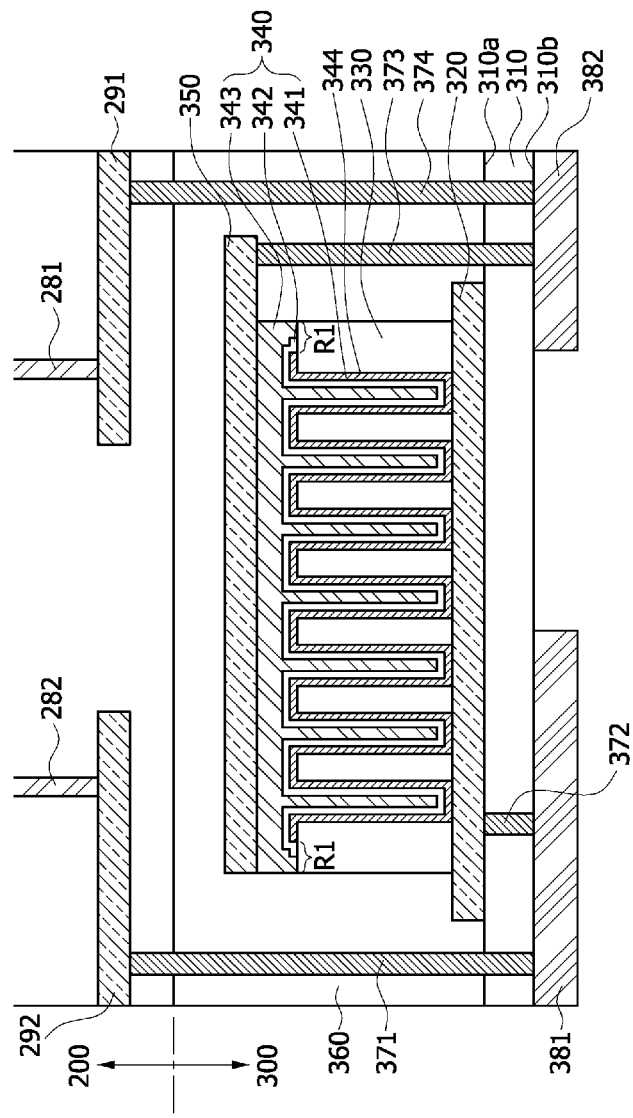
FIG. 4 is a cross-sectional view illustrating a capacitor cell of the switched-capacitor DC-to-DC converter shown in FIG. 2.

FIG. 4 is a cross-sectional view illustrating the capacitor cell 300 of FIG. 2 in detail. In FIG. 4, the same reference numerals or designators as used in FIGS. 1 and 2 may denote the same elements. Referring to FIGS. 2 and 4, the capacitor cell 300 may include the capacitor 340 disposed on the second substrate 310. Specifically, the lower interconnection pattern 320 may be disposed on a top surface 310a of the second substrate 310 opposite to the first and second external circuit patterns 381 and 382.

Although not shown in the drawings, an insulation layer may be disposed between the top surface 310a of the second substrate 310 and a bottom surface of the lower interconnection pattern 320. The first and second external circuit patterns 381 and 382 may be disposed on the bottom surface 310b of the second substrate 310. Although not shown in the drawings, an insulation layer may be disposed between the bottom surface 310b of the second substrate 310 and the top surfaces of the first and second external circuit patterns 381 and 382.

A dummy insulation pattern 330 may be disposed on a top surface of the lower interconnection pattern 320 opposite to the second substrate 310. The dummy insulation pattern 330 may have a plurality of contact holes 344 therein. Each of the contact holes 344 may penetrate the dummy insulation pattern 330 to expose the lower interconnection pattern 320. The contact holes 344 may be disposed to be spaced apart from each other in a plan view. In some embodiments, the contact holes 344 may be arrayed to be located at central points and vertices of a plurality of hexagons constituting a honeycomb structure when viewed from a plan view. In some embodiments, the dummy insulation pattern 330 may be comprised of a single oxide layer or a plurality of insulation layers.

A lower electrode pattern 341 of the capacitor 340 may be disposed on the lower interconnection pattern 320 exposed by the contact holes 344 and on sidewalls of the dummy insulation pattern 330 exposed by the contact holes 344. The lower electrode pattern 341 may extend onto a top surface of the dummy insulation pattern 330. The lower electrode pattern 341 may be in direct contact with the lower interconnection pattern 320 in the contact holes 344. Thus, the lower electrode pattern 341 may be electrically connected to the lower interconnection pattern 320.

The lower electrode pattern 341 may be disposed to expose a top surface of a first region R1 corresponding to an edge region of the dummy insulation pattern 330. Accordingly, the lower electrode pattern 341 may be disposed to cover an entire surface of the dummy insulation pattern 330 surrounded by the first region R1. In some embodiment, the lower electrode pattern 341 may include a single metal layer or a metal compound layer such as a tantalum nitride (TaN) layer or a titanium nitride (TiN) layer.

A dielectric pattern 342 of the capacitor 340 may be disposed to cover the lower electrode pattern 341. In the first region R1, the dielectric pattern 342 may cover sidewalls of the lower electrode pattern 341 and may extend onto the exposed top surface of the dummy insulation pattern 330. The dielectric pattern 342 may be disposed to expose edges of the first region R1. In some embodiments, the dielectric pattern 342 may be a high-k dielectric layer such as a silicon nitride (SiN) layer, an aluminum oxide ($Al_2O_3$) layer, a tantalum pentoxide ($Ta_2O_5$) layer, a zirconium oxide ($ZrO_2$) layer or a hafnium oxide ($HfO_2$) layer. Alternatively, the dielectric pattern 342 may be a high-k dielectric layer such as a $ZrO_2/Al_2O_3/ZrO_2$ layer.

An upper electrode pattern 343 of the capacitor 340 may be disposed to cover the dielectric pattern 342 and the top surface of the dummy insulation pattern 330 exposed by the dielectric pattern 342. The upper electrode pattern 343 may be disposed to fill the contact holes 344 and to have a flat top surface. In some embodiments, the upper electrode pattern 343 may include a single metal layer or a metal compound layer such as a tantalum nitride (TaN) layer or a titanium nitride (TiN) layer. The upper interconnection pattern 350 may be disposed on the upper electrode pattern 343. The top surface of the upper electrode pattern 343 may be in direct contact with a bottom surface of the upper interconnection pattern 350. Thus, the upper electrode pattern 343 may be electrically connected to the upper interconnection pattern 350. In some embodiment, the upper interconnection pattern 350 may laterally protrude from a sidewall of the upper electrode pattern 343 to have an overhang.

As described with reference to FIGS. 2 and 3, the first external circuit pattern 381 may be electrically connected to the second interconnection pattern 292 of the logic cell 200 through the first through via 371. In addition, the first external circuit pattern 381 may be electrically connected to the lower interconnection pattern 320 through the second through via 372. Accordingly, the P-type drain region 241 of the first P-channel MOS transistor PMOS1 and the N-type drain region 243 of the first N-channel MOS transistor NMOS1 (corresponding to the first connection node "a" of FIG. 1) may be electrically connected to the lower electrode pattern 341 of the capacitor 340.

The second external circuit pattern 382 may be electrically connected to the upper interconnection pattern 350 through the third through via 373. In addition, the second external circuit pattern 382 may be electrically connected to the second interconnection pattern 291 of the logic cell 200 through the fourth through via 374. Accordingly, the P-type drain region 245 of the second P-channel MOS transistor PMOS2 and the N-type drain region 247 of the second N-channel MOS transistor NMOS2 (corresponding to the second connection node "b" of FIG. 1) may be electrically connected to the upper electrode pattern 343 of the capacitor 340.

Figure 5:
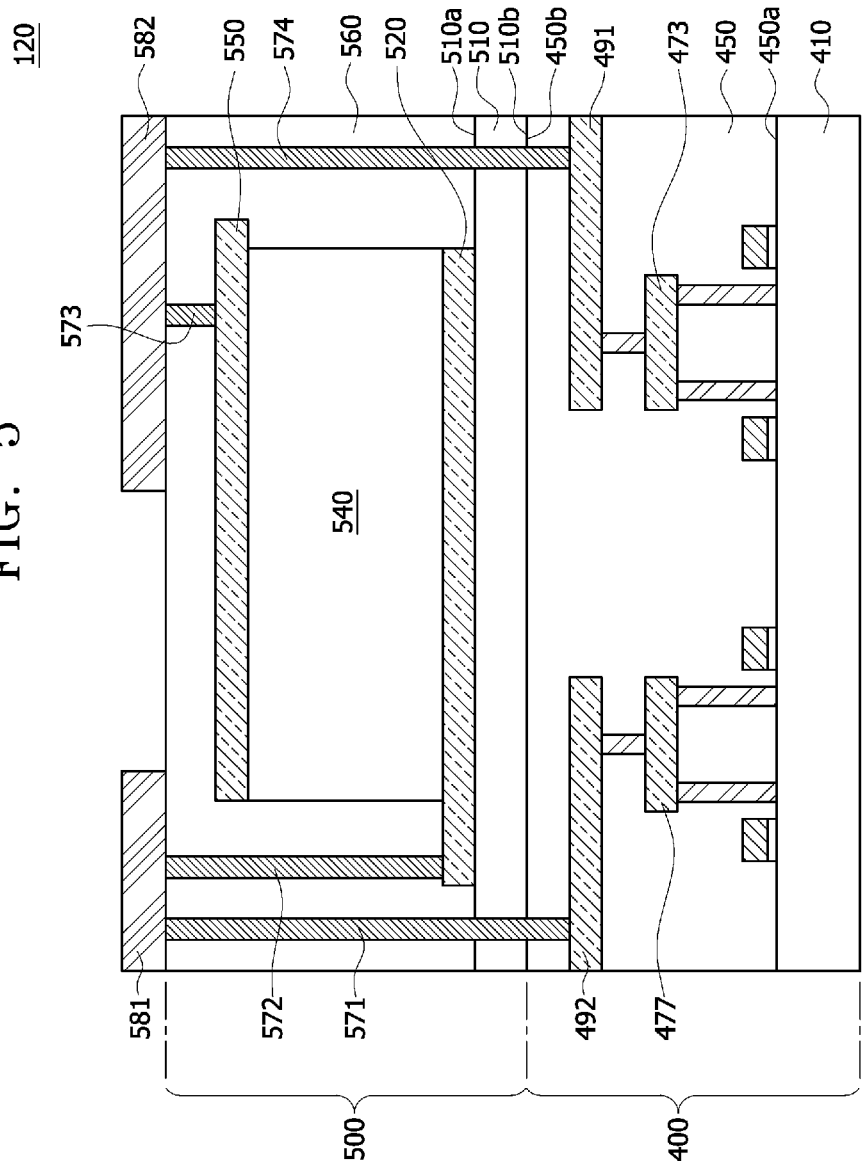
FIG. 5 is a cross-sectional view illustrating a switched-capacitor DC-to-DC converter according to another embodiment.

FIG. 5 is a cross-sectional view illustrating a switched-capacitor DC-to-DC converter 120 according to another embodiment. Referring to FIG. 5, the switched-capacitor DC-to-DC converter 120 may have a stack structure of a logic cell 400 including a logic device and a capacitor cell 500 including a capacitor. The logic cell 400 may be bonded to the capacitor cell 500 so that a surface of the logic cell 400 is in contact with a surface of the capacitor cell 500. The logic cell 400 may include a logic device disposed in a first substrate 410, a first interlayer insulation layer 450 on the first substrate 410, and interconnection patterns 473, 477, 491 and 492 disposed in the first interlayer insulation layer 450. The interconnection patterns 473, 477, 491 and 492 may include first interconnection patterns 473 and 477 and second interconnection patterns 491 and 492 which are disposed at a different level from the first interconnection patterns 473 and 477.

The capacitor cell 500 may include a capacitor 540 disposed on a second substrate 510, a second interlayer insulation layer 560 disposed on the second substrate 510 to cover the capacitor 540, and interconnection patterns 520 and 550 disposed in the second interlayer insulation layer 560. The interconnection patterns 520 and 550 may include a lower interconnection pattern 520 and an upper interconnection pattern 550.

The first interlayer insulation layer 450 may have a bottom surface 450*a* contacting a surface of the first substrate 410 and a top surface 450*b* opposite to the first substrate 410. The second substrate 510 may have a top surface 510*a* contacting a surface of the second interlayer insulation layer 560 and a bottom surface 510*b* opposite to the second interlayer insulation layer 560. The top surface 450*b* of the first interlayer insulation layer 450 may be directly bonded to the bottom surface 510*b* of the second substrate 510. In some embodiment, the first interlayer insulation layer 450 may be an oxide layer, and the second substrate 510 may be a silicon layer. In such a case, the logic cell 400 and the capacitor cell 400 may be attached to each other through oxide-to-silicon bonding, and a thickness of the second substrate 510 of the capacitor cell 500 may be less than a thickness of the first substrate 410 of the logic cell 400.

A plurality of external circuit patterns including a first external circuit pattern 581 and a second external circuit pattern 582 may be disposed on a surface of the second interlayer insulation layer 560 opposite to the second substrate 510. In addition to the first and second external circuit patterns 581 and 582, additional external circuit patterns may be provided. The additional external circuit patterns (not illustrated in FIG. 2) may be connected to the input voltage terminal (VIN of FIG. 1), the output voltage terminal (VOUT of FIG. 1), the ground terminal (GND of FIG. 1) and the gate voltage input terminal (VG of FIG. 1), respectively.

The first and second external circuit patterns 581 and 582 may be connected to the first and second connection nodes "a" and "b" illustrated in FIG. 1, respectively. The first external circuit pattern 581 may be electrically connected to the second interconnection pattern 492 of the logic cell 400 through a first through via 571 that penetrates the second substrate 510 and the second interlayer insulation layer 560 and extends into the first interlayer insulation layer 450. In addition, the first external circuit pattern 581 may be electrically connected to the lower interconnection pattern 520 of the capacitor cell 500 through a second through via 572 disposed in the second interlayer insulation layer 560. Accordingly, the second interconnection pattern 492 of the logic cell 400 may be electrically connected to the lower interconnection pattern 520 of the capacitor cell 500. The second external circuit pattern 582 may be electrically connected to the upper interconnection pattern 550 of the capacitor cell 500 through a third through via 573 disposed in the second interlayer insulation layer 560.

In addition, the second external circuit pattern 582 may be electrically connected to the second interconnection pattern 491 of the logic cell 400 through a fourth through via 574 that penetrates the second substrate 510 and the second interlayer insulation layer 560 and extends into the first interlayer insulation layer 450. Accordingly, the second interconnection pattern 491 of the logic cell 400 may be electrically connected to the upper interconnection pattern 550 of the capacitor cell 500.

Figure 6:
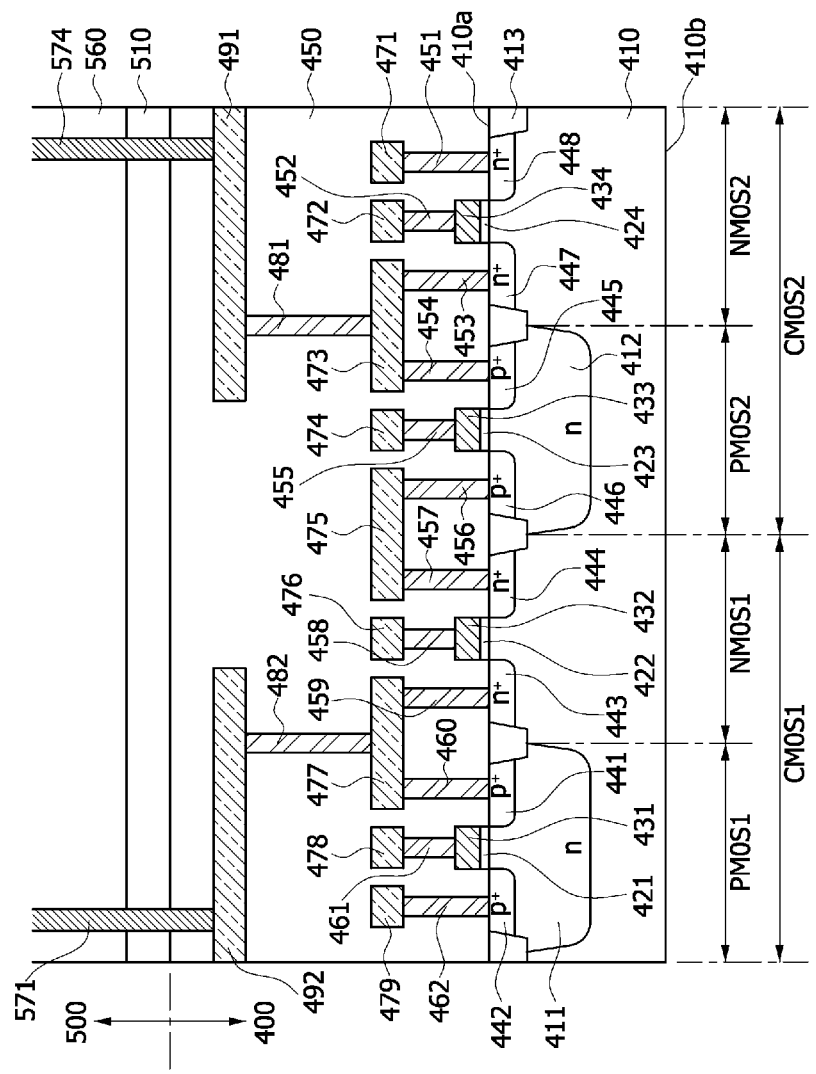
FIG. 6 is a cross-sectional view illustrating a logic cell of the switched-capacitor DC-to-DC converter shown in FIG. 5.

FIG. 6 is a cross-sectional view illustrating the logic cell 400 of FIG. 5 in detail. In FIG. 6, the same reference numerals or designators as used in FIGS. 1 and 5 may denote the same elements. Referring to FIGS. 5 and 6, the logic cell 400 may include a logic device disposed in the first substrate 410. The logic device may be configured to include the first CMOS device CMOS1 and the second CMOS device CMOS2. The first CMOS device CMOS1 may include the first N-channel MOS transistor NMOS1 and the first P-channel MOS transistor PMOS1. The second CMOS device CMOS2 may include the second N-channel MOS transistor NMOS2 and the second P-channel MOS transistor PMOS2. Specifically, the first substrate 410 may have a top surface 410*a* and a bottom surface 410*b*. In some embodiments, the first substrate 410 may be a P-type semiconductor substrate.

A trench isolation layer 413 may be disposed in a certain portion of an upper region of the first substrate 410 to isolate the MOS transistors PMOS1, NMOS1, PMOS2 and NMOS2 from each other. The upper region of the first substrate 410 may correspond to a region adjacent to the top surface 410*a*. A first N-type well region 411 may be disposed in an upper portion of the first substrate 410 to act as a bulk region (or a body region) of the first P-channel MOS transistor PMOS1.

A second N-type well region 412 may be disposed in an upper portion of the first substrate 410 to act as a bulk region (or a body region) of the second P-channel MOS transistor PMOS2. The upper region or the upper portion of the first substrate 410 may correspond to a region or a portion which is adjacent to the top surface 410*a*.

The first P-channel MOS transistor PMOS1 may include a first gate stack disposed on the top surface 410*a* of the first substrate 410. The first gate stack may include a first gate insulation layer pattern 421 and a first gate conductive layer pattern 431 which are sequentially stacked on the top surface 410*a* of the first substrate 410. The first gate stack may correspond to the gate terminal G1 of the first P-channel MOS transistor PMOS1 shown in FIG. 1.

The first N-channel MOS transistor NMOS1 may include a second gate stack disposed on the top surface 410*a* of the first substrate 410. The second gate stack may include a second gate insulation layer pattern 422 and a second gate conductive layer pattern 432 which are sequentially stacked on the top surface 410*a* of the first substrate 410. The second gate stack may correspond to the gate terminal G2 of the first N-channel MOS transistor NMOS1 shown in FIG. 1.

The second P-channel MOS transistor PMOS2 may include a third gate stack disposed on the top surface 410*a* of the first substrate 410. The third gate stack may include a third gate insulation layer pattern 423 and a third gate conductive layer pattern 433 which are sequentially stacked on the top surface 410*a* of the first substrate 410. The third gate stack may correspond to the gate terminal G3 of the second P-channel MOS transistor PMOS2 shown in FIG. 1.

The second N-channel MOS transistor NMOS2 may include a fourth gate stack disposed on the top surface 410*a* of the first substrate 410. The fourth gate stack may include a fourth gate insulation layer pattern 424 and a fourth gate conductive layer pattern 434 which are sequentially stacked on the top surface 410a of the first substrate 410. The fourth gate stack may correspond to the gate terminal G4 of the second N-channel MOS transistor NMOS2 shown in FIG. 1.

The first P-channel MOS transistor PMOS1 may include a P-type source region 442 and a P-type drain region 441 which are disposed in an upper portion of the first N-type well region 411 and are spaced apart from each other by a channel region vertically overlapping with the first gate stack. The P-type source region 442 and the P-type drain region 441 may correspond to the source terminal S1 and the drain terminal D1 of the first P-channel MOS transistor PMOS1 shown in FIG. 1, respectively.

The second P-channel MOS transistor PMOS2 may include a P-type source region 446 and a P-type drain region 445 which are disposed in an upper portion of the second N-type well region 412 and are spaced apart from each other by a channel region vertically overlapping with the third gate stack. The P-type source region 446 and the P-type drain region 445 may correspond to the source terminal S3 and the drain terminal D3 of the second P-channel MOS transistor PMOS2 shown in FIG. 1, respectively.

The first N-channel MOS transistor NMOS1 may include an N-type source region 444 and an N-type drain region 443 which are disposed in an upper portion of the first substrate 410 and are spaced apart from each other by a channel region vertically overlapping with the second gate stack. The N-type source region 444 and the N-type drain region 443 may correspond to the source terminal S2 and the drain terminal D2 of the first N-channel MOS transistor NMOS1 shown in FIG. 1, respectively.

The second N-channel MOS transistor NMOS2 may include an N-type source region 448 and an N-type drain region 447 which are disposed in an upper portion of the first substrate 410 and are spaced apart from each other by a channel region vertically overlapping with the fourth gate stack. The N-type source region 448 and the N-type drain region 447 may correspond to the source terminal S4 and the drain terminal D4 of the second N-channel MOS transistor NMOS2 shown in FIG. 1, respectively.

The first interlayer insulation layer 450 may be disposed on the top surface 410a of the first substrate 410 to cover the first to fourth gate stacks. The first interlayer insulation layer 450 may have a multi-layered structure including a plurality of insulation layers which are vertically stacked. In some embodiments, the first interlayer insulation layer 450 may include a plurality of oxide layers. A plurality of interconnection patterns may be disposed in the first interlayer insulation layer 450. The plurality of interconnection patterns may have a multi-layered interconnection structure. The multi-level interconnection structure may include first interconnection patterns 471~479 which are disposed at a lowermost level (i.e., a first level) that is close to the top surface 410a of the first substrate 410.

The multi-level interconnection structure may further include second interconnection patterns 491 and 492 which are disposed at an uppermost level (i.e., a second level) that is far from the top surface 410a of the first substrate 410. Although not shown in the drawings, at least one interconnection pattern may be additionally disposed in the first interlayer insulation layer 450 between the first and second levels. Additional interconnection patterns such as illustrated in FIG. 3 may be disposed at the levels in the first interlayer insulation layer 450.

The first interconnection pattern 471 may be electrically connected to the N-type source region 448 of the second N-channel MOS transistor NMOS2 through a via 451. The first interconnection pattern 473 may be electrically connected to the N-type drain region 447 of the second N-channel MOS transistor NMOS2 and the P-type drain region 445 of the second P-channel MOS transistor PMOS2 through vias 453 and 454. The first interconnection pattern 475 may be electrically connected to the P-type source region 446 of the second P-channel MOS transistor PMOS2 and the N-type source region 444 of the first N-channel MOS transistor NMOS1 through vias 456 and 457. The first interconnection pattern 477 may be electrically connected to the N-type drain region 443 of the first N-channel MOS transistor NMOS1 and the P-type drain region 441 of the first P-channel MOS transistor PMOS1 through vias 459 and 460.

The first interconnection pattern 479 may be electrically connected to the P-type source region 442 of the first P-channel MOS transistor PMOS1 through a via 462. First interconnection patterns 472, 474, 476 and 478 may be electrically connected to the fourth gate conductive layer pattern 434, the third gate conductive layer pattern 433, the second gate conductive layer pattern 432 and the first gate conductive layer pattern 431 through vias 452, 455, 458 and 461, respectively. The second interconnection pattern 491 may be electrically connected to the first interconnection pattern 473 through a via 481. The second interconnection pattern 492 may be electrically connected to the first interconnection pattern 477 through a via 482.

As described with reference to FIG. 5, the second interconnection pattern 492 may be electrically connected to the first external circuit pattern (581 of FIG. 5) through the first through via 571 that penetrates the second substrate (510 of FIG. 5) and the second interlayer insulation layer (560 of FIG. 5) and extends into the first interlayer insulation layer 450. Accordingly, the P-type drain region 441 of the first P-channel MOS transistor PMOS1 and the N-type drain region 443 of the first N-channel MOS transistor NMOS1 (corresponding to the first connection node "a" of FIG. 1) may be electrically connected to the first through via 571 through the first interconnection pattern 477, the second interconnection pattern 492 and the vias 459, 460 and 482.

Moreover, the second interconnection pattern 491 may be electrically connected to the second external circuit pattern (582 of FIG. 5) through the fourth through via 574 that penetrates the second substrate (510 of FIG. 5) and the second interlayer insulation layer (560 of FIG. 5) and extends into the first interlayer insulation layer 450. Accordingly, the P-type drain region 445 of the second P-channel MOS transistor PMOS2 and the N-type drain region 447 of the second N-channel MOS transistor NMOS2 (corresponding to the second connection node "b" of FIG. 1) may be electrically connected to the fourth through via 574 through the first interconnection pattern 473, the second interconnection pattern 491 and the vias 453, 454 and 481.

Figure 7:
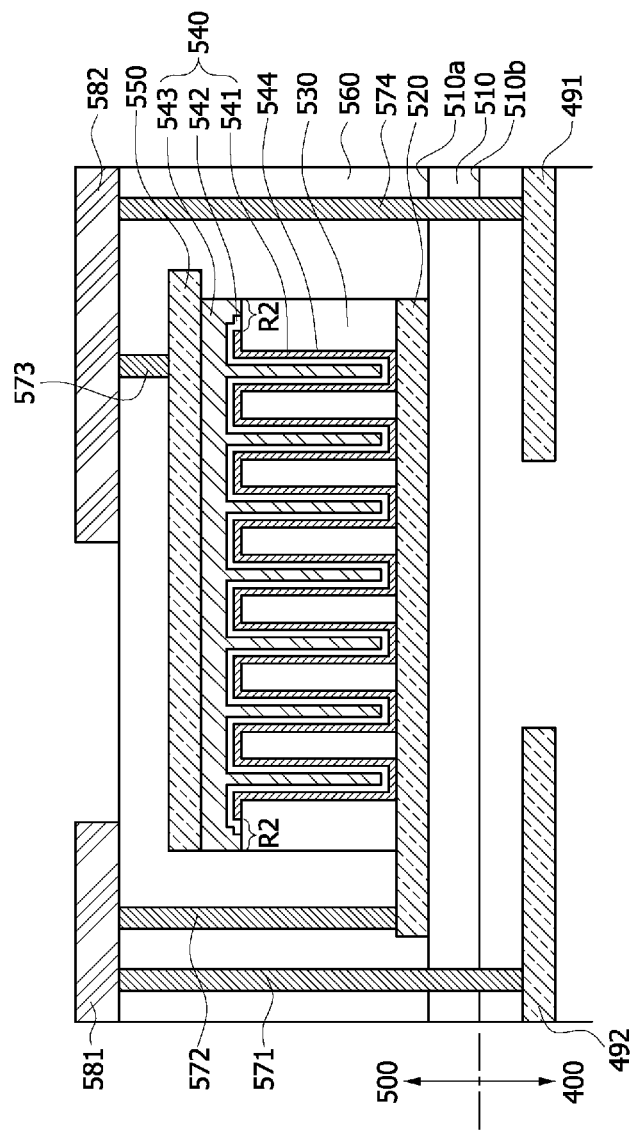
FIG. 7 is a cross-sectional view illustrating a capacitor cell of the switched-capacitor DC-to-DC converter shown in FIG. 5.

FIG. 7 is a cross-sectional view illustrating the capacitor cell 500 of FIG. 5 in detail. In FIG. 7, the same reference numerals or designators as used in FIGS. 5 and 6 may denote the same elements. Referring to FIGS. 5, 6 and 7, the capacitor cell 500 may include the capacitor 540 disposed on the second substrate 510. Specifically, the lower interconnection pattern 520 may be disposed on the top surface 510a of the second substrate 510 opposite to the second interconnection patterns 491 and 492. Although not shown in the drawings, an insulation layer may be disposed between the top surface 510a of the second substrate 510 and a bottom surface of the lower interconnection pattern 520.

A dummy insulation pattern 530 may be disposed on a top surface of the lower interconnection pattern 520 opposite to the second substrate 510. The dummy insulation pattern 530 may have a plurality of contact holes 544 therein. Each of the contact holes 544 may penetrate the dummy insulation pattern 530 to expose the lower interconnection pattern 520. The contact holes 544 may be disposed to be spaced apart from each other in a plan view. In some embodiments, the contact holes 544 may be arrayed to be located at central points and vertices of a plurality of hexagons constituting a honeycomb structure when viewed from a plan view. In some embodiments, the dummy insulation pattern 530 may be comprised of a single oxide layer or a plurality of insulation layers.

A lower electrode pattern 541 of the capacitor 540 may be disposed on the lower interconnection pattern 520 exposed by the contact holes 544 and on sidewalls of the dummy insulation pattern 530 exposed by the contact holes 544. The lower electrode pattern 541 may extend onto a top surface of the dummy insulation pattern 530. The lower electrode pattern 541 may be in direct contact with the lower interconnection pattern 520 in the contact holes 544. Thus, the lower electrode pattern 541 may be electrically connected to the lower interconnection pattern 520. The lower electrode pattern 541 may be disposed to expose a top surface of a first region R2 corresponding to an edge region of the dummy insulation pattern 530. Accordingly, the lower electrode pattern 541 may be disposed to cover an entire surface of the dummy insulation pattern 530 surrounded by the first region R1. In some embodiment, the lower electrode pattern 541 may include a single metal layer or a metal compound layer such as a tantalum nitride (TaN) layer or a titanium nitride (TiN) layer.

A dielectric pattern 542 of the capacitor 540 may be disposed to cover the lower electrode pattern 541. In the first region R2, the dielectric pattern 542 may cover sidewalls of the lower electrode pattern 541 and may extend onto the exposed top surface of the dummy insulation pattern 530. The dielectric pattern 542 may be disposed to expose edges of the first region R2. In some embodiments, the dielectric pattern 542 may be a high-k dielectric layer such as a silicon nitride (SiN) layer, an aluminum oxide ($Al_2O_3$) layer, a tantalum pentoxide ($Ta_2O_5$) layer, a zirconium oxide ($ZrO_2$) layer or a hafnium oxide ($HfO_2$) layer. Alternatively, the dielectric pattern 542 may be a high-k dielectric layer comprised of a composite layer such as a $ZrO_2/Al_2O_3/ZrO_2$ layer.

An upper electrode pattern 543 of the capacitor 540 may be disposed to cover the dielectric pattern 542 and the top surface of the dummy insulation pattern 530 exposed by the dielectric pattern 542. The upper electrode pattern 543 may be disposed to fill the contact holes 544 and to have a flat top surface. In some embodiments, the upper electrode pattern 543 may include a single metal layer or a metal compound layer such as a tantalum nitride (TaN) layer or a titanium nitride (TiN) layer. The upper interconnection pattern 550 may be disposed on the upper electrode pattern 543. The top surface of the upper electrode pattern 543 may be in direct contact with a bottom surface of the upper interconnection pattern 550. Thus, the upper electrode pattern 543 may be electrically connected to the upper interconnection pattern 550. In some embodiment, the upper interconnection pattern 550 may laterally protrude from a sidewall of the upper electrode pattern 543 to have an overhang.

The second interlayer insulation layer 560 may be disposed on the top surface 510a of the second substrate 510 to cover the capacitor 540, the lower interconnection pattern 520, and the upper interconnection pattern 550. The first and second external circuit patterns 581 and 582 may be disposed on a surface of the second interlayer insulation layer 560 opposite to the second substrate 510. As described with reference to FIGS. 5 and 6, the first external circuit pattern 581 may be electrically connected to the second interconnection pattern 492 of the logic cell 400 through the first through via 571.

In addition, the first external circuit pattern 581 may be electrically connected to the lower interconnection pattern 520 through the second through via 572. Accordingly, the P-type drain region 441 of the first P-channel MOS transistor PMOS1 and the N-type drain region 443 of the first N-channel MOS transistor NMOS1 (corresponding to the first connection node "a" of FIG. 1) may be electrically connected to the lower electrode pattern 541 of the capacitor 540. The second external circuit pattern 582 may be electrically connected to the upper interconnection pattern 550 through the third through via 573. In addition, the second external circuit pattern 582 may be electrically connected to the second interconnection pattern 491 of the logic cell 400 through the fourth through via 574. Accordingly, the P-type drain region 445 of the second P-channel MOS transistor PMOS2 and the N-type drain region 447 of the second N-channel MOS transistor NMOS2 (corresponding to the second connection node "b" of FIG. 1) may be electrically connected to the upper electrode pattern 543 of the capacitor 540.

Figure 8:
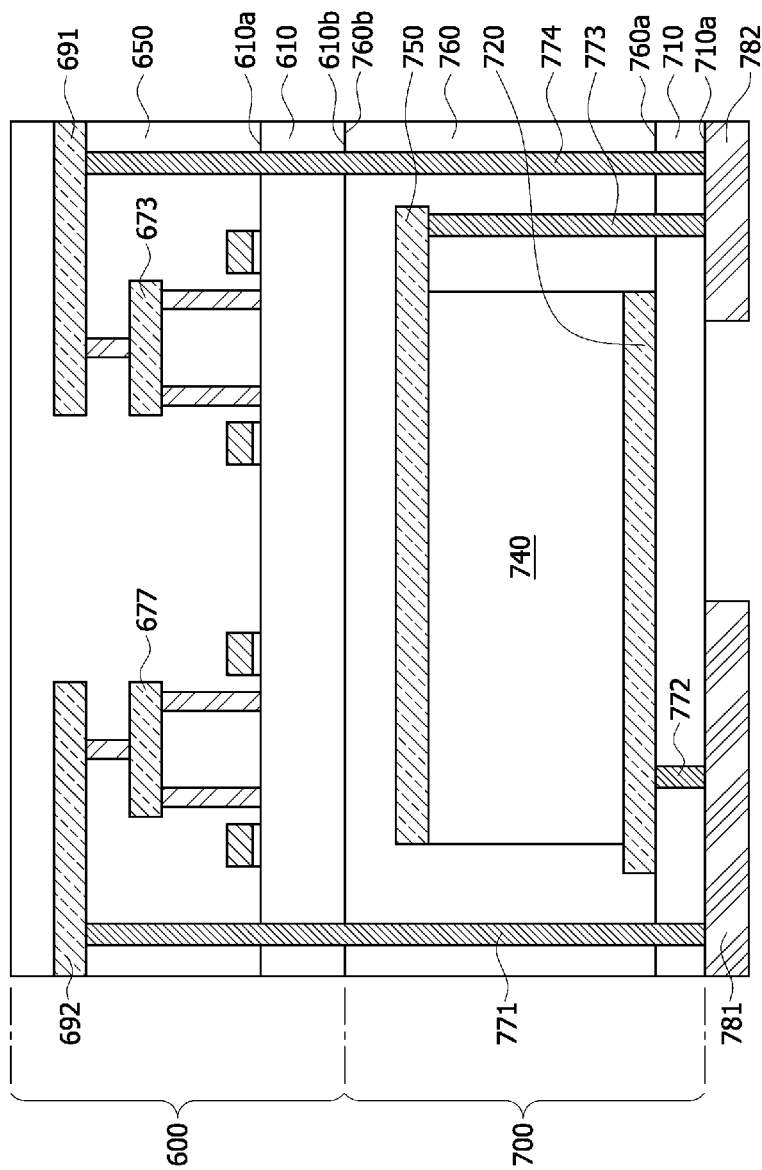
FIG. 8 is a cross-sectional view illustrating a switched-capacitor DC-to-DC converter according to yet another embodiment.

FIG. 8 is a cross-sectional view illustrating a switched-capacitor DC-to-DC converter 130 according to yet another embodiment. Referring to FIG. 8, the switched-capacitor DC-to-DC converter 130 may have a stack structure of a logic cell 600 including a logic device and a capacitor cell 700 including a capacitor. The logic cell 600 may be bonded to the capacitor cell 700 so that a surface of the logic cell 600 is in contact with a surface of the capacitor cell 700. The logic cell 600 may include a logic device disposed in a first substrate 610, a first interlayer insulation layer 650 disposed on the first substrate 610, and interconnection patterns 673, 677, 691 and 692 disposed in the first interlayer insulation layer 650. The interconnection patterns 673, 677, 691 and 692 may include first interconnection patterns 673 and 677 and second interconnection patterns 691 and 692 which are disposed at a different level from the first interconnection patterns 673 and 677.

The capacitor cell 700 may include a capacitor 740 disposed on a second substrate 710, a second interlayer insulation layer 760 disposed on the second substrate 710 to cover the capacitor 740, and interconnection patterns 720 and 750 disposed in the second interlayer insulation layer 760. The interconnection patterns 720 and 750 may include a lower interconnection pattern 720 and an upper interconnection pattern 750.

The first substrate 610 may have a top surface 610a contacting a surface of the first interlayer insulation layer 650 and a bottom surface 610b opposite to the first interlayer insulation layer 650. The second interlayer insulation layer 760 may have a bottom surface 760a contacting a surface of the second substrate 710 and a top surface 760b opposite to the second substrate 710. The bottom surface 610b of the first substrate 610 may be directly bonded to the top surface 760b of the second interlayer insulation layer 760. In some embodiment, the first substrate 610 may be a silicon layer, and the second interlayer insulation layer 760 may be an oxide layer. In such a case, the logic cell 600 and the capacitor cell 700 may be attached to each other through oxide-to-silicon bonding.

A plurality of external circuit patterns including a first external circuit pattern 781 and a second external circuit pattern 782 may be disposed on a bottom surface 710a of the second substrate 710 opposite to the second interlayer insulation layer 760. In addition to the first and second external circuit patterns 781 and 782, additional external circuit patterns (not illustrated in FIG. 8) may be provided. The additional external circuit patterns (not illustrated in FIG. 8) may be connected to the input voltage terminal (VIN of FIG. 1), the output voltage terminal (VOUT of FIG. 1), the ground terminal (GND of FIG. 1) and the gate voltage input terminal (VG of FIG. 1), respectively. The first and second external circuit patterns 781 and 782 may be connected to the first and second connection nodes "a" and "b" illustrated in FIG. 1, respectively.

The first external circuit pattern 781 may be electrically connected to the second interconnection pattern 692 of the logic cell 600 through a first through via 771 that penetrates the second substrate 710, the second interlayer insulation layer 760 and the first substrate 610 and extends into the first interlayer insulation layer 650. In addition, the first external circuit pattern 781 may be electrically connected to the lower interconnection pattern 720 of the capacitor cell 700 through a second through via 772 that penetrates the second substrate 710. Accordingly, the second interconnection pattern 692 of the logic cell 600 may be electrically connected to the lower interconnection pattern 720 of the capacitor cell 700.

The second external circuit pattern 782 may be electrically connected to the upper interconnection pattern 750 of the capacitor cell 700 through a third through via 773 that penetrates the second substrate 710 and extends into the second interlayer insulation layer 760. In addition, the second external circuit pattern 782 may be electrically connected to the second interconnection pattern 691 of the logic cell 600 through a fourth through via 774 that penetrates the second substrate 710, the second interlayer insulation layer 760 and the first substrate 610 and extends into the first interlayer insulation layer 650. Accordingly, the second interconnection pattern 691 of the logic cell 600 may be electrically connected to the upper interconnection pattern 750 of the capacitor cell 700.

Figure 9:
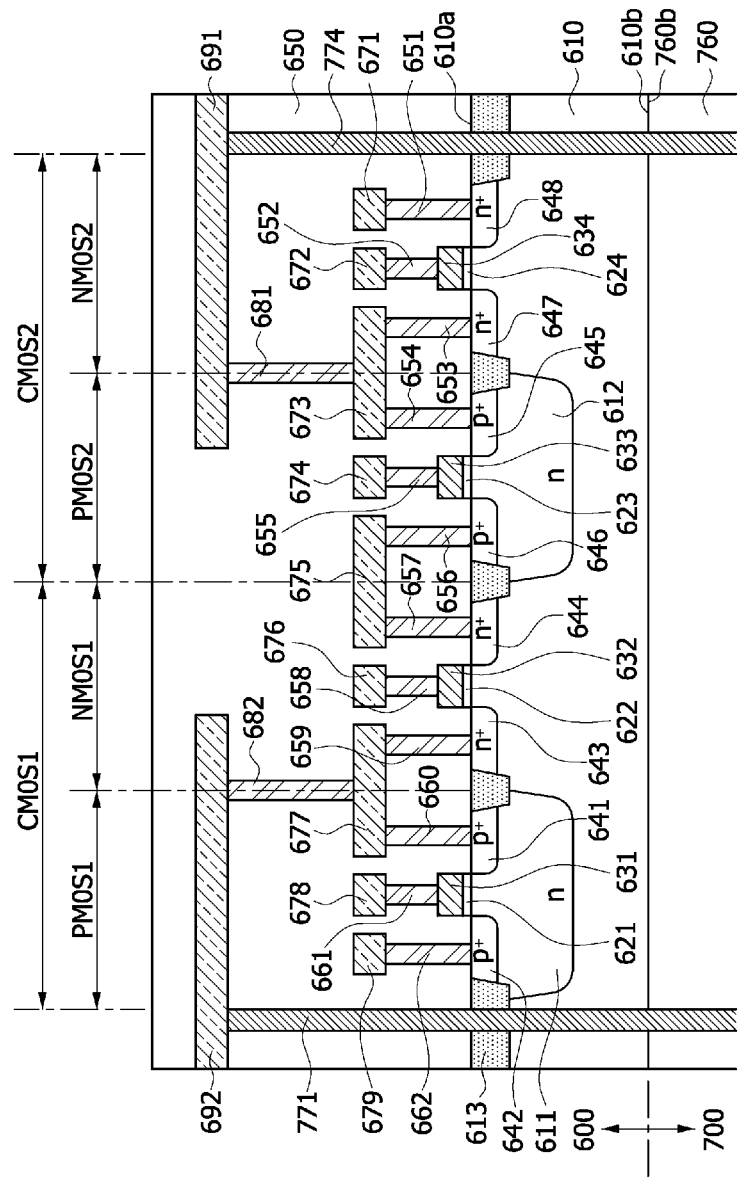
FIG. 9 is a cross-sectional view illustrating a logic cell of the switched-capacitor DC-to-DC converter shown in FIG. 8.

FIG. 9 is a cross-sectional view illustrating the logic cell 600 of FIG. 8 in detail. In FIG. 9, the same reference numerals or designators as used in FIGS. 1 and 8 may denote the same elements.

Referring to FIGS. 8 and 9, the logic cell 600 may include a logic device disposed in the first substrate 610. The logic device may be configured to include the first CMOS device CMOS1 and the second CMOS device CMOS2. The first CMOS device CMOS1 may include the first N-channel MOS transistor NMOS1 and the first P-channel MOS transistor PMOS1. The second CMOS device CMOS2 may include the second N-channel MOS transistor NMOS2 and the second P-channel MOS transistor PMOS2.

Specifically, the first substrate 610 may have the top surface 610a and the bottom surface 610b, as described above. The bottom surface 610b of the first substrate 610 may be in contact with the top surface 760b of the second interlayer insulation layer 760. In some embodiments, the first substrate 610 may be a P-type semiconductor substrate.

A trench isolation layer 613 may be disposed in a certain portion of an upper region of the first substrate 610 to isolate the MOS transistors PMOS1, NMOS1, PMOS2 and NMOS2 from each other. The upper region of the first substrate 610 may correspond to a region adjacent to the top surface 610a. A first N-type well region 611 may be disposed in an upper portion of the first substrate 610 to act as a bulk region (or a body region) of the first P-channel MOS transistor PMOS1. A second N-type well region 612 may be disposed in an upper portion of the first substrate 610 to act as a bulk region (or a body region) of the second P-channel MOS transistor PMOS2.

The upper region or the upper portion of the first substrate 610 may correspond to a region or a portion which is adjacent to the top surface 610a. The first P-channel MOS transistor PMOS1 may include a first gate stack disposed on the top surface 610a of the first substrate 610. The first gate stack may include a first gate insulation layer pattern 621 and a first gate conductive layer pattern 631 which are sequentially stacked on the top surface 610a of the first substrate 610. The first gate stack may correspond to the gate terminal G1 of the first P-channel MOS transistor PMOS1 shown in FIG. 1.

The first N-channel MOS transistor NMOS1 may include a second gate stack disposed on the top surface 610a of the first substrate 610. The second gate stack may include a second gate insulation layer pattern 622 and a second gate conductive layer pattern 632 which are sequentially stacked on the top surface 610a of the first substrate 610. The second gate stack may correspond to the gate terminal G2 of the first N-channel MOS transistor NMOS1 shown in FIG. 1.

The second P-channel MOS transistor PMOS2 may include a third gate stack disposed on the top surface 610a of the first substrate 610. The third gate stack may include a third gate insulation layer pattern 623 and a third gate conductive layer pattern 633 which are sequentially stacked on the top surface 610a of the first substrate 610. The third gate stack may correspond to the gate terminal G3 of the second P-channel MOS transistor PMOS2 shown in FIG. 1.

The second N-channel MOS transistor NMOS2 may include a fourth gate stack disposed on the top surface 610a of the first substrate 610. The fourth gate stack may include a fourth gate insulation layer pattern 624 and a fourth gate conductive layer pattern 634 which are sequentially stacked on the top surface 610a of the first substrate 610. The fourth gate stack may correspond to the gate terminal G4 of the second N-channel MOS transistor NMOS2 shown in FIG. 1.

The first P-channel MOS transistor PMOS1 may include a P-type source region 642 and a P-type drain region 641 which are disposed in an upper portion of the first N-type well region 611 and are spaced apart from each other by a channel region vertically overlapping with the first gate stack. The P-type source region 642 and the P-type drain region 641 may correspond to the source terminal S1 and the drain terminal D1 of the first P-channel MOS transistor PMOS1 shown in FIG. 1, respectively.

The second P-channel MOS transistor PMOS2 may include a P-type source region 646 and a P-type drain region 645 which are disposed in an upper portion of the second N-type well region 612 and are spaced apart from each other by a channel region vertically overlapping with the third gate stack. The P-type source region 646 and the P-type drain region 645 may correspond to the source terminal S3 and the drain terminal D3 of the second P-channel MOS transistor PMOS2 shown in FIG. 1, respectively.

The first N-channel MOS transistor NMOS1 may include an N-type source region 644 and an N-type drain region 643 which are disposed in an upper portion of the first substrate 610 and are spaced apart from each other by a channel region vertically overlapping with the second gate stack. The N-type source region 644 and the N-type drain region 643 may correspond to the source terminal S2 and the drain terminal D2 of the first N-channel MOS transistor NMOS1 shown in FIG. 1, respectively.

The second N-channel MOS transistor NMOS2 may include an N-type source region 648 and an N-type drain region 647 which are disposed in an upper portion of the first substrate 610 and are spaced apart from each other by a channel region vertically overlapping with the fourth gate stack. The N-type source region 648 and the N-type drain region 647 may correspond to the source terminal S4 and the drain terminal D4 of the second N-channel MOS transistor NMOS2 shown in FIG. 1, respectively.

The first interlayer insulation layer 650 may be disposed on the top surface 610a of the first substrate 610 to cover the first to fourth gate stacks. The first interlayer insulation layer 650 may have a multi-layered structure including a plurality of insulation layers which are vertically stacked. In some embodiments, the first interlayer insulation layer 650 may include a plurality of oxide layers. A plurality of interconnection patterns may be disposed in the first interlayer insulation layer 650.

The plurality of interconnection patterns may have a multi-layered interconnection structure. The multi-level interconnection structure may include first interconnection patterns 671~679 which are disposed at a lowermost level (i.e., a first level) that is close to the top surface 610a of the first substrate 610. The multi-level interconnection structure may further include second interconnection patterns 691 and 692 which are disposed at an uppermost level (i.e., a second level) that is far from the top surface 610a of the first substrate 610. Although not shown in the drawings, one or more additional interconnection patterns may be disposed in the first interlayer insulation layer 650 between the first and second levels. More than the interconnection patterns illustrated in FIG. 9 may be disposed at the levels in the first interlayer insulation layer 650.

The first interconnection pattern 671 may be electrically connected to the N-type source region 648 of the second N-channel MOS transistor NMOS2 through a via 651. The first interconnection pattern 673 may be electrically connected to the N-type drain region 647 of the second N-channel MOS transistor NMOS2 and the P-type drain region 645 of the second P-channel MOS transistor PMOS2 through vias 653 and 654. The first interconnection pattern 675 may be electrically connected to the P-type source region 646 of the second P-channel MOS transistor PMOS2 and the N-type source region 644 of the first N-channel MOS transistor NMOS1 through vias 656 and 657. The first interconnection pattern 677 may be electrically connected to the N-type drain region 643 of the first N-channel MOS transistor NMOS1 and the P-type drain region 641 of the first P-channel MOS transistor PMOS1 through vias 659 and 660. The first interconnection pattern 679 may be electrically connected to the P-type source region 642 of the first P-channel MOS transistor PMOS1 through a via 662. First interconnection patterns 672, 674, 676 and 678 may be electrically connected to the fourth gate conductive layer pattern 634, the third gate conductive layer pattern 633, the second gate conductive layer pattern 632 and the first gate conductive layer pattern 631 through vias 652, 655, 658 and 661, respectively.

The second interconnection pattern 691 may be electrically connected to the first interconnection pattern 673 through a via 681. The second interconnection pattern 692 may be electrically connected to the first interconnection pattern 677 through a via 682.

As described with reference to FIG. 8, the second interconnection pattern 692 may be electrically connected to the first external circuit pattern (781 of FIG. 8) through the first through via 771 that penetrates the second substrate (710 of FIG. 8) and the second interlayer insulation layer (760 of FIG. 8) and the first substrate 610 and extends into the first interlayer insulation layer 650. Accordingly, the P-type drain region 641 of the first P-channel MOS transistor PMOS1 and the N-type drain region 643 of the first N-channel MOS transistor NMOS1 (corresponding to the first connection node "a" of FIG. 1) may be electrically connected to the first through via 771 through the first interconnection pattern 677, the second interconnection pattern 692 and the vias 659, 660 and 682.

Moreover, the second interconnection pattern 691 may be electrically connected to the second external circuit pattern (782 of FIG. 8) through the fourth through via 774 that penetrates the second substrate (710 of FIG. 8) and the second interlayer insulation layer (760 of FIG. 8) and the first substrate 610 and extends into the first interlayer insulation layer 650. Accordingly, the P-type drain region 645 of the second P-channel MOS transistor PMOS2 and the N-type drain region 647 of the second N-channel MOS transistor NMOS2 (corresponding to the second connection node "b" of FIG. 1) may be electrically connected to the fourth through via 774 through the first interconnection pattern 673, the second interconnection pattern 691 and the vias 653, 654 and 681.

Figure 10:
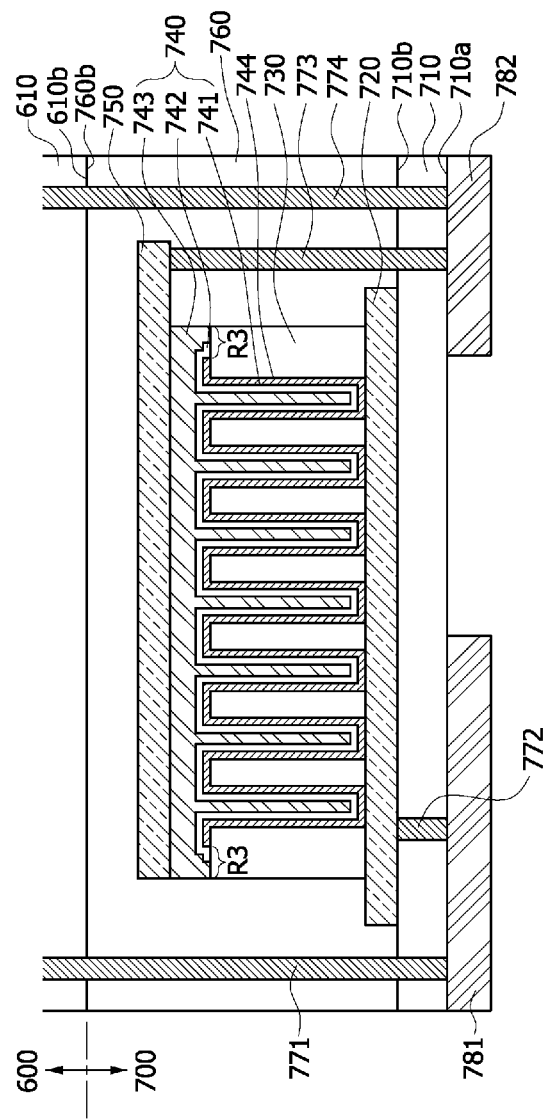
FIG. 10 is a cross-sectional view illustrating a capacitor cell of the switched-capacitor DC-to-DC converter shown in FIG. 8.

FIG. 10 is a cross-sectional view illustrating the capacitor cell 700 of FIG. 8 in detail. In FIG. 10, the same reference numerals or designators as used in FIGS. 8 and 9 may denote the same elements. Referring to FIGS. 8, 9 and 10, the capacitor cell 700 may include the capacitor 740 disposed on the second substrate 710.

Specifically, the lower interconnection pattern 720 may be disposed on a top surface 710b of the second substrate 710 opposite to the first and second external circuit patterns 781 and 782. Although not shown in the drawings, an insulation layer may be disposed between the top surface 710b of the second substrate 710 and a bottom surface of the lower interconnection pattern 720. The first and second external circuit patterns 781 and 782 may be disposed on the bottom surface 710a of the second substrate 710, as described above. Although not shown in the drawings, an insulation layer may also be disposed between the second substrate 710 and the first and second external circuit patterns 781 and 782.

A dummy insulation pattern 730 may be disposed on a top surface of the lower interconnection pattern 720 opposite to the second substrate 710. The dummy insulation pattern 730 may have a plurality of contact holes 744 therein. Each of the contact holes 744 may penetrate the dummy insulation pattern 730 to expose the lower interconnection pattern 720. The contact holes 744 may be disposed to be spaced apart from each other in a plan view. In some embodiments, the contact holes 744 may be arrayed to be located at central points and vertices of a plurality of hexagons constituting a honeycomb structure when viewed from a plan view. In some embodiments, the dummy insulation pattern 730 may be comprised of a single oxide layer or a plurality of insulation layers.

A lower electrode pattern 741 of the capacitor 740 may be disposed on the lower interconnection pattern 720 exposed by the contact holes 744 and on sidewalls of the dummy insulation pattern 730 exposed by the contact holes 744. The lower electrode pattern 741 may extend onto a top surface of the dummy insulation pattern 730. The lower electrode pattern 741 may be in direct contact with the lower interconnection pattern 720 in the contact holes 744. Thus, the lower electrode pattern 741 may be electrically connected to the lower interconnection pattern 720.

The lower electrode pattern 741 may be disposed to expose a top surface of a first region R3 corresponding to an edge region of the dummy insulation pattern 730. Accordingly, the lower electrode pattern 741 may be disposed to cover an entire surface of the dummy insulation pattern 730 surrounded by the first region R3. In some embodiment, the lower electrode pattern 741 may include a single metal layer or a metal compound layer such as a tantalum nitride (TaN) layer or a titanium nitride (TiN) layer.

A dielectric pattern 742 of the capacitor 740 may be disposed to cover the lower electrode pattern 741. In the first region R3, the dielectric pattern 742 may cover sidewalls of the lower electrode pattern 741 and may extend onto the exposed top surface of the dummy insulation pattern 730. The dielectric pattern 742 may be disposed to expose edges of the first region R3. In some embodiments, the dielectric pattern 742 may be a high-k dielectric layer such as a silicon nitride (SiN) layer, an aluminum oxide ($Al_2O_3$) layer, a tantalum pentoxide ($Ta_2O_5$) layer, a zirconium oxide ($ZrO_2$) layer, and a hafnium oxide ($HfO_2$) layer. Alternatively, the dielectric pattern 742 may be a high-k dielectric layer comprised of a composite layer such as a $ZrO_2/Al_2O_3/ZrO_2$ layer.

An upper electrode pattern 743 of the capacitor 740 may be disposed to cover the dielectric pattern 742 and the top surface of the dummy insulation pattern 730 exposed by the dielectric pattern 742. The upper electrode pattern 743 may be disposed to fill the contact holes 744 and to have a flat top surface. In some embodiments, the upper electrode pattern 743 may include a single metal layer or a metal compound layer such as a tantalum nitride (TaN) layer and a titanium nitride (TiN) layer.

The upper interconnection pattern 750 may be disposed on the upper electrode pattern 743. The top surface of the upper electrode pattern 743 may be in direct contact with a bottom surface of the upper interconnection pattern 750. Thus, the upper electrode pattern 743 may be electrically connected to the upper interconnection pattern 750. In some embodiment, the upper interconnection pattern 750 may laterally protrude from a sidewall of the upper electrode pattern 743 to have an overhang.

As described with reference to FIGS. 8 and 9, the first external circuit pattern 781 may be electrically connected to the second interconnection pattern 692 of the logic cell 600 through the first through via 771. In addition, the first external circuit pattern 781 may be electrically connected to the lower interconnection pattern 720 through the second through via 772. Accordingly, the P-type drain region 641 of the first P-channel MOS transistor PMOS1 and the N-type drain region 643 of the first N-channel MOS transistor NMOS1 (corresponding to the first connection node "a" of FIG. 1) may be electrically connected to the lower electrode pattern 741 of the capacitor 740.

The second external circuit pattern 782 may be electrically connected to the upper interconnection pattern 750 through the third through via 773. In addition, the second external circuit pattern 782 may be electrically connected to the second interconnection pattern 691 of the logic cell 600 through the fourth through via 774. Accordingly, the P-type drain region 645 of the second P-channel MOS transistor PMOS2 and the N-type drain region 647 of the second N-channel MOS transistor NMOS2 (corresponding to the second connection node "b" of FIG. 1) may be electrically connected to the upper electrode pattern 743 of the capacitor 740.

Figure 11:
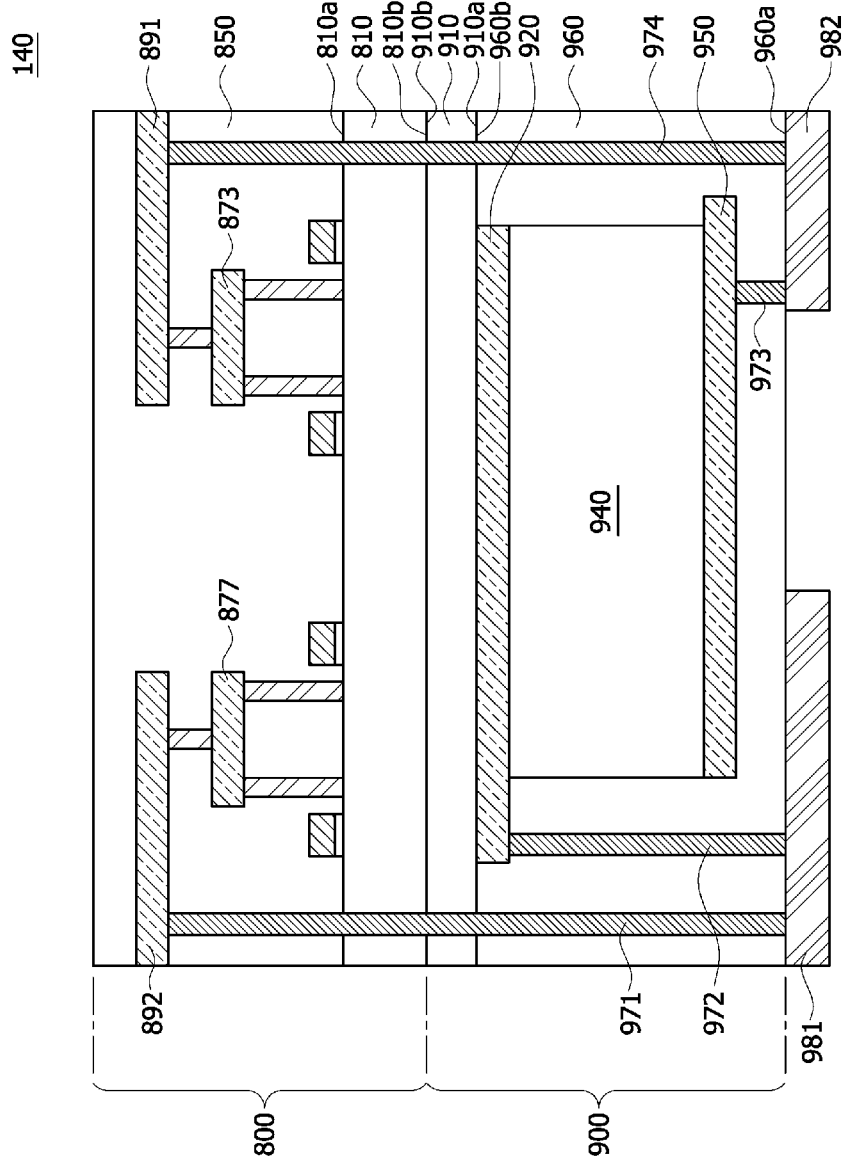
FIG. 11 is a cross-sectional view illustrating a switched-capacitor DC-to-DC converter according to still another embodiment.

FIG. 11 is a cross-sectional view illustrating a switched-capacitor DC-to-DC converter 140 according to still another embodiment. Referring to FIG. 11, the switched-capacitor DC-to-DC converter 140 may have a stack structure of a logic cell 800 including a logic cell 800 and a capacitor cell 900 including a capacitor.

The logic cell 800 may be bonded to the capacitor cell 900 so that a surface of the logic cell 800 is in contact with a surface of the capacitor cell 900. The logic cell 800 may include a logic device disposed in a first substrate 810, a first interlayer insulation layer 850 disposed on the first substrate 810, and interconnection patterns 873, 877, 891 and 892 disposed in the first interlayer insulation layer 850. The interconnection patterns 873, 877, 891 and 892 may include first interconnection patterns 873 and 877 and second interconnection patterns 891 and 892 which are disposed at a different level from the first interconnection patterns 873 and 877.

The capacitor cell 900 may include a capacitor 940 disposed on a second substrate 910, a second interlayer insulation layer 960 disposed on the second substrate 910 to cover the capacitor 940, and interconnection patterns 920 and 950 disposed in the second interlayer insulation layer 960. The interconnection patterns 920 and 950 may include a lower interconnection pattern 920 and an upper interconnection pattern 950.

The first substrate 810 may have a top surface 810a contacting a surface of the first interlayer insulation layer 850 and a bottom surface 810b opposite to the first interlayer insulation layer 850. The second substrate 910 may have a top surface 910a contacting a surface of the second interlayer insulation layer 960 and a bottom surface 910b opposite to the second interlayer insulation layer 960. The bottom surface 810b of the first substrate 810 may be directly bonded to the bottom surface 910b of the second substrate 910. In some embodiment, each of the first and second substrates 810 and 910 may be a silicon layer. In such a case, the logic cell 800 and the capacitor cell 900 may be attached to each other through silicon-to-silicon bonding. In other embodiments, an insulation layer may be disposed between the first and second substrates 810 and 910.

A plurality of external circuit patterns including a first external circuit pattern 981 and a second external circuit pattern 982 may be disposed on a top surface 960a of the second interlayer insulation layer 960 opposite to the second substrate 910. In addition to the first and second external circuit patterns 981 and 982, additional external circuit patterns (not illustrated in FIG. 11) may be provided. The additional external circuit patterns (not illustrated in FIG. 11) may include external circuit patterns which are connected to the input voltage terminal (VIN of FIG. 1), the output voltage terminal (VOUT of FIG. 1), the ground terminal (GND of FIG. 1) and the gate voltage input terminal (VG of FIG. 1) respectively.

The first and second external circuit patterns 981 and 982 may be connected to the first and second connection nodes "a" and "b" illustrated in FIG. 1, respectively. The first external circuit pattern 981 may be electrically connected to the second interconnection pattern 892 of the logic cell 800 through a first through via 971 that penetrates the second interlayer insulation layer 960, the second substrate 910 and the first substrate 810 and extends into the first interlayer insulation layer 850. In addition, the first external circuit pattern 981 may be electrically connected to the lower interconnection pattern 920 of the capacitor cell 900 through a second through via 972 disposed in the second interlayer insulation layer 960. Accordingly, the second interconnection pattern 892 of the logic cell 800 may be electrically connected to the lower interconnection pattern 920 of the capacitor cell 900.

The second external circuit pattern 982 may be electrically connected to the upper interconnection pattern 950 of the capacitor cell 900 through a third through via 973 disposed in the second interlayer insulation layer 960. In addition, the second external circuit pattern 982 may be electrically connected to the second interconnection pattern 891 of the logic cell 800 through a fourth through via 974 that penetrates the second interlayer insulation layer 960, the second substrate 910 and the first substrate 810 and extends into the first interlayer insulation layer 850. Accordingly, the second interconnection pattern 891 of the logic cell 800 may be electrically connected to the upper interconnection pattern 950 of the capacitor cell 900.

Figure 12:
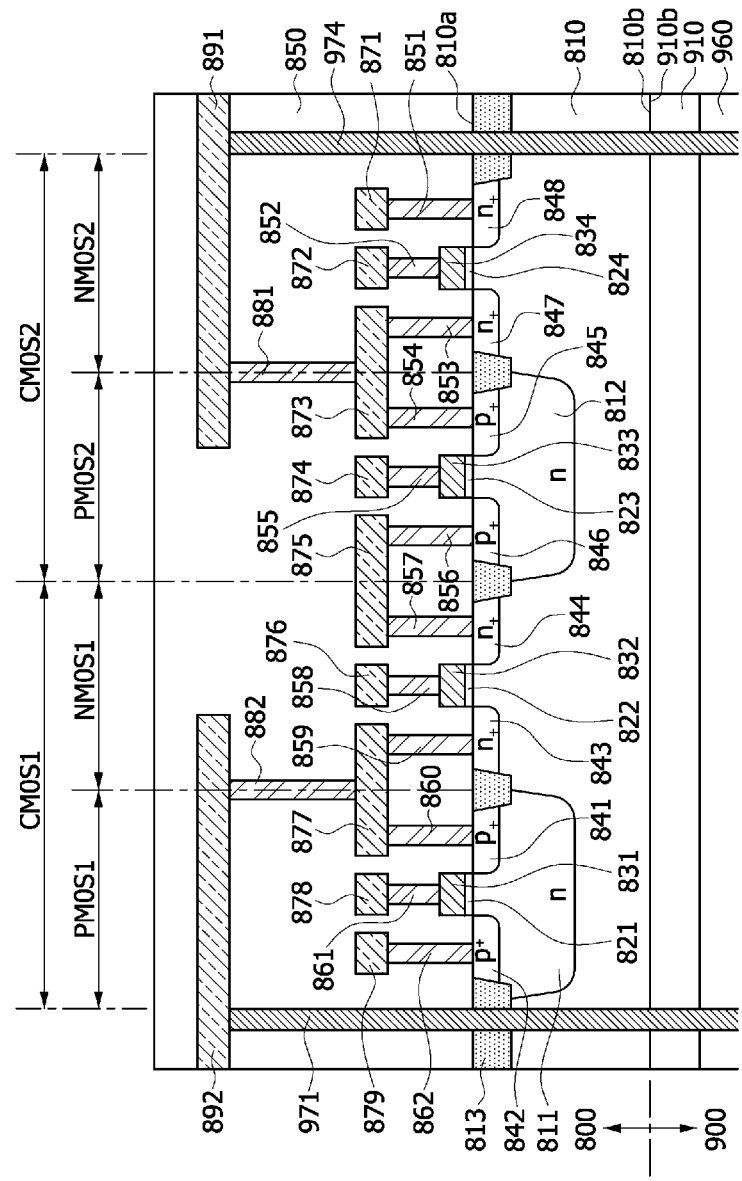
FIG. 12 is a cross-sectional view illustrating a logic cell of the switched-capacitor DC-to-DC converter shown in FIG. 11.

FIG. 12 is a cross-sectional view illustrating the logic cell 800 of FIG. 11 in detail. In FIG. 12, the same reference numerals or designators as used in FIGS. 1 and 11 may denote the same elements. Referring to FIGS. 11 and 12, the logic cell 800 may include a logic device disposed in the first substrate 810.

The logic device may be configured to include the first CMOS device CMOS1 and the second CMOS device CMOS2. The first CMOS device CMOS1 may include the first N-channel MOS transistor NMOS1 and the first P-channel MOS transistor PMOS1. The second CMOS device CMOS2 may include the second N-channel MOS transistor NMOS2 and the second P-channel MOS transistor PMOS2. Specifically, the first substrate 810 may have the top surface 810a and the bottom surface 810b, as described above. The bottom surface 810b of the first substrate 810 may be in contact with the bottom surface 910b of the second substrate 910. In some embodiments, the first substrate 610 may be a P-type semiconductor substrate.

A trench isolation layer 813 may be disposed in a certain portion of an upper region of the first substrate 810 to isolate the MOS transistors PMOS1, NMOS1, PMOS2 and NMOS2 from each other. The upper region of the first substrate 810 may correspond to a region adjacent to the top surface 810a.

A first N-type well region 811 may be disposed in an upper portion of the first substrate 810 to act as a bulk region (or a body region) of the first P-channel MOS transistor PMOS1. A second N-type well region 812 may be disposed in an upper portion of the first substrate 810 to act as a bulk region (or a body region) of the second P-channel MOS transistor PMOS2. The upper region or the upper portion of the first substrate 810 may correspond to a region or a portion which is adjacent to the top surface 810a.

The first P-channel MOS transistor PMOS1 may include a first gate stack disposed on the top surface 810a of the first substrate 810. The first gate stack may include a first gate insulation layer pattern 821 and a first gate conductive layer pattern 831 which are sequentially stacked on the top surface 810a of the first substrate 810. The first gate stack may correspond to the gate terminal G1 of the first P-channel MOS transistor PMOS1 shown in FIG. 1.

The first N-channel MOS transistor NMOS1 may include a second gate stack disposed on the top surface 810a of the first substrate 810. The second gate stack may include a second gate insulation layer pattern 822 and a second gate conductive layer pattern 832 which are sequentially stacked on the top surface 810a of the first substrate 810. The second gate stack may correspond to the gate terminal G2 of the first N-channel MOS transistor NMOS1 shown in FIG. 1.

The second P-channel MOS transistor PMOS2 may include a third gate stack disposed on the top surface 810a of the first substrate 810. The third gate stack may include a third gate insulation layer pattern 823 and a third gate conductive layer pattern 833 which are sequentially stacked on the top surface 810a of the first substrate 810. The third gate stack may correspond to the gate terminal G3 of the second P-channel MOS transistor PMOS2 shown in FIG. 1.

The second N-channel MOS transistor NMOS2 may include a fourth gate stack disposed on the top surface 810a of the first substrate 810. The fourth gate stack may include a fourth gate insulation layer pattern 824 and a fourth gate conductive layer pattern 834 which are sequentially stacked on the top surface 810a of the first substrate 810. The fourth gate stack may correspond to the gate terminal G4 of the second N-channel MOS transistor NMOS2 shown in FIG. 1.

The first P-channel MOS transistor PMOS1 may include a P-type source region 842 and a P-type drain region 841 which are disposed in an upper portion of the first N-type well region 811 and are spaced apart from each other by a channel region vertically overlapping with the first gate stack. The P-type source region 842 and the P-type drain region 841 may correspond to the source terminal S1 and the drain terminal D1 of the first P-channel MOS transistor PMOS1 shown in FIG. 1, respectively.

The second P-channel MOS transistor PMOS2 may include a P-type source region 846 and a P-type drain region 845 which are disposed in an upper portion of the second N-type well region 812 and are spaced apart from each other by a channel region vertically overlapping with the third gate stack. The P-type source region 846 and the P-type drain region 845 may correspond to the source terminal S3 and the drain terminal D3 of the second P-channel MOS transistor PMOS2 shown in FIG. 1, respectively.

The first N-channel MOS transistor NMOS1 may include an N-type source region 844 and an N-type drain region 843 which are disposed in an upper portion of the first substrate 810 and are spaced apart from each other by a channel region vertically overlapping with the second gate stack. The N-type source region 844 and the N-type drain region 843 may correspond to the source terminal S2 and the drain terminal D2 of the first N-channel MOS transistor NMOS1 shown in FIG. 1, respectively.

The second N-channel MOS transistor NMOS2 may include an N-type source region 848 and an N-type drain region 847 which are disposed in an upper portion of the first substrate 810 and are spaced apart from each other by a channel region vertically overlapping with the fourth gate stack. The N-type source region 848 and the N-type drain region 847 may correspond to the source terminal S4 and the drain terminal D4 of the second N-channel MOS transistor NMOS2 shown in FIG. 1, respectively.

The first interlayer insulation layer 850 may be disposed on the top surface 810a of the first substrate 810 to cover the first to fourth gate stacks. The first interlayer insulation layer 850 may have a multi-layered structure including a plurality of insulation layers which are vertically stacked. In some embodiments, the first interlayer insulation layer 850 may include a plurality of oxide layers.

A plurality of interconnection patterns may be disposed in the first interlayer insulation layer 850. The plurality of interconnection patterns may have a multi-layered interconnection structure. The multi-level interconnection structure may include first interconnection patterns 871~879 which are disposed at a lowermost level (i.e., a first level) that is close to the top surface 810a of the first substrate 810. The multi-level interconnection structure may further include second interconnection patterns 891 and 892 which are disposed at an uppermost level (i.e., a second level) that is far from the top surface 810a of the first substrate 810. Although not shown in the drawings, at least one interconnection pattern may be additionally disposed in the first interlayer insulation layer 850 between the first and second levels. For example, one or more of the interconnection patterns illustrated in FIG. 12 may be disposed at the levels in the first interlayer insulation layer 850.

The first interconnection pattern 871 may be electrically connected to the N-type source region 848 of the second N-channel MOS transistor NMOS2 through a via 851. The first interconnection pattern 873 may be electrically connected to the N-type drain region 847 of the second N-channel MOS transistor NMOS2 and the P-type drain region 845 of the second P-channel MOS transistor PMOS2 through vias 853 and 854.

The first interconnection pattern 875 may be electrically connected to the P-type source region 846 of the second P-channel MOS transistor PMOS2 and the N-type source region 844 of the first N-channel MOS transistor NMOS1 through vias 856 and 857. The first interconnection pattern 877 may be electrically connected to the N-type drain region 843 of the first N-channel MOS transistor NMOS1 and the P-type drain region 841 of the first P-channel MOS transistor PMOS1 through vias 859 and 860. The first interconnection pattern 879 may be electrically connected to the P-type source region 842 of the first P-channel MOS transistor PMOS1 through a via 862. First interconnection patterns 872, 874, 876 and 878 may be electrically connected to the fourth gate conductive layer pattern 834, the third gate conductive layer pattern 833, the second gate conductive layer pattern 832 and the first gate conductive layer pattern 831 through vias 852, 855, 858 and 861, respectively.

The second interconnection pattern 891 may be electrically connected to the first interconnection pattern 873 through a via 881. The second interconnection pattern 892 may be electrically connected to the first interconnection pattern 877 through a via 882.

As described with reference to FIG. 11, the second interconnection pattern 892 may be electrically connected to the first external circuit pattern (981 of FIG. 11) through the first through via 971 that penetrates the second interlayer insulation layer 960, the second substrate 910 and the first substrate 810 and extends into the first interlayer insulation layer 850. Accordingly, the P-type drain region 841 of the first P-channel MOS transistor PMOS1 and the N-type drain region 843 of the first N-channel MOS transistor NMOS1 (corresponding to the first connection node "a" of FIG. 1) may be electrically connected to the first through via 971 through the first interconnection pattern 877, the second interconnection pattern 892 and the vias 859, 860 and 882.

Moreover, the second interconnection pattern 891 may be electrically connected to the second external circuit pattern (982 of FIG. 11) through the fourth through via 974 that penetrates the second interlayer insulation layer 960, the second substrate 910 and the first substrate 810 and extends into the first interlayer insulation layer 850. Accordingly, the P-type drain region 845 of the second P-channel MOS transistor PMOS2 and the N-type drain region 847 of the second N-channel MOS transistor NMOS2 (corresponding to the second connection node "b" of FIG. 1) may be electrically connected to the fourth through via 974 through the first interconnection pattern 873, the second interconnection pattern 891 and the vias 853, 854 and 881.

Figure 13:
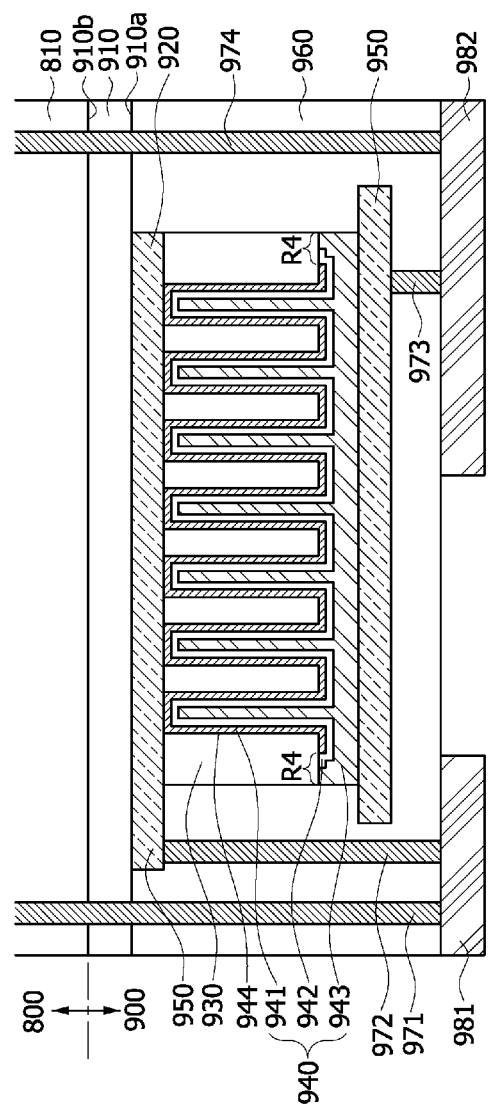
FIG. 13 is a cross-sectional view illustrating a capacitor cell of the switched-capacitor DC-to-DC converter shown in FIG. 11.

FIG. 13 is a cross-sectional view illustrating the capacitor cell 900 of FIG. 11 in detail. In FIG. 13, the same reference numerals or designators as used in FIGS. 11 and 12 may denote the same elements.

Referring to FIGS. 11, 12 and 13, the capacitor cell 900 may include the capacitor 940 disposed on the second substrate 910. Since the capacitor cell 900 is flipped while the capacitor cell 900 is bonded to the logic cell 800, the second substrate 910 is illustrated in FIG. 13 so that the top surface 910a of the second substrate 910 faces downwardly and the bottom surface 910b of the second substrate 910 faces upwardly.

The lower interconnection pattern 920 may be disposed on the top surface 910a of the second substrate 910 opposite to the first substrate 810. Although not shown in the drawings, an insulation layer may be disposed between the second substrate 910 and the lower interconnection pattern 920. The first and second external circuit patterns 981 and 982 may be disposed on the top surface 960a of the second interlayer insulation layer 960.

A dummy insulation pattern 930 may be disposed on a top surface of the lower interconnection pattern 920 opposite to the second substrate 910. The dummy insulation pattern 930 may have a plurality of contact holes 944 therein. Each of the contact holes 944 may penetrate the dummy insulation pattern 930 to expose the lower interconnection pattern 920. The contact holes 944 may be disposed to be spaced apart from each other in a plan view. In some embodiments, the contact holes 944 may be arrayed to be located at central points and vertices of a plurality of hexagons constituting a honeycomb structure when viewed from a plan view. In some embodiments, the dummy insulation pattern 930 may be comprised of a single oxide layer or a plurality of insulation layers.

A lower electrode pattern 941 of the capacitor 940 may be disposed on the lower interconnection pattern 920 exposed by the contact holes 944 and on sidewalls of the dummy insulation pattern 930 exposed by the contact holes 944. The lower electrode pattern 941 may extend onto a top surface of the dummy insulation pattern 930. The lower electrode pattern 941 may be in direct contact with the lower interconnection pattern 920 in the contact holes 944. Thus, the lower electrode pattern 941 may be electrically connected to the lower interconnection pattern 920.

The lower electrode pattern 941 may be disposed to expose a top surface of a first region R4 corresponding to an edge region of the dummy insulation pattern 930. Accordingly, the lower electrode pattern 941 may be disposed to cover an entire surface of the dummy insulation pattern 930 surrounded by the first region R4. In some embodiment, the lower electrode pattern 941 may include a single metal layer or a metal compound layer such as a tantalum nitride (TaN) layer or a titanium nitride (TiN) layer.

A dielectric pattern 942 of the capacitor 940 may be disposed to cover the lower electrode pattern 941. In the first region R4, the dielectric pattern 942 may cover sidewalls of the lower electrode pattern 941 and may extend onto the exposed top surface of the dummy insulation pattern 930. The dielectric pattern 942 may be disposed to expose edges of the first region R4. In some embodiments, the dielectric pattern 942 may be a high-k dielectric layer such as a silicon nitride (SiN) layer, an aluminum oxide ($Al_2O_3$) layer, a tantalum pentoxide ($Ta_2O_5$) layer, a zirconium oxide ($ZrO_2$) layer or a hafnium oxide ($HfO_2$) layer. Alternatively, the dielectric pattern 942 may be a high-k dielectric layer comprised of a composite layer such as a $ZrO_2/Al_2O_3/ZrO_2$ layer.

An upper electrode pattern 943 of the capacitor 940 may be disposed to cover the dielectric pattern 942 and the top surface of the dummy insulation pattern 930 exposed by the dielectric pattern 942. The upper electrode pattern 943 may be disposed to fill the contact holes 944 and to have a flat top surface. In some embodiments, the upper electrode pattern 943 may include a single metal layer or a metal compound layer such as a tantalum nitride (TaN) layer or a titanium nitride (TiN) layer.

The upper interconnection pattern 950 may be disposed on a top surface of the upper electrode pattern 943 opposite to the dummy insulation pattern 930. The top surface of the upper electrode pattern 943 may be in direct contact with a bottom surface of the upper interconnection pattern 950. Thus, the upper electrode pattern 943 may be electrically connected to the upper interconnection pattern 950. In some embodiment, the upper interconnection pattern 950 may laterally protrude from sidewalls of the upper electrode pattern 943 to have overhangs.

As described with reference to FIGS. 11 and 12, the first external circuit pattern 981 may be electrically connected to the second interconnection pattern 892 of the logic cell 800 through the first through via 971. In addition, the first external circuit pattern 981 may be electrically connected to the lower interconnection pattern 920 through the second through via 972. Accordingly, the P-type drain region 841 of the first P-channel MOS transistor PMOS1 and the N-type drain region 843 of the first N-channel MOS transistor NMOS1 (corresponding to the first connection node "a" of FIG. 1) may be electrically connected to the lower electrode pattern 941 of the capacitor 940.

The second external circuit pattern 982 may be electrically connected to the upper interconnection pattern 950 through the third through via 973. In addition, the second external circuit pattern 982 may be electrically connected to the second interconnection pattern 891 of the logic cell 800 through the fourth through via 974. Accordingly, the P-type drain region 845 of the second P-channel MOS transistor PMOS2 and the N-type drain region 847 of the second N-channel MOS transistor NMOS2 (corresponding to the second connection node "b" of FIG. 1) may be electrically connected to the upper electrode pattern 943 of the capacitor 940.

Figure 14:
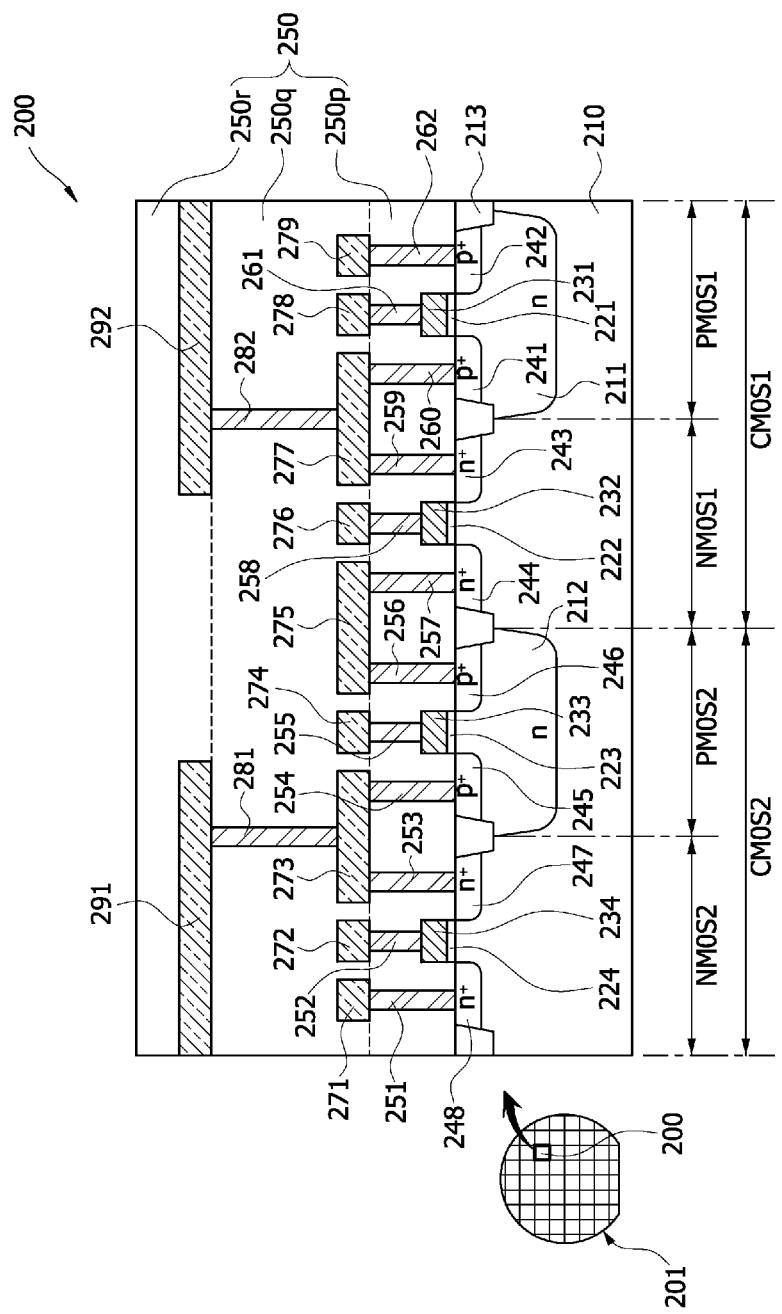
FIGS. 14 to 19 are cross-sectional views illustrating a method of fabricating the switched-capacitor DC-to-DC converter shown in FIG. 2.

FIGS. 14 to 19 are cross-sectional views illustrating a method of fabricating the switched-capacitor DC-to-DC converter 110 shown in FIG. 2. Referring to FIG. 14, a first structure 201 for fabricating the switched-capacitor DC-to-DC converter 110 may be provided. Specifically, the first structure 201 may be provided to include a plurality of logic cells 200, each of which is formed to include a plurality of switching elements such as MOS transistors. In some embodiments, the first structure 201 may be a silicon wafer. The first structure 201 may be formed by integrating the plurality of logic cells 200 in a single wafer. Each of the logic cells 200 may be provided to include a first CMOS device CMOS1 and a second CMOS device CMOS2 which are formed in and on a first substrate 210, a first interlayer insulation layer 250 formed on the first substrate 210 to cover the first and second CMOS devices CMOS1 and CMOS2, and interconnection patterns 271~279, 291 and 292 formed in the first interlayer insulation layer 250.

Each of the logic cells 200 may be formed using a CMOS process technology. Specifically, a first N-type well region 211 and a second N-type well region 212 may be formed in an upper region of the first substrate 210 having P-type conductivity. A trench isolation layer 213 may be formed in an upper region of the first substrate 210 to define active regions. First to fourth gate stacks may be formed on the first substrate 210.

The first gate stack may be formed to include a first gate insulation layer pattern 221 and a first gate conductive layer pattern 231 which are sequentially stacked. The second gate stack may be formed to include a second gate insulation layer pattern 222 and a second gate conductive layer pattern 232 which are sequentially stacked. The third gate stack may be formed to include a third gate insulation layer pattern 223 and a third gate conductive layer pattern 233 which are sequentially stacked. The fourth gate stack may be formed to include a fourth gate insulation layer pattern 224 and a fourth gate conductive layer pattern 234 which are sequentially stacked.

The first gate insulation layer pattern 221 and the first gate conductive layer pattern 231 may correspond to the gate terminal (G1 of FIG. 1) of the first P-channel MOS transistor PMOS1 constituting the first CMOS device CMOS1. The second gate insulation layer pattern 222 and the second gate conductive layer pattern 232 may correspond to the gate terminal (G2 of FIG. 1) of the first N-channel MOS transistor NMOS1 constituting the first CMOS device CMOS1. The third gate insulation layer pattern 223 and the third gate conductive layer pattern 233 may correspond to the gate terminal (G3 of FIG. 1) of the second P-channel MOS transistor PMOS2 constituting the second CMOS device CMOS2. The fourth gate insulation layer pattern 224 and the fourth gate conductive layer pattern 234 may correspond to the gate terminal (G4 of FIG. 1) of the second N-channel MOS transistor NMOS2 constituting the second CMOS device CMOS2.

P-type impurity ions may be implanted into upper regions of the first and second N-type well regions 211 and 212 using the first and third gate stacks and the trench isolation layer 213 as implantation masks, thereby forming P-type drain regions 241 and 245 and P-type source regions 242 and 246. N-type impurity ions may be implanted into an upper region of the first substrate 210 using the second and fourth gate stacks and the trench isolation layer 213 as implantation masks, thereby forming N-type drain regions 243 and 247 and N-type source regions 244 and 248.

The P-type drain region 241 and the P-type source region 242 may correspond to the drain terminal (D1 of FIG. 1) and the source terminal (S1 of FIG. 1) of the first P-channel MOS transistor PMOS1 constituting the first CMOS device CMOS1, respectively. The P-type drain region 245 and the P-type source region 246 may correspond to the drain terminal (D3 of FIG. 1) and the source terminal (S3 of FIG. 1) of the second P-channel MOS transistor PMOS2 constituting the second CMOS device CMOS2, respectively.

The N-type drain region 243 and the N-type source region 244 may correspond to the drain terminal (D2 of FIG. 1) and the source terminal (S2 of FIG. 1) of the first N-channel MOS transistor NMOS1 constituting the first CMOS device CMOS1, respectively. The N-type drain region 247 and the N-type source region 248 may correspond to the drain terminal (D4 of FIG. 1) and the source terminal (S4 of FIG. 1) of the second N-channel MOS transistor NMOS2 constituting the second CMOS device CMOS2, respectively.

A first insulation layer 250$p$ may be formed on the first substrate 210 including the P-type drain regions 241 and 245 and the P-type source regions 242 and 246 as well as the N-type drain regions 243 and 247 and the N-type source regions 244 and 248. A plurality of vias 251~262 penetrating the first insulation layer 250p may be formed. First interconnection patterns 271~279 may be formed on the first insulation layer 250p.

The first interconnection pattern 271 may be formed to be electrically connected to the N-type source region 248 of the second N-channel MOS transistor NMOS2 through the via 251. The first interconnection pattern 273 may be formed to be electrically connected to the N-type drain region 247 of the second N-channel MOS transistor NMOS2 and the P-type drain region 245 of the second P-channel MOS transistor PMOS2 through the vias 253 and 254. The first interconnection pattern 275 may be formed to be electrically connected to the P-type source region 246 of the second P-channel MOS transistor PMOS2 and the N-type source region 244 of the first N-channel MOS transistor NMOS1 through the vias 256 and 257.

The first interconnection pattern 277 may be formed to be electrically connected to the N-type drain region 243 of the first N-channel MOS transistor NMOS1 and the P-type drain region 241 of the first P-channel MOS transistor PMOS1 through the vias 259 and 260. The first interconnection pattern 279 may be formed to be electrically connected to the P-type source region 242 of the first P-channel MOS transistor PMOS1 through the via 262. The first interconnection patterns 272, 274, 276 and 278 may be formed to be electrically connected to the fourth, third, second and first gate conductive layer patterns 234, 233, 232 and 231 through the vias 252, 255, 258 and 261, respectively.

A second insulation layer 250q may be formed on the first insulation layer 250p and the first interconnection patterns 271~279. A plurality of vias 281 and 282 penetrating the second insulation layer 250q may be formed. Second interconnection patterns 291 and 292 may be formed on the second insulation layer 250q.

The second interconnection pattern 291 may be formed to be electrically connected to the first interconnection pattern 273 through the via 281. The second interconnection pattern 292 may be formed to be electrically connected to the first interconnection pattern 277 through the via 282.

Other vias and other second interconnection patterns connected to the remaining first interconnection patterns 271, 272, 274~276, 278 and 279 are not illustrated in FIG. 14 in order to avoid the complexity of the drawing. A third insulation layer 250r may be formed on the second insulation layer 250q and the second interconnection patterns 291 and 292. In some embodiments, the first, second and third insulation layers 250p, 250q and 250r may be formed of the same insulation layer, for example, an oxide layer. The first, second and third insulation layers 250p, 250q and 250r may constitute the first interlayer insulation layer 250 of the logic cell 200.

Figure 15:
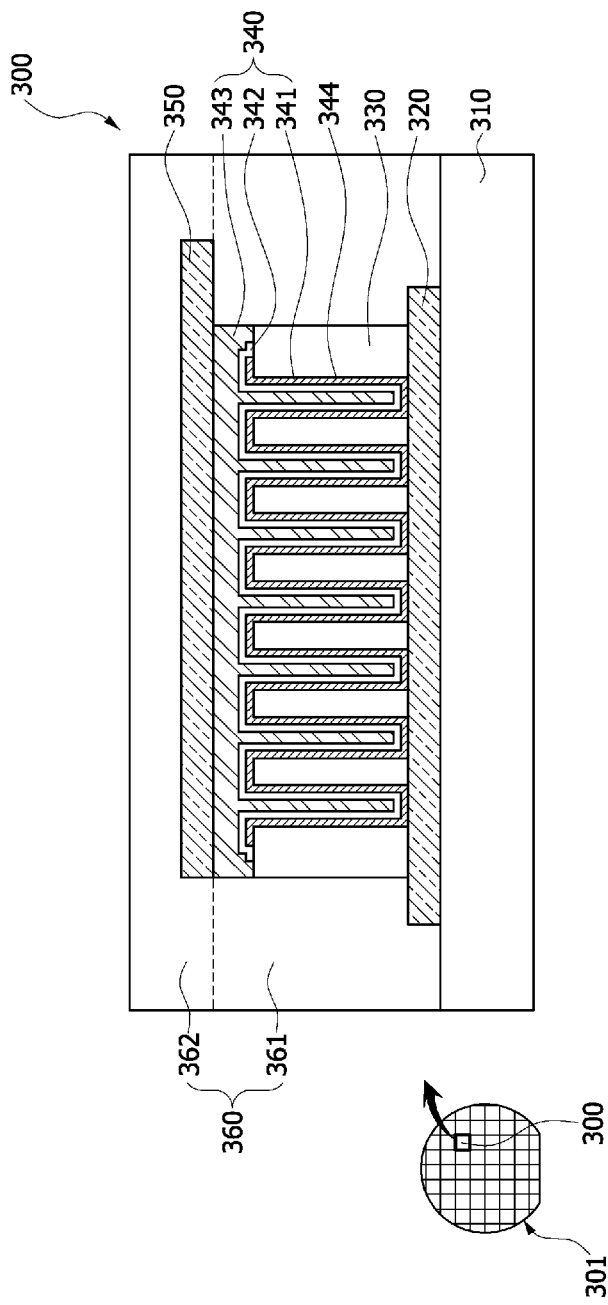
Figure 16:
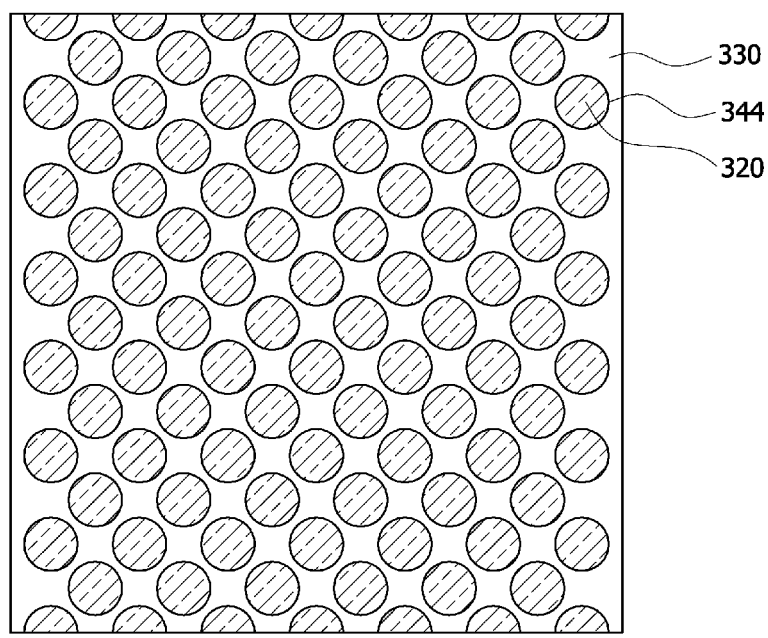

Referring to FIG. 15, a second structure 301 for fabricating the switched-capacitor DC-to-DC converter 110 may be provided. The second structure 301 may be provided to include a plurality of capacitors. In some embodiments, the second structure 301 may be a silicon wafer. The second structure 301 may be provided to include a plurality of capacitor cells 300.

Each of the capacitor cells 300 may be provided to include a capacitor 340 formed on a second substrate 310, a second interlayer insulation layer 360 formed on the second substrate 310 to cover the capacitor 340, and a lower interconnection pattern 320 and an upper interconnection pattern 350 formed in the second interlayer insulation layer 360. In order to form the capacitor 340, the lower interconnection pattern 320 may be formed on the second substrate 310.

A dummy insulation pattern 330 may be formed on the lower interconnection pattern 320. In some embodiments, the dummy insulation pattern 330 may be formed of a single oxide layer or a plurality of insulation layers. The dummy insulation pattern 330 may be formed to have a plurality of contact holes 344 therein. The contact holes 344 may penetrate the dummy insulation pattern 330 to expose the lower interconnection pattern 320. As illustrated in a plan view of FIG. 16, the contact holes 344 may be arrayed to be located at central points and vertices of a plurality of hexagons constituting a honeycomb structure.

Referring again to FIG. 15, a lower electrode pattern 341 may be formed on portions of the lower interconnection pattern 320 exposed by the contact holes 344, sidewalls of the dummy insulation pattern 330 exposed by the contact holes 344, and a top surface of the dummy insulation pattern 330. In some embodiments, the lower electrode pattern 341 may be formed of a single metal layer or a metal compound layer such as a tantalum nitride (TaN) layer or a titanium nitride (TiN) layer. The lower electrode pattern 341 may be formed to expose edges of the top surface of the dummy insulation pattern 330. The exposed edges of the dummy insulation pattern 330 may have a certain width along a perimeter of the dummy insulation pattern 330.

A dielectric pattern 342 may be formed on the lower electrode pattern 341. In some embodiments, the dielectric pattern 342 may be formed of a high-k dielectric layer such as a silicon nitride (SiN) layer, an aluminum oxide ($Al_2O_3$) layer, a tantalum pentoxide ($Ta_2O_5$) layer, a zirconium oxide ($ZrO_2$) layer or a hafnium oxide ($HfO_2$) layer. Alternatively, the dielectric pattern 342 may be formed of a high-k dielectric layer comprised of a composite layer such as a $ZrO_2/Al_2O_3/ZrO_2$ layer.

An upper electrode pattern 343 may be formed on the dielectric pattern 342. The upper electrode pattern 343 may be formed to fill the contact holes 344. In some embodiments, the upper electrode pattern 343 may be formed of a single metal layer or a metal compound layer such as a tantalum nitride (TaN) layer or a titanium nitride (TiN) layer.

The lower electrode pattern 341, the dielectric pattern 342 and the upper electrode pattern 343 may constitute the capacitor 340. Each of the lower electrode pattern 341, the dielectric pattern 342 and the upper electrode pattern 343 may be formed to overlap with the top surface of the dummy insulation pattern 330, the sidewalls of the contact holes 344, and bottom surfaces of the contact holes 344. Thus, a capacitance value of the capacitor 340 may increase.

A first insulation layer 361 may be formed on the second substrate 310 and the lower interconnection pattern 320. The upper interconnection pattern 350 may be formed on the first insulation layer 361 and the upper electrode pattern 343. A bottom surface of the upper interconnection pattern 350 may be in direct contact with a top surface of the upper electrode pattern 343. A second insulation layer 362 may be formed on the first insulation layer 361 and the upper interconnection pattern 350. In some embodiments, the first and second insulation layers 361 and 362 may be formed of the same insulation layer, for example, an oxide layer. The first and second insulation layers 361 and 362 may constitute a second interlayer insulation layer 360 of the capacitor cell 300.

Figure 17:
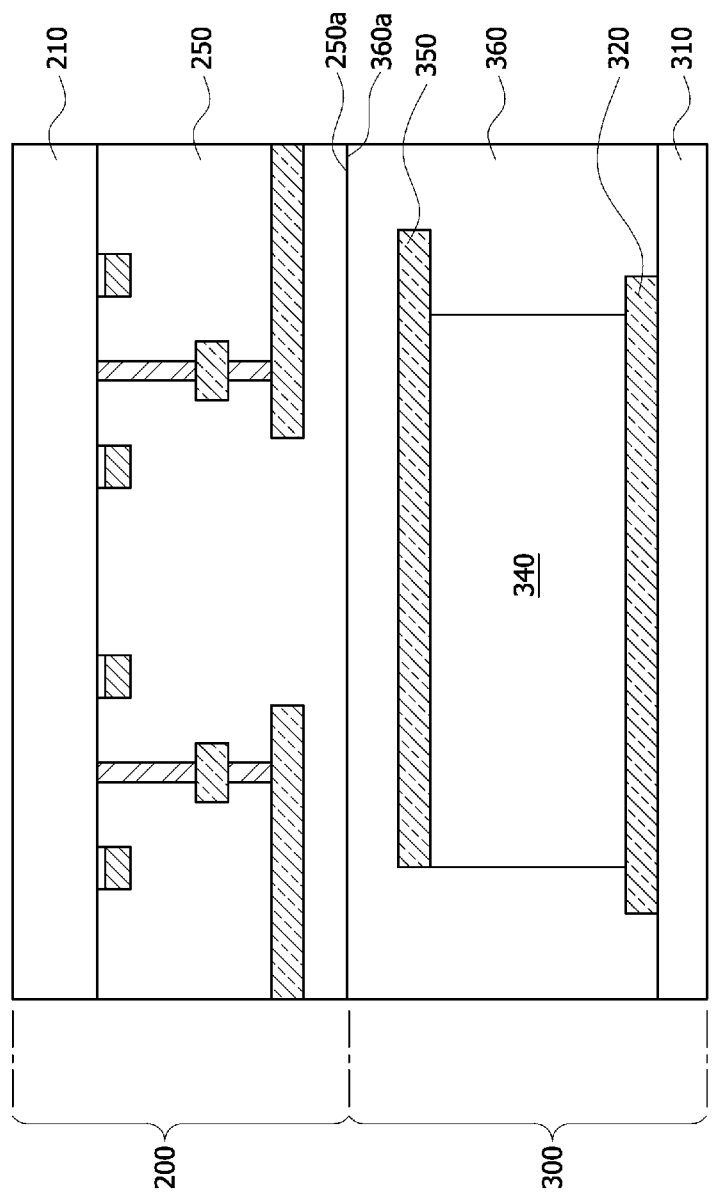

Referring to FIG. 17, the first structure (201 of FIG. 14) and the second structure (301 of FIG. 15) may be bonded to each other so that the logic cells 200 of the first structure 201 are bonded to the capacitor cells 300 of the second structure 301 respectively. The first and second structures 201 and 301 may be bonded to each other in units of wafers. The first and second structures 201 and 301 may be bonded to each other so that a top surface 250a of the first interlayer insulation layer 250 constituting each logic cell 200 is attached to a top surface 360a of the second interlayer insulation layer 360 constituting each capacitor cell 300.

In order to bond the logic cells 200 to the capacitor cells 300, the first structure 201 including the logic cells 200 may be located over the second structure 301 including the capacitor cells 300 so that the top surfaces 250a of the first interlayer insulation layers 250 face the top surfaces 360a of the second interlayer insulation layers 360. In such a case, the logic cells 200 may be flipped upside-down. That is, the first substrate 210 of each logic cell 200 may be upwardly located.

Before the logic cells 200 are bonded to the capacitor cells 300, a cleaning process and a surface activation process using plasma may be applied to the top surfaces 250a of the first interlayer insulation layers 250 and the top surfaces 360a of the second interlayer insulation layers 360. After the cleaning process and the surface activation process are performed, the first structure 201 may be pressed down toward the second structure 301 at a certain temperature to bond the logic cells 200 to the capacitor cells 300 respectively.

Figure 18:
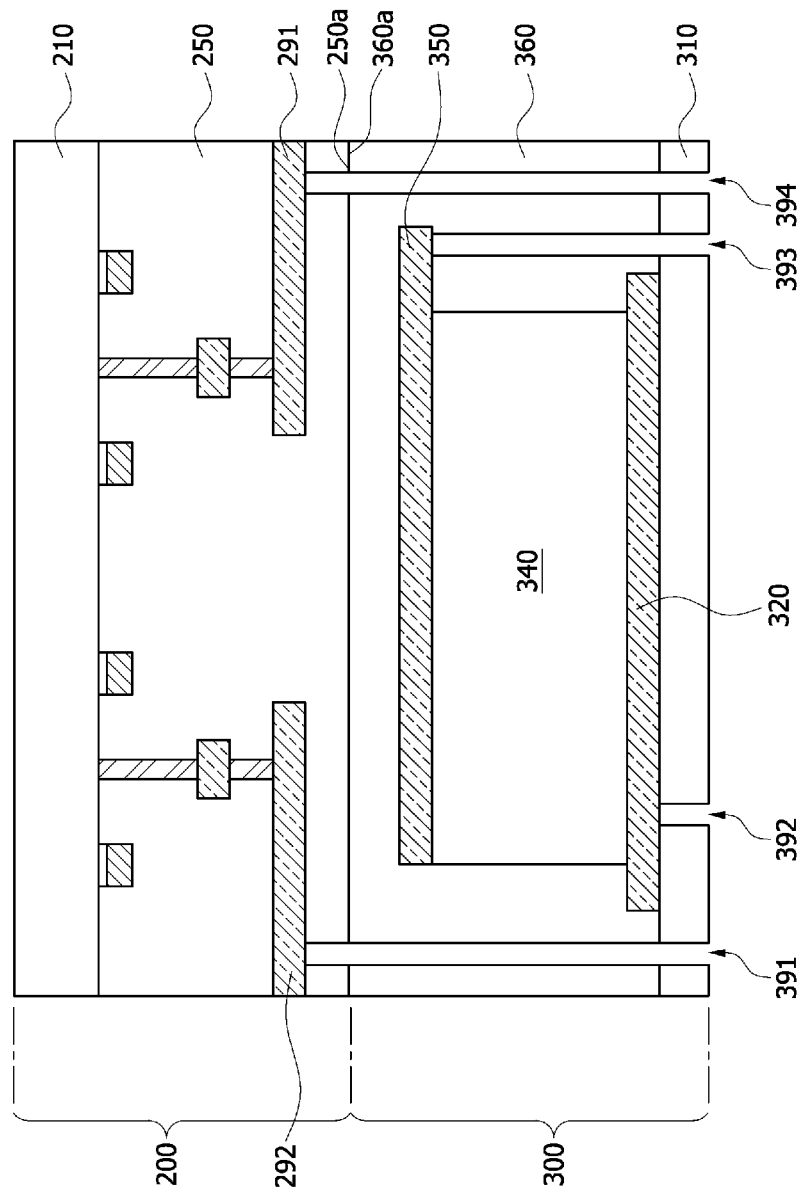

Referring to FIG. 18, the second substrates 310 of the capacitor cells 300 may be grinded to reduce a thickness of the second substrates 310. The second substrates 310 of the capacitor cells 300 may be grinded using a general wafer grinding process. Subsequently, first to fourth through via holes 391, 392, 393 and 394 may be formed in each cell which is comprised of a single logic cell 200 and a single capacitor cell 300 bonded to the single logic cell 200.

The first through via hole 391 may penetrate the second substrate 310 (i.e., the ground second substrate 310) and the second interlayer insulation layer 360 and may extend into the first interlayer insulation layer 250 to expose a portion of the second interconnection pattern 292 of the logic cell 200. The second through via hole 392 may penetrate the second substrate 310 to expose a portion of the lower interconnection pattern 320 of the capacitor cell 300. The third through via hole 393 may penetrate the second substrate 310 and may extend into the second interlayer insulation layer 360 to expose a portion of the upper interconnection pattern 350 of the capacitor cell 300. The fourth through via hole 394 may penetrate the second substrate 310 and the second interlayer insulation layer 360 and may extend into the first interlayer insulation layer 250 to expose a portion of the second interconnection pattern 291 of the logic cell 200. In some embodiments, the first to fourth through via holes 391, 392, 393 and 394 may be formed using a laser beam. Although not shown in the drawings, an insulation layer and a metal seed layer may be sequentially formed on sidewalls of the first to fourth through via holes 391, 392, 393 and 394.

Figure 19:
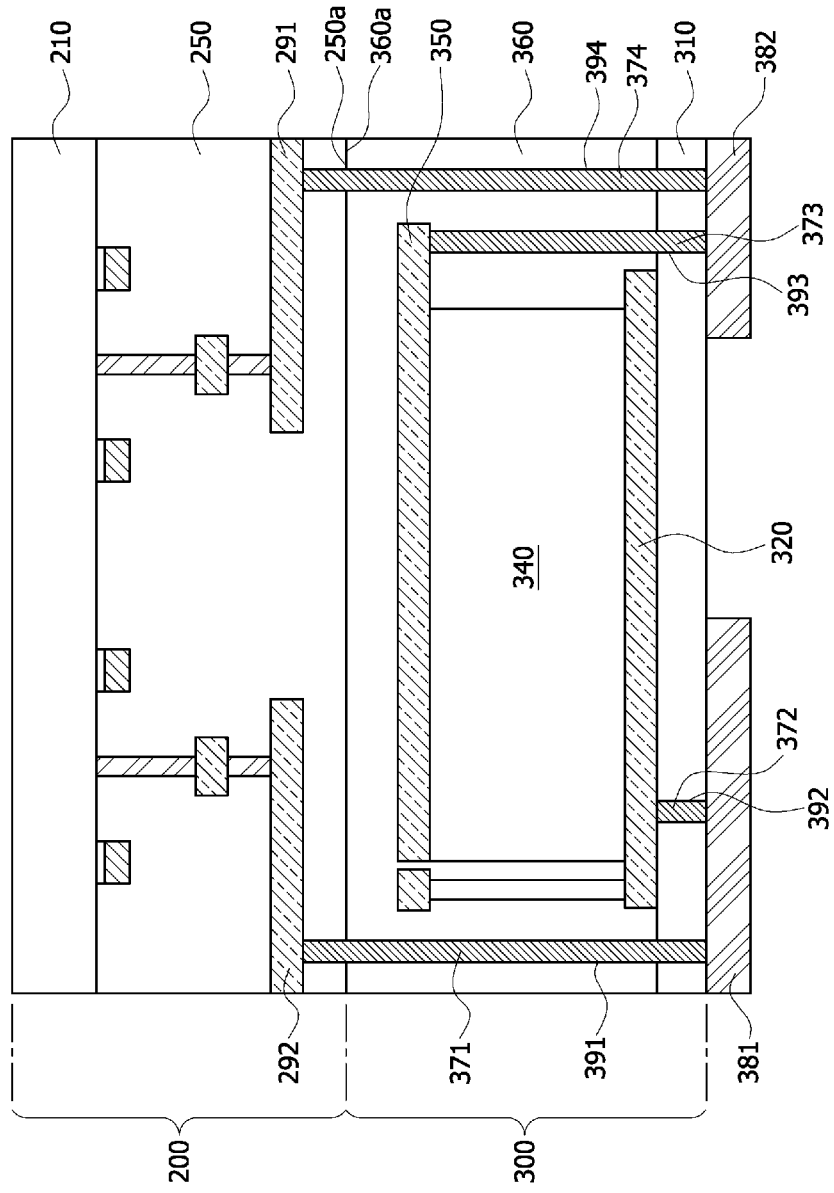

Referring to FIG. 19, the first to fourth through via holes 391, 392, 393 and 394 may be filled with a conductive layer such as a metal layer to respectively form first to fourth through vias 371, 372, 373 and 374 in the first to fourth through via holes 391, 392, 393 and 394. The first to fourth through vias 371, 372, 373 and 374 may be formed using an electroplating process that employs the metal seed layer as a seed layer.

One end of the first through via 371 may be coupled to the second interconnection pattern 292 of the logic cell 200, and one end of the second through via 372 may be coupled to the lower interconnection pattern 320 of the capacitor cell 300. In addition, the third through via 373 may be coupled to the upper interconnection pattern 350 of the capacitor cell 300, and the fourth through via 374 may be coupled to the second interconnection pattern 291 of the logic cell 200.

A first external circuit pattern 381 and a second external circuit pattern 382 may be formed on a bottom surface of the second substrate 310 opposite to the second interlayer insulation layer 360. The first external circuit pattern 381 may be formed to be electrically connected to the first and second through vias 371 and 372. The second external circuit pattern 382 may be formed to be electrically connected to the third and fourth through vias 373 and 374.

Figure 20:
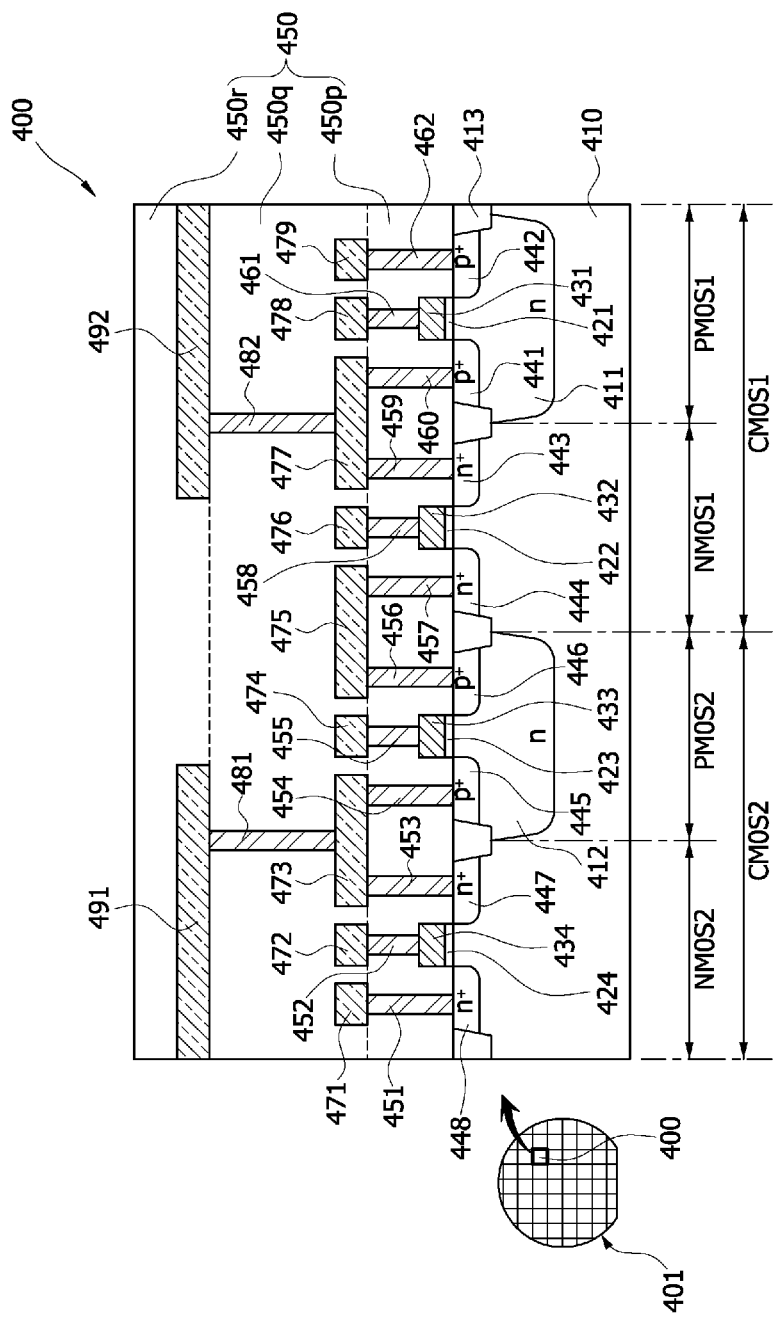
FIGS. 20 to 24 are cross-sectional views illustrating a method of fabricating the switched-capacitor DC-to-DC converter shown in FIG. 5.

FIGS. 20 to 24 are cross-sectional views illustrating a method of fabricating the switched-capacitor DC-to-DC converter 120 shown in FIG. 5. Referring to FIG. 20, a first structure 401 for fabricating the switched-capacitor DC-to-DC converter 120 may be provided. Specifically, the first structure 401 may be provided to include a plurality of logic cells 400, each of which is formed to include a plurality of switching elements such as MOS transistors. In some embodiments, the first structure 401 may be a silicon wafer.

The first structure 401 may be formed by integrating the plurality of logic cells 400 in a single wafer. Each of the logic cells 400 may be provided to include a first CMOS device CMOS1 and a second CMOS device CMOS2 which are formed in and on a first substrate 410, a first interlayer insulation layer 450 formed on the first substrate 410 to cover the first and second CMOS devices CMOS1 and CMOS2, interconnection patterns 471~479, 491 and 492 formed in the first interlayer insulation layer 450.

Each of the logic cells 400 may be formed using a CMOS process technology. Specifically, a first N-type well region 411 and a second N-type well region 412 may be formed in an upper region of the first substrate 410 having a P-type conductivity. A trench isolation layer 413 may be formed in an upper region of the first substrate 410 to define active regions.

First to fourth gate stacks may be formed on the first substrate 410. The first gate stack may be formed to include a first gate insulation layer pattern 421 and a first gate conductive layer pattern 431 which are sequentially stacked. The second gate stack may be formed to include a second gate insulation layer pattern 422 and a second gate conductive layer pattern 432 which are sequentially stacked. The third gate stack may be formed to include a third gate insulation layer pattern 423 and a third gate conductive layer pattern 433 which are sequentially stacked. The fourth gate stack may be formed to include a fourth gate insulation layer pattern 424 and a fourth gate conductive layer pattern 434 which are sequentially stacked.

P-type impurity ions may be implanted into upper regions of the first and second N-type well regions 411 and 412 using the first and third gate stacks and the trench isolation layer 413 as implantation masks, thereby forming P-type drain regions 441 and 445 and P-type source regions 442 and 446. N-type impurity ions may be implanted into an upper region of the first substrate 410 using the second and fourth gate stacks and the trench isolation layer 413 as implantation masks, thereby forming N-type drain regions 443 and 447 and N-type source regions 444 and 448.

A first insulation layer 450p may be formed on the first substrate 410 including the P-type drain regions 441 and 445 and the P-type source regions 442 and 446 as well as the N-type drain regions 443 and 447 and the N-type source regions 444 and 448. A plurality of vias 451~462 penetrating the first insulation layer 450p may be formed.

First interconnection patterns 471~479 may be formed on the first insulation layer 450p. The first interconnection pattern 471 may be formed to be electrically connected to the N-type source region 448 of the second N-channel MOS transistor NMOS2 through the via 451. The first interconnection pattern 473 may be formed to be electrically connected to the N-type drain region 447 of the second N-channel MOS transistor NMOS2 and the P-type drain region 445 of the second P-channel MOS transistor PMOS2 through the vias 453 and 454. The first interconnection pattern 475 may be formed to be electrically connected to the P-type source region 446 of the second P-channel MOS transistor PMOS2 and the N-type source region 444 of the first N-channel MOS transistor NMOS1 through the vias 456 and 457.

The first interconnection pattern 477 may be formed to be electrically connected to the N-type drain region 443 of the first N-channel MOS transistor NMOS1 and the P-type drain region 441 of the first P-channel MOS transistor PMOS1 through the vias 459 and 460. The first interconnection pattern 479 may be formed to be electrically connected to the P-type source region 442 of the first P-channel MOS transistor PMOS1 through the via 462. The first interconnection patterns 472, 474, 476 and 478 may be formed to be electrically connected to the fourth, third, second and first gate conductive layer patterns 434, 433, 432 and 431 through the vias 452, 455, 458 and 461, respectively.

A second insulation layer 450$q$ may be formed on the first insulation layer 450$p$ and the first interconnection patterns 471~479. A plurality of vias 481 and 482 penetrating the second insulation layer 450$q$ may be formed.

Second interconnection patterns 491 and 492 may be formed on the second insulation layer 450$q$. The second interconnection pattern 491 may be formed to be electrically connected to the first interconnection pattern 473 through the via 481. The second interconnection pattern 492 may be formed to be electrically connected to the first interconnection pattern 477 through the via 482.

A third insulation layer 450$r$ may be formed on the second insulation layer 450$q$ and the second interconnection patterns 491 and 492. In some embodiments, the first, second and third insulation layers 450$p$, 450$q$ and 450$r$ may be formed of the same insulation layer, for example, an oxide layer. The first, second and third insulation layers 450$p$, 450$q$ and 450$r$ may constitute the first interlayer insulation layer 450 of the logic cell 400.

Figure 21:
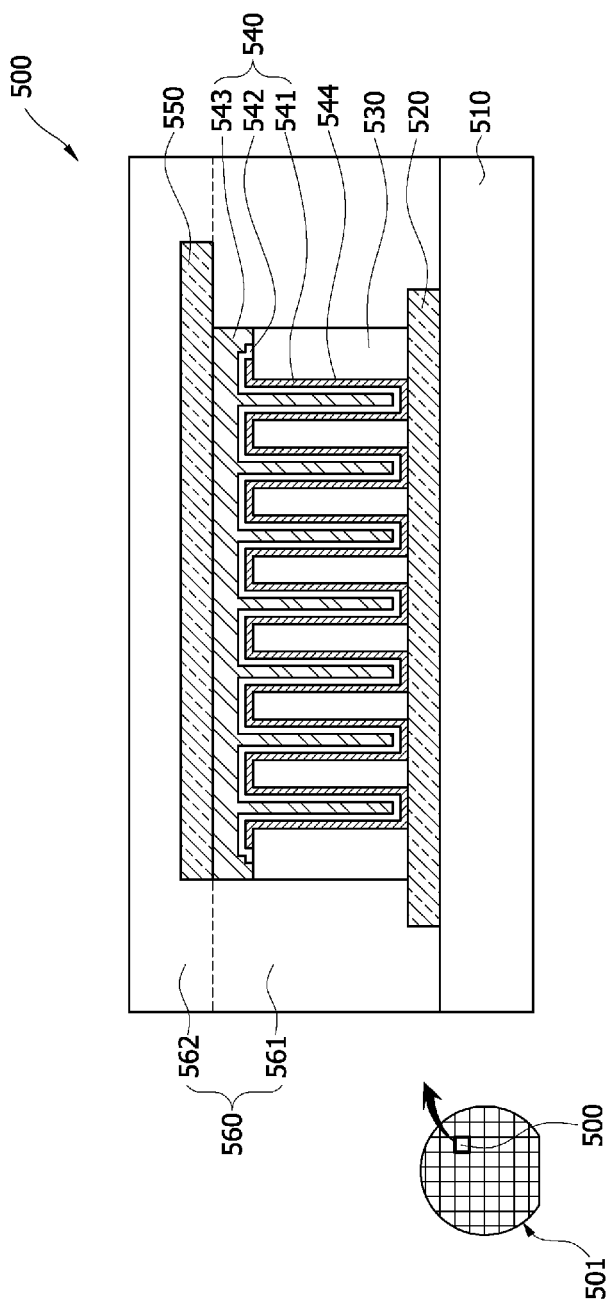

Referring to FIG. 21, a second structure 501 for fabricating the switched-capacitor DC-to-DC converter 120 may be provided. The second structure 501 may be provided to include a plurality of capacitors. In some embodiments, the second structure 501 may be a silicon wafer. The second structure 501 may be provided to include a plurality of capacitor cells 500. Each of the capacitor cells 500 may be provided to include a capacitor 540 formed on a second substrate 510, a second interlayer insulation layer 560 formed on the second substrate 510 to cover the capacitor 540, and a lower interconnection pattern 520 and an upper interconnection pattern 550 formed in the second interlayer insulation layer 560. In order to form the capacitor 540, the lower interconnection pattern 520 may be formed on the second substrate 510.

A dummy insulation pattern 530 may be formed on the lower interconnection pattern 520. In some embodiments, the dummy insulation pattern 530 may be formed of a single oxide layer or a plurality of insulation layers. The dummy insulation pattern 530 may be formed to have a plurality of contact holes 544 therein. The dummy insulation pattern 530 having the contact holes 544 may have the same planar structure as described with reference to FIG. 16.

A lower electrode pattern 541 may be formed on portions of the lower interconnection pattern 520 exposed by the contact holes 544, sidewalls of the dummy insulation pattern 530 exposed by the contact holes 544, and a top surface of the dummy insulation pattern 530. The lower electrode pattern 541 may be formed to expose edges of the top surface of the dummy insulation pattern 530.

A dielectric pattern 542 may be formed on the lower electrode pattern 541. An upper electrode pattern 543 may be formed on the dielectric pattern 542. The upper electrode pattern 543 may be formed to fill the contact holes 544. The lower electrode pattern 541, the dielectric pattern 542 and the upper electrode pattern 543 may constitute the capacitor 540.

A first insulation layer 561 may be formed on the second substrate 510 and the lower interconnection pattern 520. The upper interconnection pattern 550 may be formed on the first insulation layer 561 and the upper electrode pattern 543. A bottom surface of the upper interconnection pattern 550 may be in direct contact with a top surface of the upper electrode pattern 543. A second insulation layer 562 may be formed on the first insulation layer 561 and the upper interconnection pattern 550. The first and second insulation layers 561 and 562 may constitute a second interlayer insulation layer 560 of the capacitor cell 500.

Figure 22:
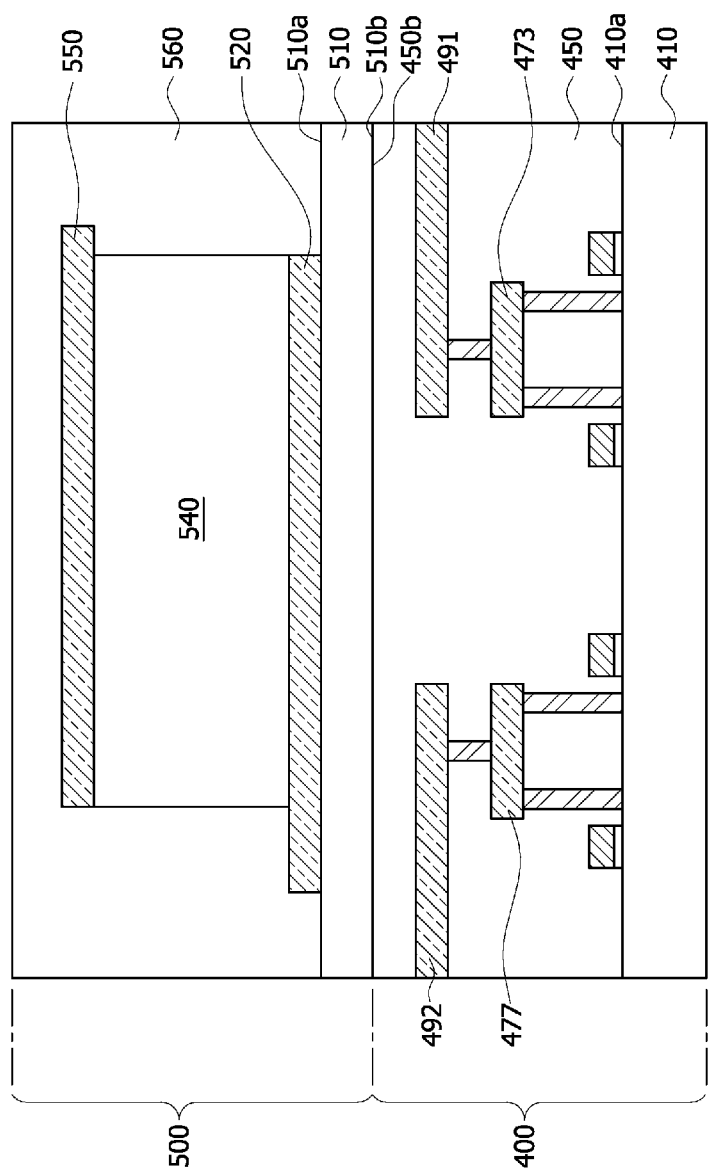

Referring to FIG. 22, the first structure (401 of FIG. 20) and the second structure (501 of FIG. 21) may be bonded to each other so that the logic cells 400 of the first structure 401 are bonded to the capacitor cells 500 of the second structure 501 respectively. The first and second structures 401 and 501 may be bonded to each other in units of wafers. The first and second structures 401 and 501 may be bonded to each other so that a top surface 450$b$ of the first interlayer insulation layer 450 opposite to the first substrate 410 is attached to a bottom surface 510$b$ of the second substrate 510 opposite to the second interlayer insulation layer 560.

In order to bond the logic cells 400 to the capacitor cells 500, the second structure 501 including the capacitor cells 500 may be located over the first structure 401 including the logic cells 400 so that the bottom surfaces 510$b$ of the second substrates 510 face the top surfaces 450$b$ of the first interlayer insulation layers 450. That is, the first and second structures 401 and 501 may be disposed so that the first substrates 410 of the logic cells 400 and the second substrates 510 of the capacitor cells 500 face downwardly.

Before the logic cells 400 are bonded to the capacitor cells 500, a cleaning process and a surface activation process using plasma may be applied to the top surfaces 450$b$ of the first interlayer insulation layers 450 and the bottom surfaces 510$b$ of the second substrates 510. After the cleaning process and the surface activation process are performed, the second structure 501 may be pressed down toward the first structure 401 at a certain temperature to bond the logic cells 400 to the capacitor cells 500 respectively. Before the logic cells 400 are bonded to the capacitor cells 500, the second substrates 510 of the capacitor cells 500 may be grinded to reduce a thickness of the second substrates 510. The second substrates 510 of the capacitor cells 500 may be grinded using a general wafer grinding process.

Figure 23:
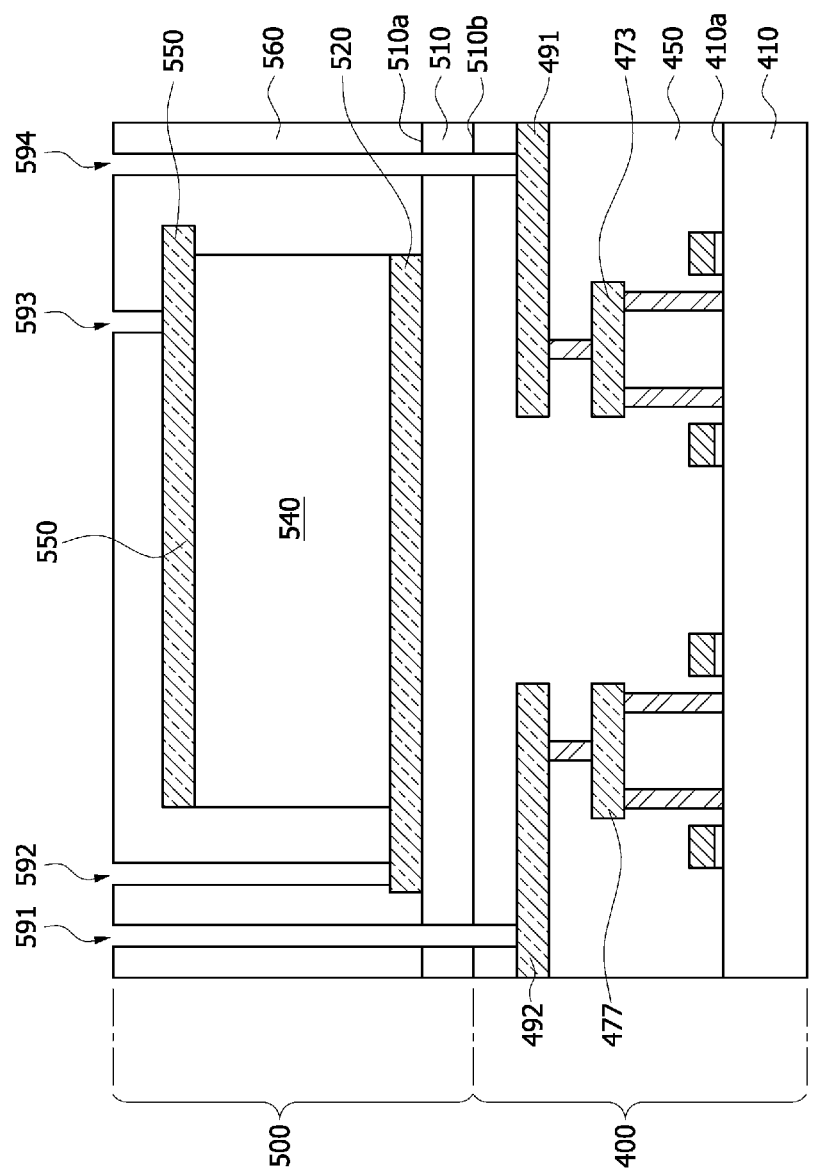

Referring to FIG. 23, first to fourth through via holes 591, 592, 593 and 594 may be formed in each cell which is comprised of a single logic cell 400 and a single capacitor cell 500 bonded to the single logic cell 400. The first through via hole 591 may penetrate the second interlayer insulation layer 560 and the second substrate 510 and may extend into the first interlayer insulation layer 450 to expose a portion of the second interconnection pattern 492 of the logic cell 400.

The second through via hole 592 may be formed in the second interlayer insulation layer 560 to expose a portion of the lower interconnection pattern 520 of the capacitor cell 500. The third through via hole 593 may be formed in the second interlayer insulation layer 560 to expose a portion of the upper interconnection pattern 550 of the capacitor cell 500. The fourth through via hole 594 may penetrate the second interlayer insulation layer 560 and the second substrate 510 and may extend into the first interlayer insulation layer 450 to expose a portion of the second interconnection pattern 491 of the logic cell 400. In some embodiments, the first to fourth through via holes 591, 592, 593 and 594 may be formed using a laser beam. Although not shown in the drawings, an insulation layer and a metal seed layer may be sequentially formed on sidewalls of the first to fourth through via holes 591, 592, 593 and 594.

Figure 24:
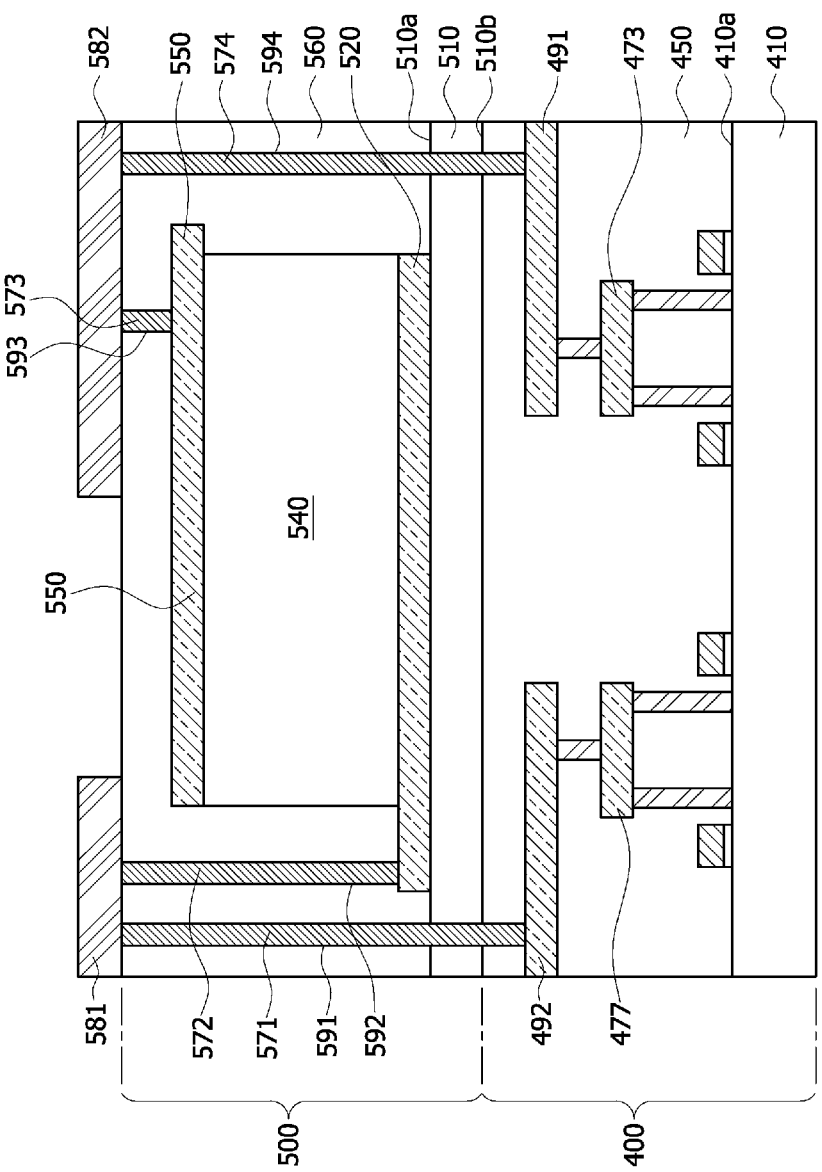

Referring to FIG. 24, the first to fourth through via holes 591, 592, 593 and 594 may be filled with a conductive layer such as a metal layer to respectively form first to fourth through vias 571, 572, 573 and 574 in the first to fourth through via holes 591, 592, 593 and 594. The first to fourth through vias 571, 572, 573 and 574 may be formed using an electroplating process that employs the metal seed layer as a seed layer.

One end of the first through via 571 may be coupled to the second interconnection pattern 492 of the logic cell 400, and one end of the second through via 572 may be coupled to the lower interconnection pattern 520 of the capacitor cell 500. In addition, the third through via 573 may be coupled to the upper interconnection pattern 550 of the capacitor cell 500, and the fourth through via 574 may be coupled to the second interconnection pattern 491 of the logic cell 400.

A first external circuit pattern 581 and a second external circuit pattern 582 may be formed on the second interlayer insulation layer 560. The first external circuit pattern 581 may be formed to be electrically connected to the first and second through vias 571 and 572. The second external circuit pattern 582 may be formed to be electrically connected to the third and fourth through vias 573 and 574.

Figure 25:
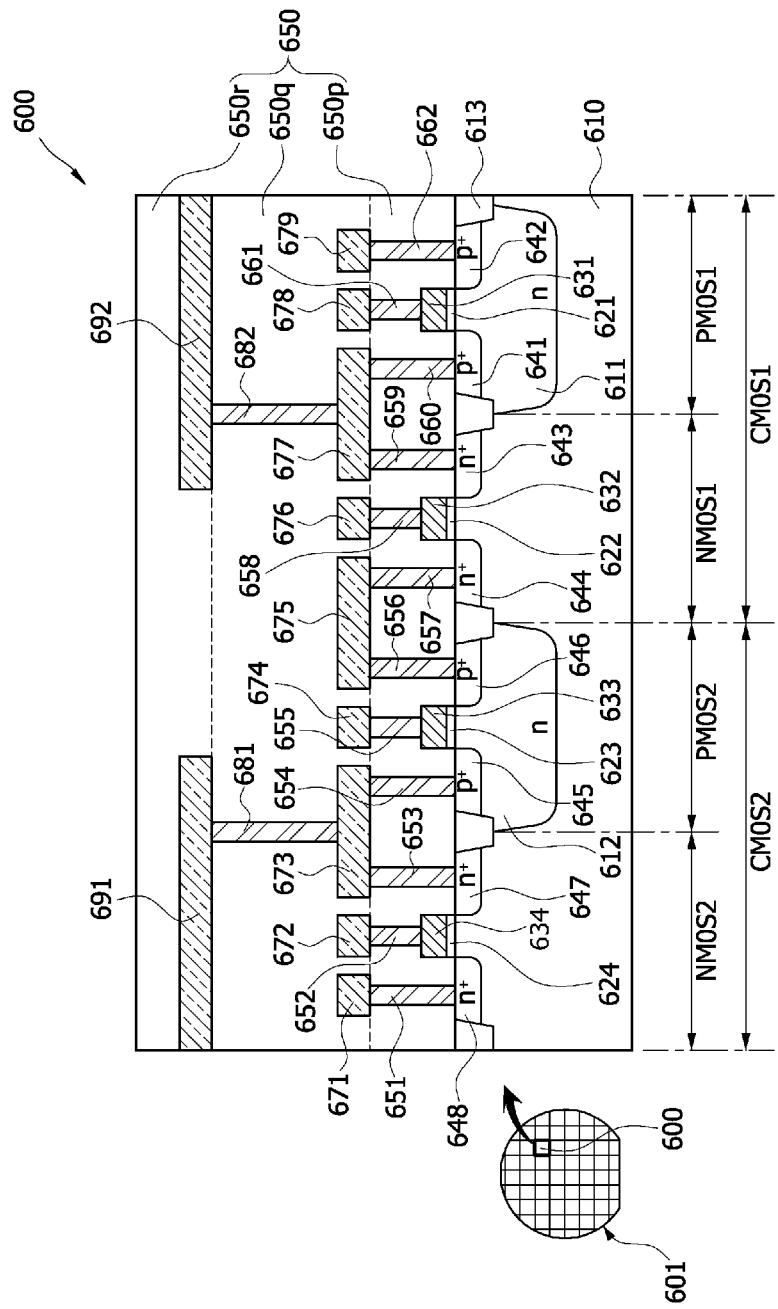
FIGS. 25 to 29 are cross-sectional views illustrating a method of fabricating the switched-capacitor DC-to-DC converter shown in FIG. 8.

FIGS. 25 to 29 are cross-sectional views illustrating a method of fabricating the switched-capacitor DC-to-DC converter 130 shown in FIG. 8. Referring to FIG. 25, a first structure 601 for fabricating the switched-capacitor DC-to-DC converter 130 may be provided. Specifically, the first structure 601 may be provided to include a plurality of logic cells 600, each of which is formed to include a plurality of switching elements such as MOS transistors. In some embodiments, the first structure 601 may be a silicon wafer.

The first structure 601 may be formed by integrating the plurality of logic cells 600 in a single wafer. Each of the logic cells 600 may be provided to include a first CMOS device CMOS1 and a second CMOS device CMOS2 which are formed in and on a first substrate 610, a first interlayer insulation layer 650 formed on the first substrate 610 to cover the first and second CMOS devices CMOS1 and CMOS2, and interconnection patterns 671~679, 691 and 692 formed in the first interlayer insulation layer 650.

Each of the logic cells 600 may be formed using a CMOS process technology. Specifically, a first N-type well region 611 and a second N-type well region 612 may be formed in an upper region of the first substrate 610 having a P-type conductivity. A trench isolation layer 613 may be formed in an upper region of the first substrate 610 to define active regions.

First to fourth gate stacks may be formed on the first substrate 610. The first gate stack may be formed to include a first gate insulation layer pattern 621 and a first gate conductive layer pattern 631 which are sequentially stacked. The second gate stack may be formed to include a second gate insulation layer pattern 622 and a second gate conductive layer pattern 632 which are sequentially stacked. The third gate stack may be formed to include a third gate insulation layer pattern 623 and a third gate conductive layer pattern 633 which are sequentially stacked. The fourth gate stack may be formed to include a fourth gate insulation layer pattern 624 and a fourth gate conductive layer pattern 634 which are sequentially stacked.

P-type impurity ions may be implanted into upper regions of the first and second N-type well regions 611 and 612 using the first and third gate stacks and the trench isolation layer 613 as implantation masks, thereby forming P-type drain regions 641 and 645 and P-type source regions 642 and 646. N-type impurity ions may be implanted into an upper region of the first substrate 610 using the second and fourth gate stacks and the trench isolation layer 613 as implantation masks, thereby forming N-type drain regions 643 and 647 and N-type source regions 644 and 648.

A first insulation layer 650$p$ may be formed on the first substrate 610 including the P-type drain regions 641 and 645 and the P-type source regions 642 and 646 as well as the N-type drain regions 643 and 647 and the N-type source regions 644 and 648. A plurality of vias 651~662 penetrating the first insulation layer 650$p$ may be formed.

First interconnection patterns 671~679 may be formed on the first insulation layer 650$p$. The first interconnection pattern 671 may be formed to be electrically connected to the N-type source region 648 of the second N-channel MOS transistor NMOS2 through the via 651. The first interconnection pattern 673 may be formed to be electrically connected to the N-type drain region 647 of the second N-channel MOS transistor NMOS2 and the P-type drain region 645 of the second P-channel MOS transistor PMOS2 through the vias 653 and 654.

The first interconnection pattern 675 may be formed to be electrically connected to the P-type source region 646 of the second P-channel MOS transistor PMOS2 and the N-type source region 644 of the first N-channel MOS transistor NMOS1 through the vias 656 and 657. The first interconnection pattern 677 may be formed to be electrically connected to the N-type drain region 643 of the first N-channel MOS transistor NMOS1 and the P-type drain region 641 of the first P-channel MOS transistor PMOS1 through the vias 659 and 660. The first interconnection pattern 679 may be formed to be electrically connected to the P-type source region 642 of the first P-channel MOS transistor PMOS1 through the via 662. The first interconnection patterns 672, 674, 676 and 678 may be formed to be electrically connected to the fourth, third, second and first gate conductive layer patterns 634, 633, 632 and 631 through the vias 652, 655, 658 and 661, respectively.

A second insulation layer 650$q$ may be formed on the first insulation layer 650$p$ and the first interconnection patterns 671~679. A plurality of vias 681 and 682 penetrating the second insulation layer 650$q$ may be formed.

Second interconnection patterns 691 and 692 may be formed on the second insulation layer 650$q$. The second interconnection pattern 691 may be formed to be electrically connected to the first interconnection pattern 673 through the via 681. The second interconnection pattern 692 may be formed to be electrically connected to the first interconnection pattern 677 through the via 682.

A third insulation layer 650$r$ may be formed on the second insulation layer 650$q$ and the second interconnection patterns 691 and 692. In some embodiments, the first, second and third insulation layers 650$p$, 650$q$ and 650$r$ may be formed of the same insulation layer, for example, an oxide layer. The first, second and third insulation layers 650*p*, 650*q* and 650*r* may constitute the first interlayer insulation layer 650 of the logic cell 600.

Figure 26:
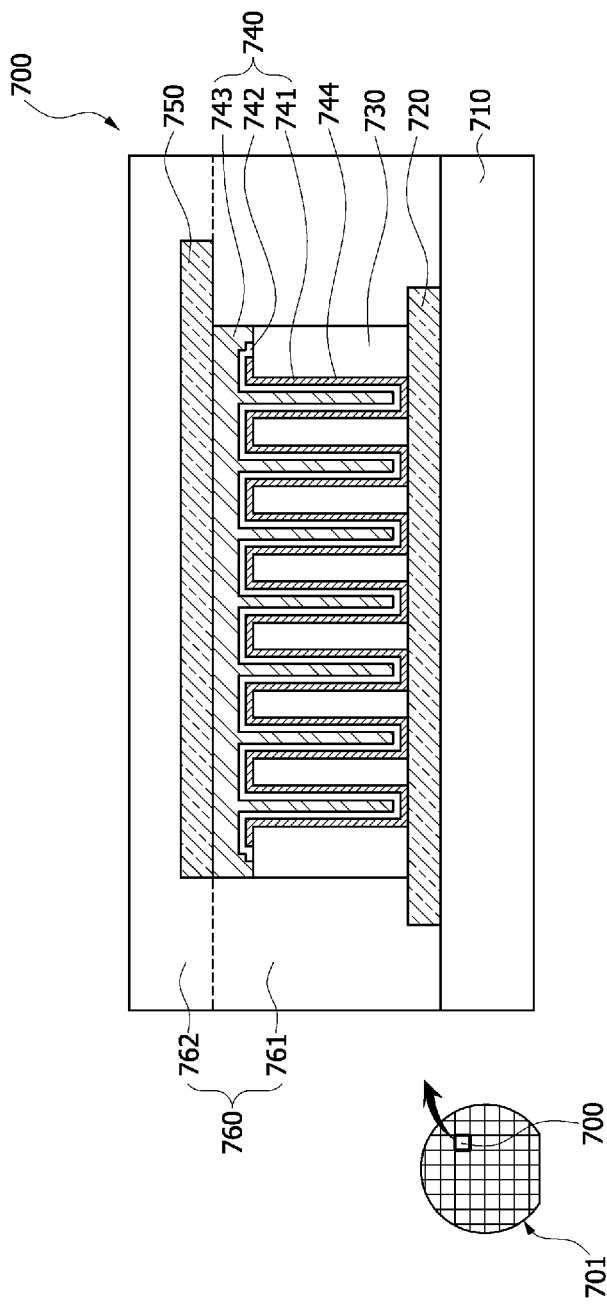

Referring to FIG. 26, a second structure 701 for fabricating the switched-capacitor DC-to-DC converter 130 may be provided. The second structure 701 may be provided to include a plurality of capacitors. In some embodiments, the second structure 701 may be a silicon wafer. The second structure 701 may be provided to include a plurality of capacitor cells 700.

Each of the capacitor cells 700 may be provided to include a capacitor 740 formed on a second substrate 710, a second interlayer insulation layer 760 formed on the second substrate 710 to cover the capacitor 740, and a lower interconnection pattern 720 and an upper interconnection pattern 750 formed in the second interlayer insulation layer 760. In order to form the capacitor 740, the lower interconnection pattern 720 may be formed on the second substrate 710.

A dummy insulation pattern 730 may be formed on the lower interconnection pattern 720. In some embodiments, the dummy insulation pattern 730 may be formed of a single oxide layer or a plurality of insulation layers. The dummy insulation pattern 730 may be formed to have a plurality of contact holes 744 therein. The dummy insulation pattern 730 having the contact holes 744 may have the same planar structure as described with reference to FIG. 16.

A lower electrode pattern 741 may be formed on portions of the lower interconnection pattern 720 exposed by the contact holes 744, sidewalls of the dummy insulation pattern 730 exposed by the contact holes 744, and a top surface of the dummy insulation pattern 730. The lower electrode pattern 741 may be formed to expose edges of the top surface of the dummy insulation pattern 730.

A dielectric pattern 742 may be formed on the lower electrode pattern 741. An upper electrode pattern 743 may be formed on the dielectric pattern 742. The upper electrode pattern 743 may be formed to fill the contact holes 744. The lower electrode pattern 741, the dielectric pattern 742 and the upper electrode pattern 743 may constitute the capacitor 740.

A first insulation layer 761 may be formed on the second substrate 710 and the lower interconnection pattern 720. The upper interconnection pattern 750 may be formed on the first insulation layer 761 and the upper electrode pattern 743. A bottom surface of the upper interconnection pattern 750 may be in direct contact with a top surface of the upper electrode pattern 743.

A second insulation layer 762 may be formed on the first insulation layer 761 and the upper interconnection pattern 750. The first and second insulation layers 761 and 762 may constitute a second interlayer insulation layer 760 of the capacitor cell 700.

Figure 27:
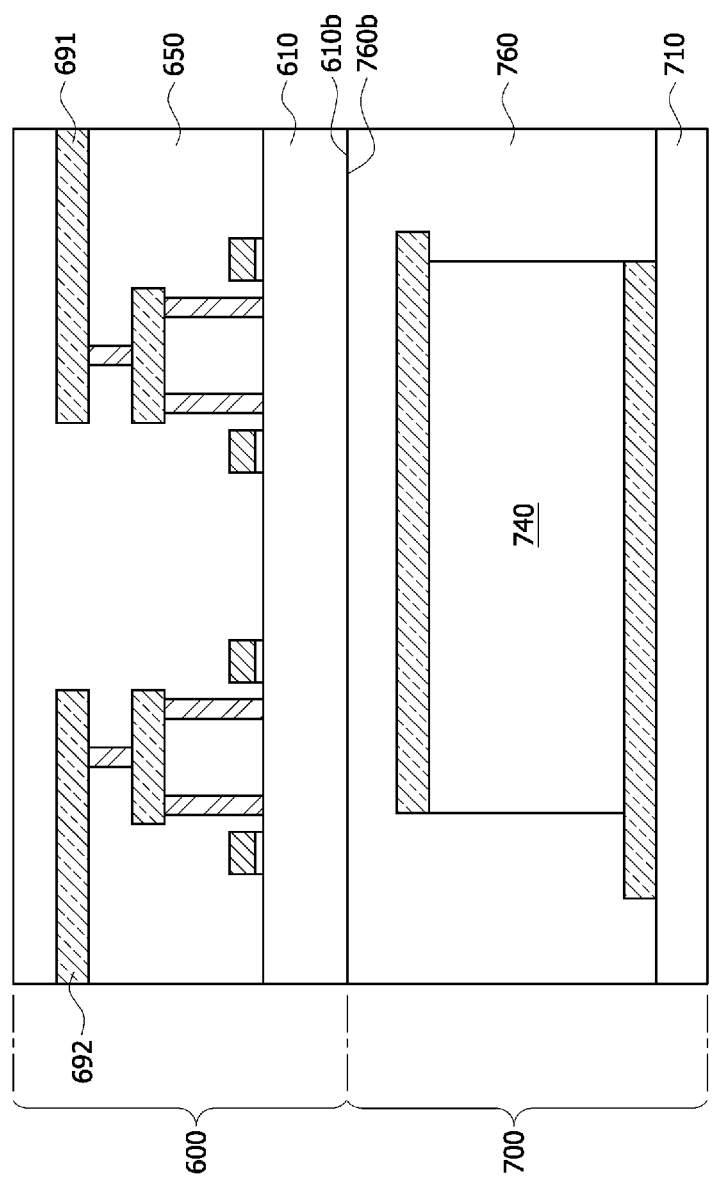

Referring to FIG. 27, the first structure (601 of FIG. 25) and the second structure (701 of FIG. 26) may be bonded to each other so that the logic cells 600 of the first structure 601 are bonded to the capacitor cells 700 of the second structure 701, respectively. The first and second structures 601 and 701 may be bonded to each other in units of wafers. The first and second structures 601 and 701 may be bonded to each other so that a bottom surface 610*b* of the first substrate 610 opposite to the first interlayer insulation layer 650 is attached to a top surface 760*b* of the second interlayer insulation layer 760 opposite to the second substrate 710.

In order to bond the logic cells 600 to the capacitor cells 700, the first structure 601 including the logic cells 600 may be located over the second structure 701 including the capacitor cells 700 so that the bottom surfaces 610*b* of the first substrates 610 face the top surfaces 760*b* of the second interlayer insulation layers 760. That is, the first and second structures 601 and 701 may be disposed so that the first substrates 610 of the logic cells 600 and the second substrates 710 of the capacitor cells 700 face downwardly.

Before the logic cells 600 are bonded to the capacitor cells 700, a cleaning process and a surface activation process using plasma may be applied to the bottom surfaces 610*b* of the first substrates 610 and the top surfaces 760*b* of the second interlayer insulation layers 760. After the cleaning process and the surface activation process are performed, the first structure 601 may be pressed down toward the second structure 701 at a certain temperature to bond the logic cells 600 to the capacitor cells 700 respectively.

Before the logic cells 600 are bonded to the capacitor cells 700, the second substrates 710 of the capacitor cells 700 may be grinded to reduce a thickness of the second substrates 710. The second substrates 710 of the capacitor cells 700 may be grinded using a general wafer grinding process.

Figure 28:
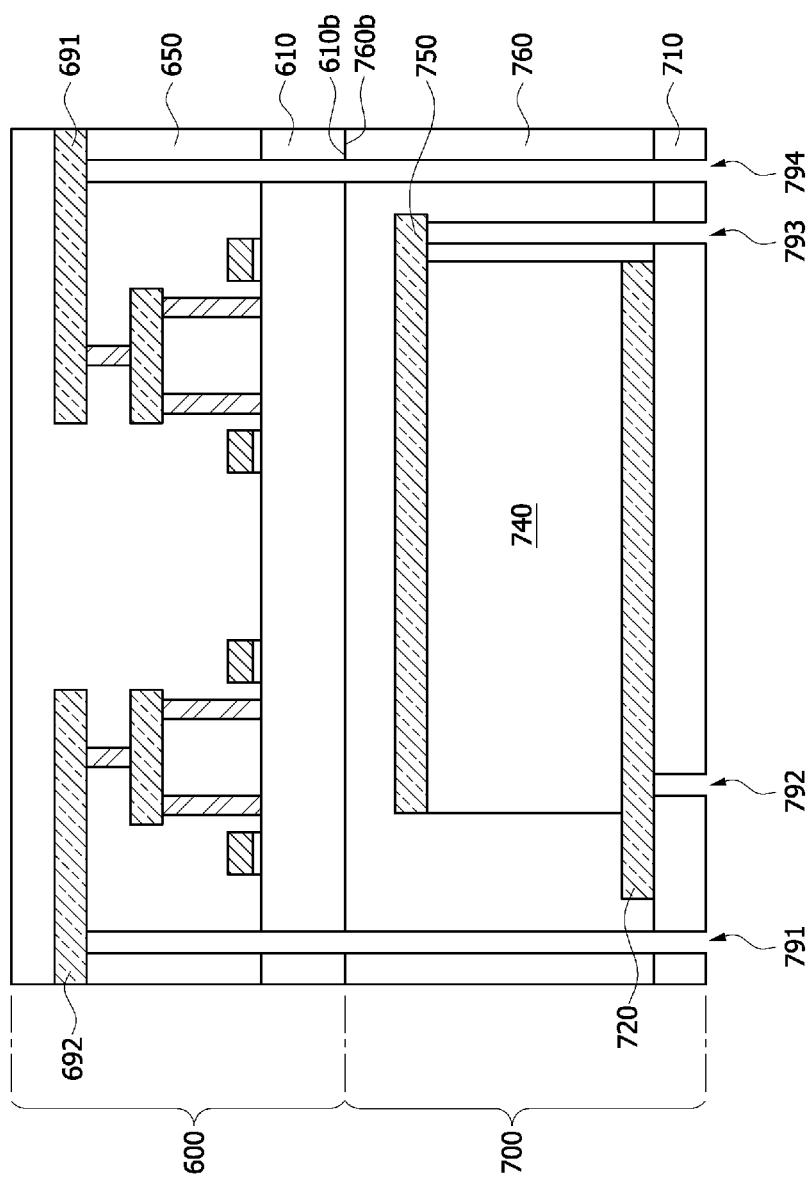

Referring to FIG. 28, first to fourth through via holes 791, 792, 793 and 794 may be formed in each cell which is comprised of a single logic cell 600 and a single capacitor cell 700 bonded to the single logic cell 600. The first through via hole 791 may penetrate the second substrate 710, the second interlayer insulation layer 760 and the first substrate 610 and may extend into the first interlayer insulation layer 650 to expose a portion of the second interconnection pattern 692 of the logic cell 600. The second through via hole 792 may penetrate the second substrate 710 to expose a portion of the lower interconnection pattern 720 of the capacitor cell 700.

The third through via hole 793 may penetrate the second substrate 710 and may extend into the second interlayer insulation layer 760 to expose a portion of the upper interconnection pattern 750 of the capacitor cell 700. The fourth through via hole 794 may penetrate the second substrate 710, the second interlayer insulation layer 760 and the first substrate 610 and may extend into the first interlayer insulation layer 650 to expose a portion of the second interconnection pattern 691 of the logic cell 600. In some embodiments, the first to fourth through via holes 791, 792, 793 and 794 may be formed using a laser beam. Although not shown in the drawings, an insulation layer and a metal seed layer may be sequentially formed on sidewalls of the first to fourth through via holes 791, 792, 793 and 794.

Figure 29:
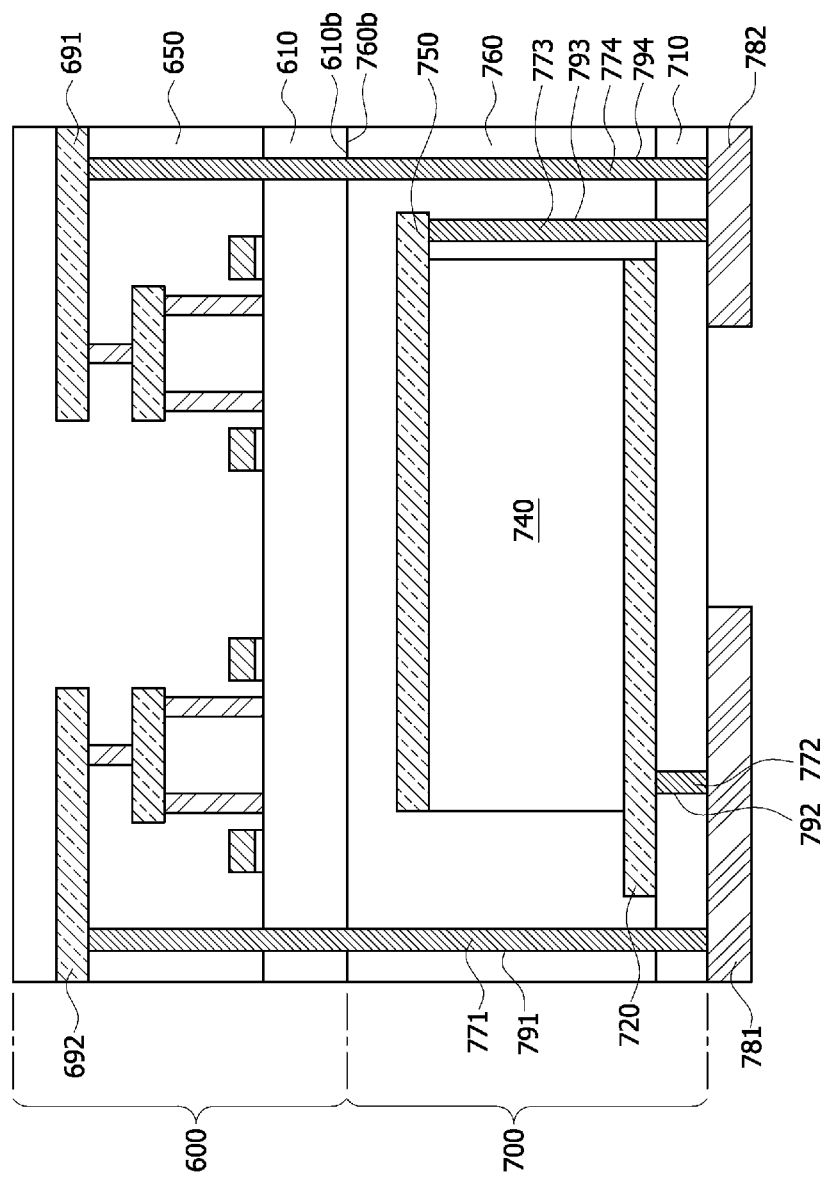

Referring to FIG. 29, the first to fourth through via holes 791, 792, 793 and 794 may be filled with a conductive layer such as a metal layer to respectively form first to fourth through vias 771, 772, 773 and 774 in the first to fourth through via holes 791, 792, 793 and 794. The first to fourth through vias 771, 772, 773 and 774 may be formed using an electroplating process that employs the metal seed layer as a seed layer.

One end of the first through via 771 may be coupled to the second interconnection pattern 692 of the logic cell 600, and one end of the second through via 772 may be coupled to the lower interconnection pattern 720 of the capacitor cell 700. In addition, the third through via 773 may be coupled to the upper interconnection pattern 750 of the capacitor cell 700, and the fourth through via 774 may be coupled to the second interconnection pattern 691 of the logic cell 600.

A first external circuit pattern 781 and a second external circuit pattern 782 may be formed on a surface of the second substrate 710 opposite to the second interlayer insulation layer 760. The first external circuit pattern 781 may be formed to be electrically connected to the first and second through vias 771 and 772. The second external circuit pattern 782 may be formed to be electrically connected to the third and fourth through vias 773 and 774.

Figure 30:
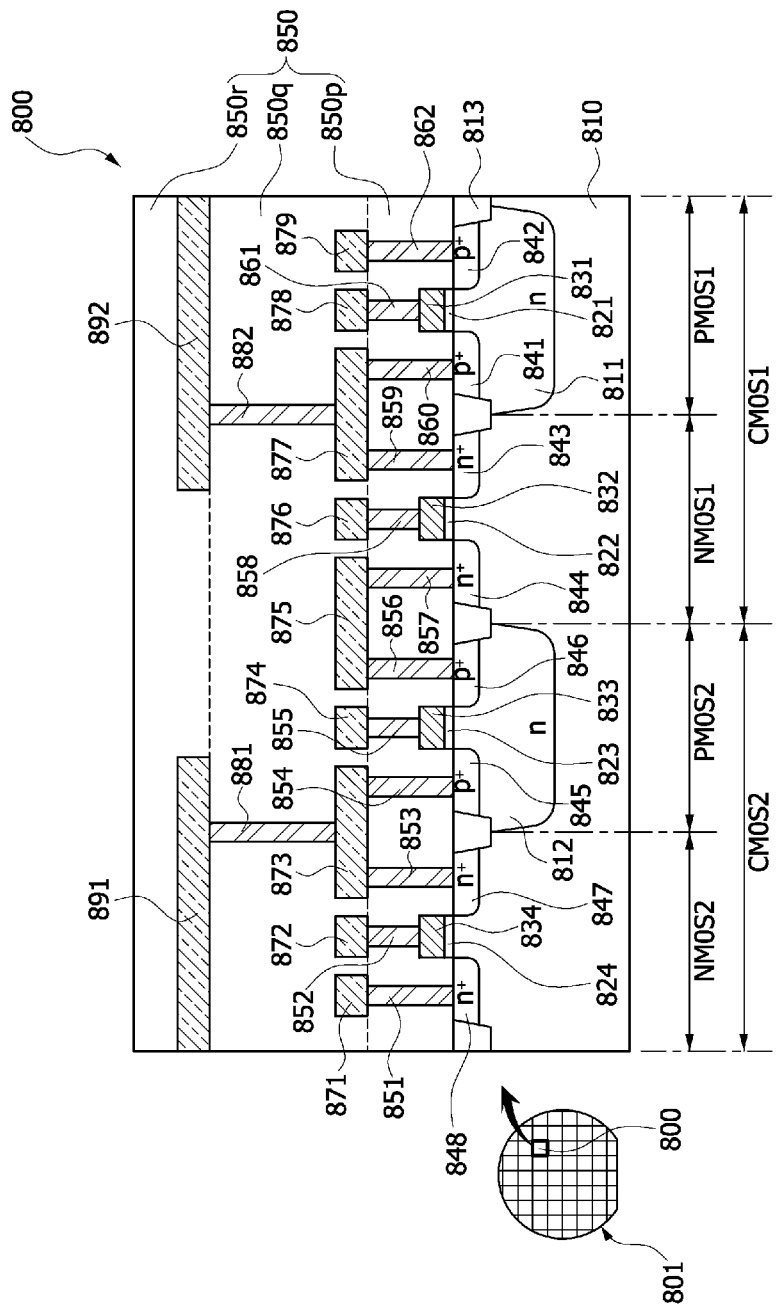
FIGS. 30 to 34 are cross-sectional views illustrating a method of fabricating the switched-capacitor DC-to-DC converter shown in FIG. 11.

FIGS. 30 to 34 are cross-sectional views illustrating a method of fabricating the switched-capacitor DC-to-DC converter 140 shown in FIG. 11. In FIGS. 30 to 34, the same reference numerals or the same reference designators denote the same elements. Referring to FIG. 30, a first structure 801 for fabricating the switched-capacitor DC-to-DC converter 140 may be provided. Specifically, the first structure 801 may be provided to include a plurality of logic cells 800, each of which is formed to include a plurality of switching elements such as MOS transistors. In some embodiments, the first structure 801 may be a silicon wafer.

The first structure 801 may be formed by integrating the plurality of logic cells 800 in a single wafer. Each of the logic cells 800 may be provided to include a first CMOS device CMOS1 and a second CMOS device CMOS2 which are formed in and on a first substrate 810, a first interlayer insulation layer 850 formed on the first substrate 810 to cover the first and second CMOS devices CMOS1 and CMOS2, and interconnection patterns 871~879, 891 and 892 formed in the first interlayer insulation layer 850.

Each of the logic cells 800 may be formed using a CMOS process technology. Specifically, a first N-type well region 811 and a second N-type well region 812 may be formed in an upper region of the first substrate 810 having a P-type conductivity. A trench isolation layer 813 may be formed in an upper region of the first substrate 810 to define active regions.

First to fourth gate stacks may be formed on the first substrate 810. The first gate stack may be formed to include a first gate insulation layer pattern 821 and a first gate conductive layer pattern 831 which are sequentially stacked. The second gate stack may be formed to include a second gate insulation layer pattern 822 and a second gate conductive layer pattern 832 which are sequentially stacked. The third gate stack may be formed to include a third gate insulation layer pattern 823 and a third gate conductive layer pattern 833 which are sequentially stacked. The fourth gate stack may be formed to include a fourth gate insulation layer pattern 824 and a fourth gate conductive layer pattern 834 which are sequentially stacked.

P-type impurity ions may be implanted into upper regions of the first and second N-type well regions 811 and 812 using the first and third gate stacks and the trench isolation layer 813 as implantation masks, thereby forming P-type drain regions 841 and 845 and P-type source regions 842 and 846. N-type impurity ions may be implanted into an upper region of the first substrate 810 using the second and fourth gate stacks and the trench isolation layer 813 as implantation masks, thereby forming N-type drain regions 843 and 847 and N-type source regions 844 and 848.

A first insulation layer 850$p$ may be formed on the first substrate 810 including the P-type drain regions 841 and 845 and the P-type source regions 842 and 846 as well as the N-type drain regions 843 and 847 and the N-type source regions 844 and 848. A plurality of vias 851~862 penetrating the first insulation layer 850$p$ may be formed.

First interconnection patterns 871~879 may be formed on the first insulation layer 850$p$. The first interconnection pattern 871 may be formed to be electrically connected to the N-type source region 848 of the second N-channel MOS transistor NMOS2 through the via 851. The first interconnection pattern 873 may be formed to be electrically connected to the N-type drain region 847 of the second N-channel MOS transistor NMOS2 and the P-type drain region 845 of the second P-channel MOS transistor PMOS2 through the vias 853 and 854.

The first interconnection pattern 875 may be formed to be electrically connected to the P-type source region 846 of the second P-channel MOS transistor PMOS2 and the N-type source region 844 of the first N-channel MOS transistor NMOS1 through the vias 856 and 857. The first interconnection pattern 877 may be formed to be electrically connected to the N-type drain region 843 of the first N-channel MOS transistor NMOS1 and the P-type drain region 841 of the first P-channel MOS transistor PMOS1 through the vias 859 and 860. The first interconnection pattern 879 may be formed to be electrically connected to the P-type source region 842 of the first P-channel MOS transistor PMOS1 through the via 862. The first interconnection patterns 872, 874, 876 and 878 may be formed to be electrically connected to the fourth, third, second and first gate conductive layer patterns 834, 833, 832 and 831 through the vias 852, 855, 858 and 861, respectively.

A second insulation layer 850$q$ may be formed on the first insulation layer 850$p$ and the first interconnection patterns 871~879. A plurality of vias 881 and 882 penetrating the second insulation layer 850$q$ may be formed. Second interconnection patterns 891 and 892 may be formed on the second insulation layer 850$q$.

The second interconnection pattern 891 may be formed to be electrically connected to the first interconnection pattern 873 through the via 881. The second interconnection pattern 892 may be formed to be electrically connected to the first interconnection pattern 877 through the via 882. A third insulation layer 850$r$ may be formed on the second insulation layer 850$q$ and the second interconnection patterns 891 and 892. In some embodiments, the first, second and third insulation layers 850$p$, 850$q$ and 850$r$ may be formed of the same insulation layer, for example, an oxide layer. The first, second and third insulation layers 850$p$, 850$q$ and 850$r$ may constitute the first interlayer insulation layer 850 of the logic cell 800.

Figure 31:
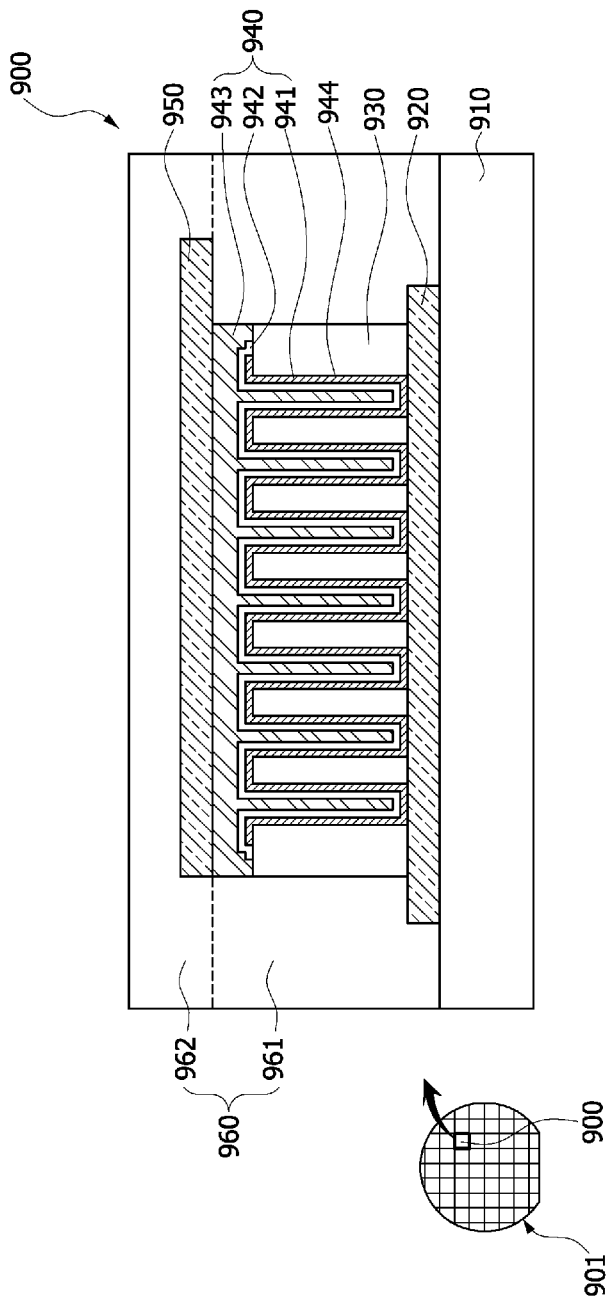

Referring to FIG. 31, a second structure 901 for fabricating the switched-capacitor DC-to-DC converter 140 may be provided. The second structure 901 may be provided to include a plurality of capacitors. In some embodiments, the second structure 901 may be a silicon wafer. The second structure 901 may be provided to include a plurality of capacitor cells 900.

Each of the capacitor cells 900 may be provided to include a capacitor 940 formed on a second substrate 910, a second interlayer insulation layer 960 formed on the second substrate 910 to cover the capacitor 940, and a lower interconnection pattern 920 and an upper interconnection pattern 950 formed in the second interlayer insulation layer 960. In order to form the capacitor 940, the lower interconnection pattern 920 may be formed on the second substrate 910.

A dummy insulation pattern 930 may be formed on the lower interconnection pattern 920. In some embodiments, the dummy insulation pattern 930 may be formed of a single oxide layer or a plurality of insulation layers. The dummy insulation pattern 930 may be formed to have a plurality of contact holes 944 therein. The dummy insulation pattern 930 having the contact holes 944 may have the same planar structure as described with reference to FIG. 16.

A lower electrode pattern 941 may be formed on portions of the lower interconnection pattern 920 exposed by the contact holes 944, sidewalls of the dummy insulation pattern 930 exposed by the contact holes 944, and a top surface of the dummy insulation pattern 930. The lower electrode pattern 941 may be formed to expose edges of the top surface of the dummy insulation pattern 930.

A dielectric pattern 942 may be formed on the lower electrode pattern 941. An upper electrode pattern 943 may be formed on the dielectric pattern 942. The upper electrode pattern 943 may be formed to fill the contact holes 944. The lower electrode pattern 941, the dielectric pattern 942 and the upper electrode pattern 943 may constitute the capacitor 940.

A first insulation layer 961 may be formed on the second substrate 910 and the lower interconnection pattern 920. The upper interconnection pattern 950 may be formed on the first insulation layer 961 and the upper electrode pattern 943. A bottom surface of the upper interconnection pattern 950 may be in direct contact with a top surface of the upper electrode pattern 943. A second insulation layer 962 may be formed on the first insulation layer 961 and the upper interconnection pattern 950. The first and second insulation layers 961 and 962 may constitute a second interlayer insulation layer 960 of the capacitor cell 900.

Figure 32:
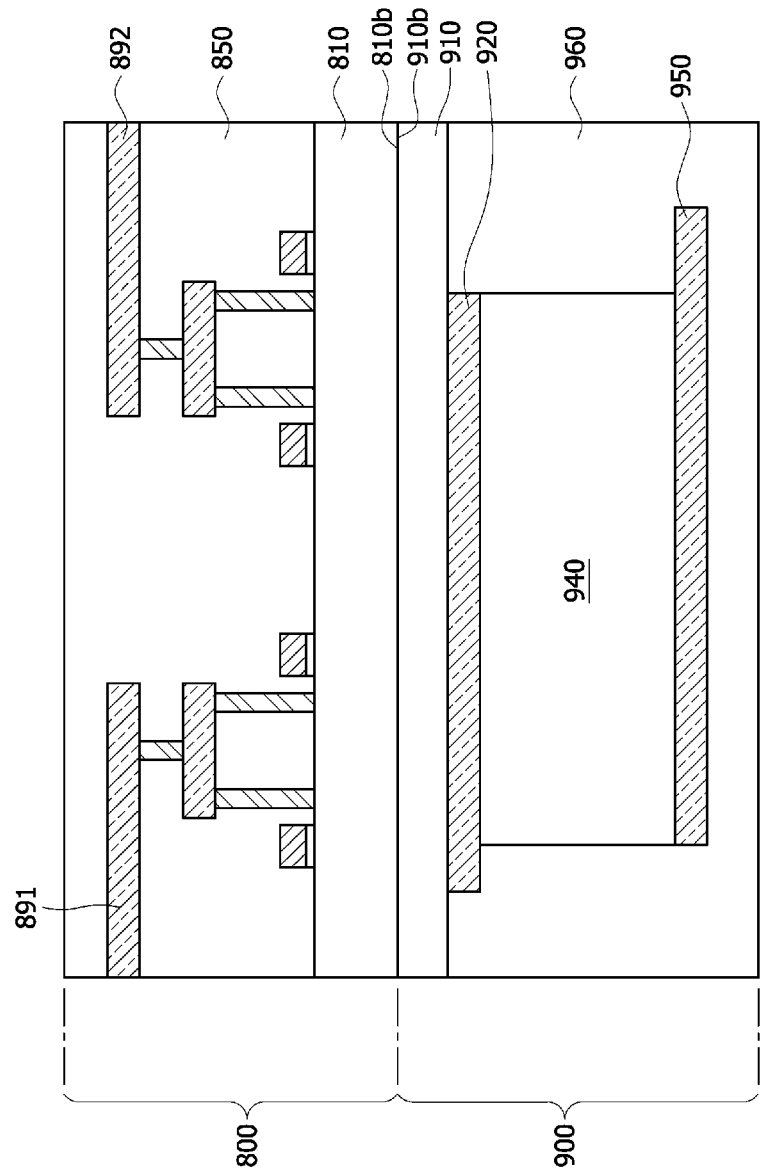

Referring to FIG. 32, the first structure (801 of FIG. 31) and the second structure (901 of FIG. 32) may be bonded to each other so that the logic cells 800 of the first structure 801 are bonded to the capacitor cells 900 of the second structure 901 respectively. The first and second structures 801 and 901 may be bonded to each other in units of wafers. The first and second structures 801 and 901 may be bonded to each other so that a bottom surface 810b of the first substrate 810 opposite to the first interlayer insulation layer 850 is attached to a bottom surface 910b of the second substrate 910 opposite to the second interlayer insulation layer 960.

In order to bond the logic cells 800 to the capacitor cells 900, the first structure 801 including the logic cells 800 may be located over the second structure 901 including the capacitor cells 900 so that the bottom surfaces 810b of the first substrates 810 face the bottom surfaces 910b of the second substrates 910. That is, the first structure 801 may be disposed so that the first substrates 810 of the logic cells 800 face downwardly, and the second structure 901 may be disposed so that the second substrates 910 of the capacitor cells 900 face upwardly.

Before the logic cells 800 are bonded to the capacitor cells 900, a cleaning process and a surface activation process using plasma may be applied to the bottom surfaces 810b of the first substrates 810 and the bottom surfaces 910b of the second substrates 910. After the cleaning process and the surface activation process are performed, the first structure 801 may be pressed down toward the second structure 901 at a certain temperature to bond the logic cells 800 to the capacitor cells 900 respectively.

Before the logic cells 800 are bonded to the capacitor cells 900, the second substrates 910 of the capacitor cells 900 may be grinded to reduce a thickness of the second substrates 910. The second substrates 910 of the capacitor cells 900 may be grinded using a general wafer grinding process.

Figure 33:
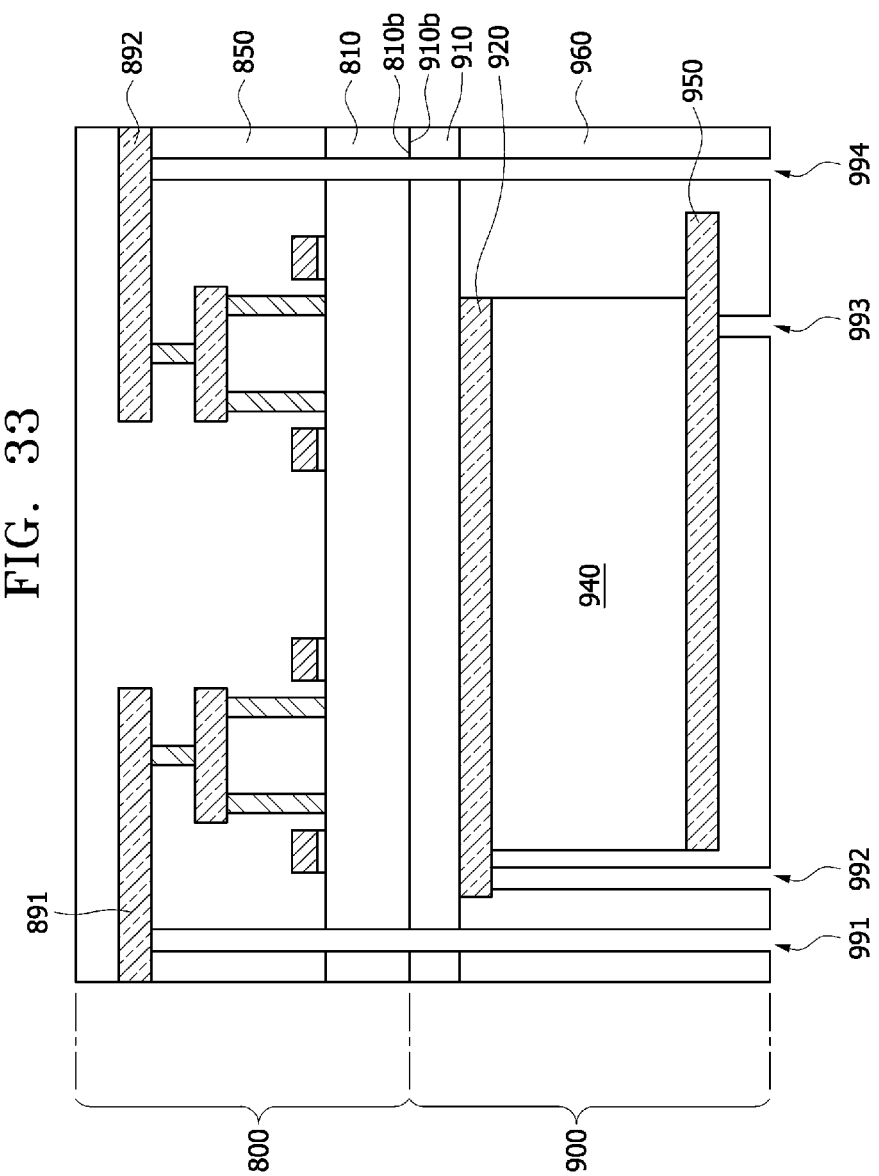

Referring to FIG. 33, first to fourth through via holes 991, 992, 993 and 994 may be formed in each cell which is comprised of a single logic cell 800 and a single capacitor cell 900 bonded to the single logic cell 800. The first through via hole 991 may penetrate the second interlayer insulation layer 960, the second substrate 910 and the first substrate 810 and may extend into the first interlayer insulation layer 850 to expose a portion of the second interconnection pattern 892 of the logic cell 800.

The second through via hole 992 may be formed in the second interlayer insulation layer 960 to expose a portion of the lower interconnection pattern 920 of the capacitor cell 900. The third through via hole 993 may be formed in the second interlayer insulation layer 960 to expose a portion of the upper interconnection pattern 950 of the capacitor cell 900. The fourth through via hole 994 may penetrate the second interlayer insulation layer 960, the second substrate 910 and the first substrate 810 and may extend into the first interlayer insulation layer 850 to expose a portion of the second interconnection pattern 891 of the logic cell 800.

In some embodiments, the first to fourth through via holes 991, 992, 993 and 994 may be formed using a laser beam. Although not shown in the drawings, an insulation layer and a metal seed layer may be sequentially formed on sidewalls of the first to fourth through via holes 991, 992, 993 and 994.

Figure 34:
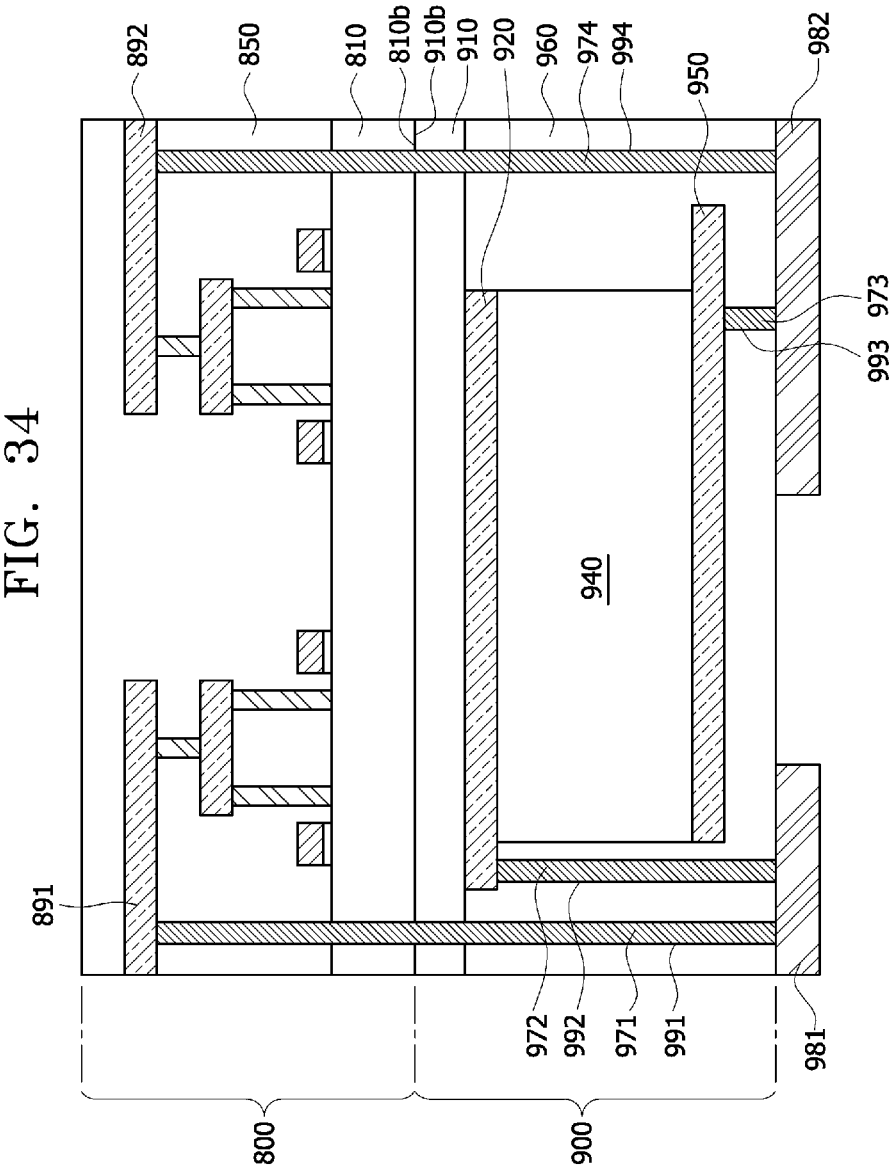

Referring to FIG. 34, the first to fourth through via holes 991, 992, 993 and 994 may be filled with a conductive layer such as a metal layer to respectively form first to fourth through vias 971, 972, 973 and 974 in the first to fourth through via holes 991, 992, 993 and 994. The first to fourth through vias 971, 972, 973 and 974 may be formed using an electroplating process that employs the metal seed layer as a seed layer.

One end of the first through via 971 may be coupled to the second interconnection pattern 892 of the logic cell 800, and one end of the second through via 972 may be coupled to the lower interconnection pattern 920 of the capacitor cell 900. In addition, the third through via 973 may be coupled to the upper interconnection pattern 950 of the capacitor cell 900, and the fourth through via 974 may be coupled to the second interconnection pattern 891 of the logic cell 800.

A first external circuit pattern 981 and a second external circuit pattern 982 may be formed on a surface of the second interlayer insulation layer 960 opposite to the second substrate 910. The first external circuit pattern 981 may be formed to be electrically connected to the first and second through vias 971 and 972. The second external circuit pattern 982 may be formed to be electrically connected to the third and fourth through vias 973 and 974.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A switched-capacitor DC-to-DC converter comprising:
a logic cell having (i) a first substrate, (ii) a plurality of active elements disposed over the first substrate, (iii) a first interlayer insulation layer disposed over a top surface of the first substrate to cover the active elements, and (iv) a plurality of interconnection patterns disposed in the first interlayer insulation layer and electrically connected to the active elements, wherein the plurality of interconnection patterns include first and second interconnection patterns;
a capacitor cell having (i) a second substrate, (ii) a capacitor disposed over a top surface of the second substrate, (iii) a second interlayer insulation layer disposed over the second substrate to cover the capacitor, (iv) a lower interconnection pattern disposed in the second interlayer insulation layer and electrically connected to a lower electrode pattern of the capacitor, and (v) an upper interconnection pattern disposed in the second interlayer insulation layer and electrically connected to an upper electrode pattern of the capacitor, wherein the second substrate is bonded to the first interlayer insulation layer so that the logic cell vertically overlaps with the capacitor cell;

a first through via penetrating the second interlayer insulation layer and the second substrate and extending into the first interlayer insulation layer to contact the first interconnection pattern;

a second through via disposed in the second interlayer insulation layer to contact the lower interconnection pattern;

a third through via disposed in the second interlayer insulation layer to contact the upper interconnection pattern;

a fourth through via penetrating the second interlayer insulation layer and the second substrate and extending into the first interlayer insulation layer to contact the second interconnection pattern;

a first external circuit pattern disposed over a top surface of the second interlayer insulation layer opposite to the second substrate and electrically connected to the first and second through vias; and a second external circuit pattern disposed over the top surface of the second interlayer insulation layer and electrically connected to the third and fourth through vias wherein the first substrate and the first interlayer insulation layer are in direct contact with each other.

2. The switched-capacitor DC-to-DC converter of claim 1, wherein the plurality of active elements includes first and second CMOS devices, wherein the first CMOS device includes a first P-channel MOS transistor and a first N-channel MOS transistor, and wherein the second CMOS device includes a second P-channel MOS transistor and a second N-channel MOS transistor.

3. The switched-capacitor DC-to-DC converter of claim 2, wherein the first interconnection pattern is electrically connected to a drain region of the first P-channel MOS transistor and a drain region of the first N-channel MOS transistor, and wherein the second interconnection pattern is electrically connected to a drain region of the second P-channel MOS transistor and a drain region of the second N-channel MOS transistor.

4. The switched-capacitor DC-to-DC converter of claim 3, wherein the first interconnection pattern is electrically connected to the first through via, and wherein the second interconnection pattern is electrically connected to the fourth through via.

5. The switched-capacitor DC-to-DC converter of claim 1, wherein the lower interconnection pattern is disposed over the top surface of the second substrate opposite to the first interlayer insulation layer.

6. The switched-capacitor DC-to-DC converter of claim 5, further comprising:

a dummy insulation pattern disposed over the lower interconnection pattern, wherein a plurality of contact holes are formed in the dummy insulation pattern.

7. The switched-capacitor DC-to-DC converter of claim 6, wherein the lower interconnection pattern is exposed by the contact holes, wherein tire capacitor includes: the lower electrode pattern disposed over the dummy insulation pattern; a dielectric pattern disposed over the lower electrode pattern; and the upper electrode pattern disposed over the dielectric pattern, and wherein the capacitor the contact holes.

8. The switched-capacitor DC-to-DC converter of claim 7, wherein a top surface of the upper electrode pattern opposite to the dummy insulation pattern and is in direct contact with a bottom surface of the upper interconnection pattern.

9. The switched-capacitor DC-to-DC converter of claim 1, wherein each of the first and second substrates is a silicon layer.

* * * * *